(12) United States Patent
Yoda et al.

(10) Patent No.: US 12,710,922 B2
(45) Date of Patent: Aug. 18, 2026

(54) ARITHMETIC DEVICE

(71) Applicant: YODA-S, Inc., Tsukuba (JP)

(72) Inventors: Hiroaki Yoda, Tsukuba (JP); Yuichi Ohsawa, Tsukuba (JP); Yushi Kato, Tsukuba (JP); Tomomi Yoda, Tsukuba (JP)

(73) Assignee: YODA-S, Inc., Tsukuba (JP)

(*) Notice: Subject to any disclaimer, the term of this patent is extended or adjusted under 35 U.S.C. 154(b) by 1114 days.

(21) Appl. No.: 17/830,302

(22) Filed: Jun. 1, 2022

(65) Prior Publication Data

US 2022/0291898 A1 Sep. 15, 2022

Related U.S. Application Data

(63) Continuation of application No. PCT/JP2020/047144, filed on Dec. 17, 2020.

(30) Foreign Application Priority Data

Jan. 14, 2020 (JP) ................................ 2020-003872
Mar. 11, 2020 (JP) ................................ 2020-041779

(51) Int. Cl.
*G11C 11/00* (2006.01)
*G06F 7/48* (2006.01)
(Continued)

(52) U.S. Cl.
CPC ............. *G06F 7/48* (2013.01); *H01F 10/329* (2013.01); *H03K 19/21* (2013.01); *H10B 61/00* (2023.02); *H10N 52/00* (2023.02); *H10N 52/80* (2023.02)

(58) Field of Classification Search
CPC .......... G06F 7/48; H01B 61/00; H10N 52/00; H10N 52/80; H01F 10/329; H03K 19/21
(Continued)

(56) References Cited

U.S. PATENT DOCUMENTS 8,634,233 B2 * 1/2014 Lilja ..................... G11C 11/161 365/158
9,444,459 B2 * 9/2016 Sekine ............... H03K 19/0016
(Continued)

FOREIGN PATENT DOCUMENTS

JP 2006-18539 A 1/2006
JP 2009-206611 A 9/2009
(Continued)

*Primary Examiner* — Viet Q Nguyen
(74) *Attorney, Agent, or Firm* — Finnegan, Henderson, Farabow, Garrett & Dunner, LLP

(57) ABSTRACT

According to one embodiment, an arithmetic device includes an arithmetic element part, and a controller. The arithmetic element part includes first and second elements. The first element includes a first conductive member and a first stacked body. The first conductive member includes first to third portions. The first stacked body includes a first magnetic layer, and a first counter magnetic layer. The second element includes a second conductive member and a second stacked body. The second conductive member includes fourth and fifth portions, and a sixth portion between the fourth and fifth portions. The second stacked body includes a second magnetic layer, and a second counter magnetic layer. The controller is configured to perform an XNOR operation of first and second inputs. The first input corresponds to electrical resistances of the stacked bodies. The second input corresponds to potentials of the magnetic layers.

19 Claims, 42 Drawing Sheets

(51) Int. Cl.

| | |
|---|---|
| ***H01F 10/32*** | (2006.01) |
| ***H03K 19/21*** | (2006.01) |
| ***H10B 61/00*** | (2023.01) |
| ***H10N 52/00*** | (2023.01) |
| ***H10N 52/80*** | (2023.01) |

(58) Field of Classification Search

USPC .......................................................... 365/159

See application file for complete search history.

(56) References Cited

U.S. PATENT DOCUMENTS

| | | | | |
|---|---|---|---|---|
| 9,654,110 | B2 * | 5/2017 | Johnson | G11C 11/1673 |
| 11,176,979 | B2 * | 11/2021 | Wang | G11C 11/1675 |
| 11,411,172 | B2 * | 8/2022 | Liu | H10N 52/101 |
| 12,068,746 | B2 * | 8/2024 | Lim | G11C 11/18 |
| 12,182,690 | B2 * | 12/2024 | Greenberg | G06N 3/063 |
| 2006/0004992 | A1 | 1/2006 | Fujisawa et al. | |
| 2016/0284422 | A9 * | 9/2016 | Ong | G06F 21/00 |
| 2016/0372655 | A1 * | 12/2016 | Johnson | H03K 19/1776 |
| 2019/0295619 | A1 | 9/2019 | Inokuchi et al. | |
| 2020/0241840 | A1 * | 7/2020 | Ikegami | G11C 11/1659 |
| 2024/0005976 | A1 * | 1/2024 | Fan | G11C 7/1006 |

FOREIGN PATENT DOCUMENTS

| | | | |
|---|---|---|---|
| JP | 2016-9907 | A | 1/2016 |
| JP | 6545853 | B1 | 7/2019 |
| JP | 2019-216208 | A | 12/2019 |

* cited by examiner

| In1 | | In2 | Rs1 |
|---|---|---|---|
| 0 | (P,P) | 0 | (P,AP) |
| 0 | (P,P) | 1 | (P,P) |
| 1 | (AP,AP) | 0 | (AP,AP) |
| 1 | (AP,AP) | 1 | (P,AP) |

FIG. 11

| In1 | | In2 | Rs1 | Rs2 | |
|---|---|---|---|---|---|
| 0 | (P,P) | 0 | (P,AP) | (AP,AP) | 1 |
| 0 | (P,P) | 1 | (P,P) | (P,P) | 0 |
| 1 | (AP,AP) | 0 | (AP,AP) | (P,P) | 0 |
| 1 | (AP,AP) | 1 | (P,AP) | (AP,AP) | 1 |

FIG. 12

| In1 | | In2 | Rs1 |
|---|---|---|---|
| 0 | (P,AP) | 0 | (P,P) |
| 0 | (P,AP) | 1 | (P,AP) |
| 1 | (AP,P) | 0 | (AP,P) |
| 1 | (AP,P) | 1 | (P,P) |

FIG. 23

| In1 | | In2 | Rs1 | Rs2 | |
|---|---|---|---|---|---|
| 0 | (P,AP) | 0 | (P,P) | (AP,P) | 1 |
| 0 | (P,AP) | 1 | (P,AP) | (P,AP) | 0 |
| 1 | (AP,P) | 0 | (AP,P) | (P,AP) | 0 |
| 1 | (AP,P) | 1 | (P,P) | (AP,P) | 1 |

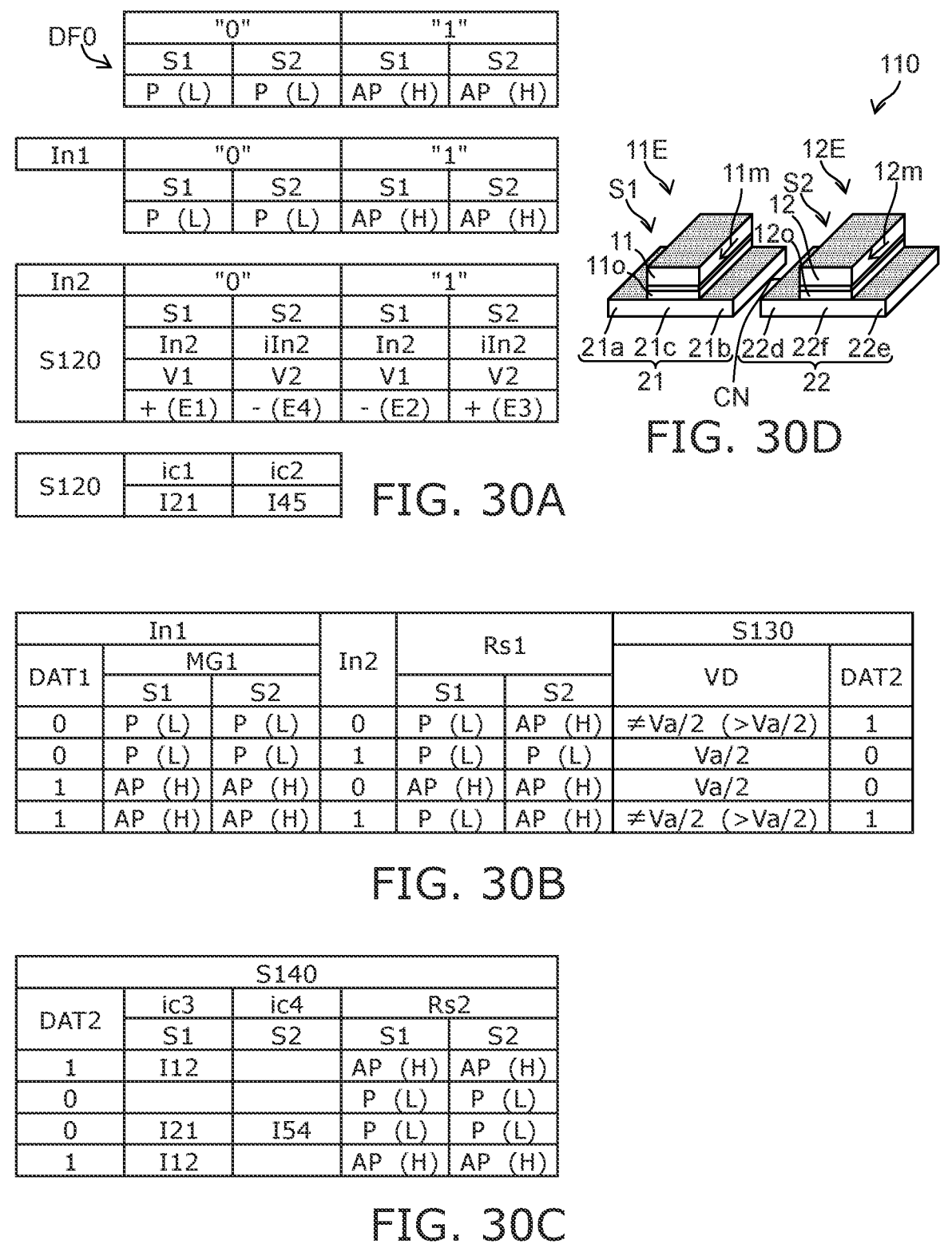

| "0" | | "1" | |
|---|---|---|---|
| S1 | S2 | S1 | S2 |
| P (L) | P (L) | AP (H) | AP (H) |

| In1 | "0" | | "1" | |
|---|---|---|---|---|
| | S1 | S2 | S1 | S2 |
| | P (L) | P (L) | AP (H) | AP (H) |

| In2 | "0" | | "1" | |
|---|---|---|---|---|
| S120 | S1 | S2 | S1 | S2 |
| | In2 | iIn2 | In2 | iIn2 |
| | V1 | V2 | V1 | V2 |
| | + (E1) | - (E4) | - (E2) | + (E3) |

| S120 | ic1 | ic2 |
|---|---|---|
| | I21 | I45 |

| In1 | | | In2 | Rs1 | | S130 | |
|---|---|---|---|---|---|---|---|
| DAT1 | MG1 | | | | | VD | DAT2 |
| | S1 | S2 | | S1 | S2 | | |
| 0 | P (L) | P (L) | 0 | P (L) | AP (H) | ≠Va/2 (>Va/2) | 1 |
| 0 | P (L) | P (L) | 1 | P (L) | P (L) | Va/2 | 0 |
| 1 | AP (H) | AP (H) | 0 | AP (H) | AP (H) | Va/2 | 0 |
| 1 | AP (H) | AP (H) | 1 | P (L) | AP (H) | ≠Va/2 (>Va/2) | 1 |

FIG. 30B

| S140 | | | | |
|---|---|---|---|---|
| DAT2 | ic3 | ic4 | Rs2 | |
| | S1 | S2 | S1 | S2 |
| 1 | I12 | | AP (H) | AP (H) |
| 0 | | | P (L) | P (L) |
| 0 | I21 | I54 | P (L) | P (L) |
| 1 | I12 | | AP (H) | AP (H) |

FIG. 30C

| DF0 | "0" | | "1" | |
|---|---|---|---|---|
| | S1 | S2 | S1 | S2 |
| | P (L) | P (L) | AP (H) | AP (H) |

| In1 | "0" | | "1" | |
|---|---|---|---|---|
| | S1 | S2 | S1 | S2 |
| | P (L) | P (L) | AP (H) | AP (H) |

| In2 | "0" | | "1" | |
|---|---|---|---|---|
| S120 | S1 | S2 | S1 | S2 |
| | iIn2 | In2 | iIn2 | In2 |
| | V1 | V2 | V1 | V2 |
| | - (E2) | + (E3) | + (E1) | - (E4) |

| S120 | ic1 | ic2 |
|---|---|---|
| | I12 | I54 |

| In1 | | | In2 | Rs1 | | S130 | |
|---|---|---|---|---|---|---|---|
| DAT1 | MG1 | | | | | VD | DAT2 |
| | S1 | S2 | | S1 | S2 | | |
| 0 | P (L) | P (L) | 0 | AP (H) | P (L) | ≠Va/2 (<Va/2) | 1 |
| 0 | P (L) | P (L) | 1 | P (L) | P (L) | Va/2 | 0 |
| 1 | AP (H) | AP (H) | 0 | AP (H) | AP (H) | Va/2 | 0 |
| 1 | AP (H) | AP (H) | 1 | AP (H) | P (L) | ≠Va/2 (<Va/2) | 1 |

| S140 | | | | |
|---|---|---|---|---|
| DAT2 | ic3 | ic4 | Rs2 | |
| | S1 | S2 | S1 | S2 |
| 1 | | I45 | AP (H) | AP (H) |
| 0 | | | P (L) | P (L) |
| 0 | I21 | I54 | P (L) | P (L) |
| 1 | | I45 | AP (H) | AP (H) |

DF0

| "0" | | "1" | |
|---|---|---|---|
| S1 | S2 | S1 | S2 |
| P (L) | P (L) | AP (H) | AP (H) |

| In1 | "0" | | "1" | |
|---|---|---|---|---|
| | S1 | S2 | S1 | S2 |
| | P (L) | P (L) | AP (H) | AP (H) |

| In2 | "0" | | "1" | |
|---|---|---|---|---|
| S120 | S1 | S2 | S1 | S2 |
| | In2 | iIn2 | In2 | iIn2 |
| | V1 | V2 | V1 | V2 |
| | + (E1) | - (E4) | - (E2) | + (E3) |

| S120 | ic1 | ic2 |
|---|---|---|
| | I12 | I54 |

| In1 | | | In2 | Rs1 | | S130 | |
|---|---|---|---|---|---|---|---|
| DAT1 | MG1 | | | | | VD | DAT2 |
| | S1 | S2 | | S1 | S2 | | |
| 0 | P (L) | P (L) | 0 | P (L) | P (L) | Va/2 | 1 |
| 0 | P (L) | P (L) | 1 | AP (H) | P (L) | ≠Va/2 (<Va/2) | 0 |
| 1 | AP (H) | AP (H) | 0 | AP (H) | P (L) | ≠Va/2 (<Va/2) | 0 |
| 1 | AP (H) | AP (H) | 1 | AP (H) | AP (H) | Va/2 | 1 |

| S140 | | | | |
|---|---|---|---|---|
| DAT2 | ic3 | ic4 | Rs2 | |
| | S1 | S2 | S1 | S2 |
| 1 | I12 | I45 | AP (H) | AP (H) |
| 0 | I21 | | P (L) | P (L) |
| 0 | I21 | | P (L) | P (L) |
| 1 | | | AP (H) | AP (H) |

DF0

| "0" | | "1" | |
|---|---|---|---|
| S1 | S2 | S1 | S2 |
| P (L) | P (L) | AP (H) | AP (H) |

| In1 | "0" | | "1" | |
|---|---|---|---|---|
| | S1 | S2 | S1 | S2 |
| | P (L) | P (L) | AP (H) | AP (H) |

| In2 | "0" | | "1" | |
|---|---|---|---|---|
| S120 | S1 | S2 | S1 | S2 |
| | iIn2 | In2 | iIn2 | In2 |
| | V1 | V2 | V1 | V2 |
| | - (E2) | + (E3) | + (E1) | - (E4) |

| S120 | ic1 | ic2 |
|---|---|---|
| | I21 | I45 |

| In1 | | | In2 | Rs1 | | S130 | |
|---|---|---|---|---|---|---|---|
| DAT1 | MG1 | | | | | VD | DAT2 |
| | S1 | S2 | | S1 | S2 | | |
| 0 | P (L) | P (L) | 0 | P (L) | P (L) | Va/2 | 1 |
| 0 | P (L) | P (L) | 1 | P (L) | AP (H) | ≠Va/2 (>Va/2) | 0 |
| 1 | AP (H) | AP (H) | 0 | P (L) | AP (H) | ≠Va/2 (>Va/2) | 0 |
| 1 | AP (H) | AP (H) | 1 | AP (H) | AP (H) | Va/2 | 1 |

| S140 | | | | |
|---|---|---|---|---|
| DAT2 | ic3 | ic4 | Rs2 | |
| | S1 | S2 | S1 | S2 |
| 1 | I12 | I45 | AP (H) | AP (H) |
| 0 | | I54 | P (L) | P (L) |
| 0 | | I54 | P (L) | P (L) |
| 1 | | | AP (H) | AP (H) |

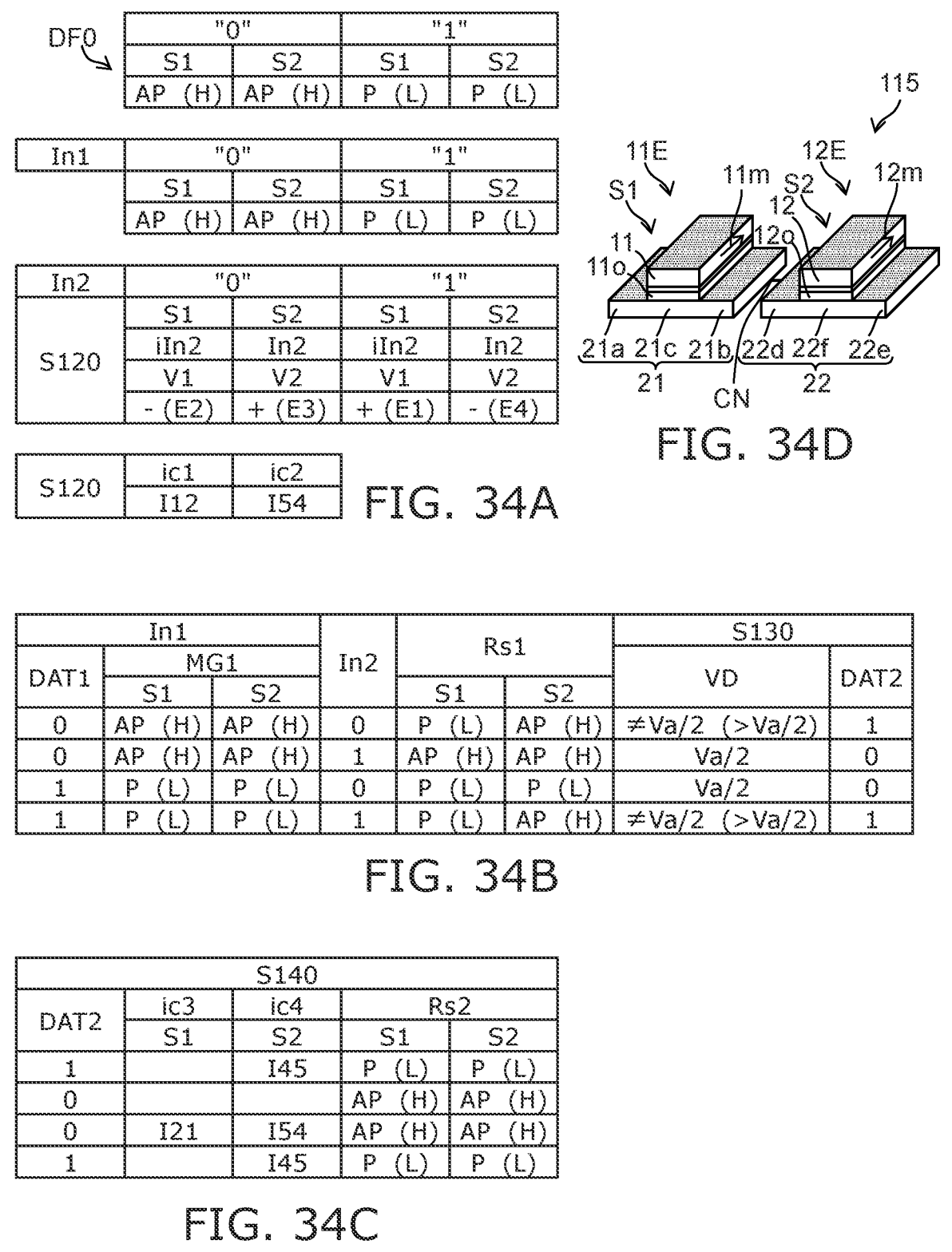

DF0

| "0" | | "1" | |
|---|---|---|---|
| S1 | S2 | S1 | S2 |
| AP (H) | AP (H) | P (L) | P (L) |

| In1 | "0" | | "1" | |
|---|---|---|---|---|
| | S1 | S2 | S1 | S2 |
| | AP (H) | AP (H) | P (L) | P (L) |

| In2 | "0" | | "1" | |
|---|---|---|---|---|
| S120 | S1 | S2 | S1 | S2 |
| | iIn2 | In2 | iIn2 | In2 |
| | V1 | V2 | V1 | V2 |
| | - (E2) | + (E3) | + (E1) | - (E4) |

| S120 | ic1 | ic2 |
|---|---|---|
| | I12 | I54 |

FIG. 34A

| In1 | | | In2 | Rs1 | | S130 | |
|---|---|---|---|---|---|---|---|
| DAT1 | MG1 | | | | | VD | DAT2 |
| | S1 | S2 | | S1 | S2 | | |
| 0 | AP (H) | AP (H) | 0 | P (L) | AP (H) | ≠Va/2 (>Va/2) | 1 |
| 0 | AP (H) | AP (H) | 1 | AP (H) | AP (H) | Va/2 | 0 |
| 1 | P (L) | P (L) | 0 | P (L) | P (L) | Va/2 | 0 |
| 1 | P (L) | P (L) | 1 | P (L) | AP (H) | ≠Va/2 (>Va/2) | 1 |

FIG. 34B

| S140 | | | | |
|---|---|---|---|---|
| DAT2 | ic3 | ic4 | Rs2 | |
| | S1 | S2 | S1 | S2 |
| 1 | | I45 | P (L) | P (L) |
| 0 | | | AP (H) | AP (H) |
| 0 | I21 | I54 | AP (H) | AP (H) |
| 1 | | I45 | P (L) | P (L) |

| "0" | | "1" | |
|---|---|---|---|
| S1 | S2 | S1 | S2 |
| AP (H) | AP (H) | P (L) | P (L) |

| In1 | "0" | | "1" | |
|---|---|---|---|---|
| | S1 | S2 | S1 | S2 |
| | AP (H) | AP (H) | P (L) | P (L) |

| In2 | "0" | | "1" | |
|---|---|---|---|---|
| S120 | S1 | S2 | S1 | S2 |
| | In2 | iIn2 | In2 | iIn2 |
| | V1 | V2 | V1 | V2 |
| | + (E1) | - (E4) | - (E2) | + (E3) |

| S120 | ic1 | ic2 |
|---|---|---|
| | I21 | I45 |

| In1 | | | In2 | Rs1 | | S130 | |
|---|---|---|---|---|---|---|---|
| DAT1 | MG1 | | | | | VD | DAT2 |
| | S1 | S2 | | S1 | S2 | | |
| 0 | AP (H) | AP (H) | 0 | AP (H) | P (L) | ≠Va/2 (<Va/2) | 1 |
| 0 | AP (H) | AP (H) | 1 | AP (H) | AP (H) | Va/2 | 0 |
| 1 | P (L) | P (L) | 0 | P (L) | P (L) | Va/2 | 0 |
| 1 | P (L) | P (L) | 1 | AP (H) | P (L) | ≠Va/2 (<Va/2) | 1 |

| S140 | | | | |
|---|---|---|---|---|
| DAT2 | ic3 | ic4 | Rs2 | |
| | S1 | S2 | S1 | S2 |
| 1 | I12 | | P (L) | P (L) |
| 0 | | | AP (H) | AP (H) |
| 0 | I21 | I54 | AP (H) | AP (H) |
| 1 | I12 | | P (L) | P (L) |

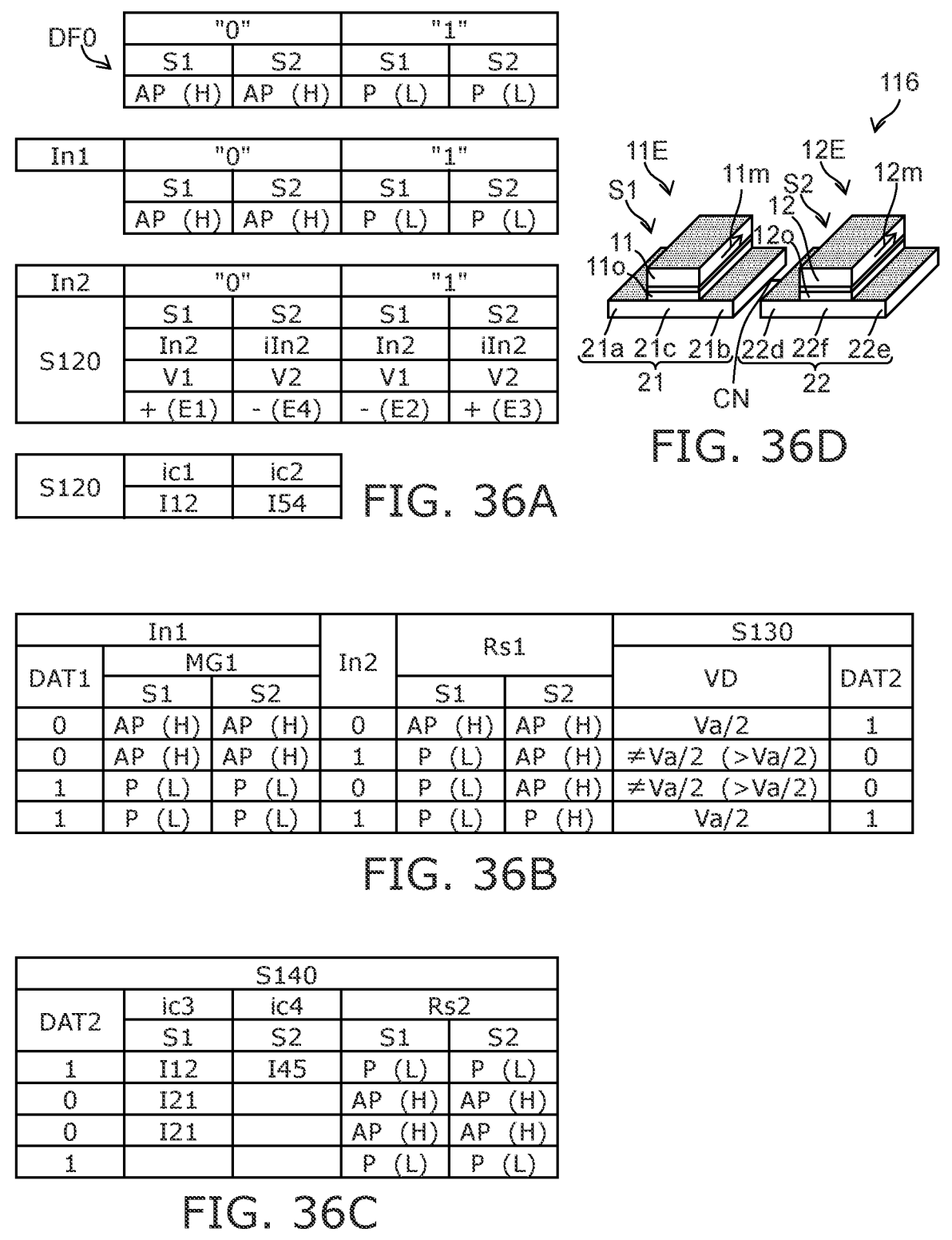

DF0

| "0" | | "1" | |
|---|---|---|---|
| S1 | S2 | S1 | S2 |
| AP (H) | AP (H) | P (L) | P (L) |

| In1 | "0" | | "1" | |
|---|---|---|---|---|
| | S1 | S2 | S1 | S2 |
| | AP (H) | AP (H) | P (L) | P (L) |

| In2 | "0" | | "1" | |
|---|---|---|---|---|
| S120 | S1 | S2 | S1 | S2 |
| | In2 | iIn2 | In2 | iIn2 |
| | V1 | V2 | V1 | V2 |
| | + (E1) | - (E4) | - (E2) | + (E3) |

| S120 | ic1 | ic2 |
|---|---|---|
| | I12 | I54 |

| In1 | | | In2 | Rs1 | | S130 | |
|---|---|---|---|---|---|---|---|
| DAT1 | MG1 | | | | | VD | DAT2 |
| | S1 | S2 | | S1 | S2 | | |
| 0 | AP (H) | AP (H) | 0 | AP (H) | AP (H) | Va/2 | 1 |
| 0 | AP (H) | AP (H) | 1 | P (L) | AP (H) | ≠Va/2 (>Va/2) | 0 |
| 1 | P (L) | P (L) | 0 | P (L) | AP (H) | ≠Va/2 (>Va/2) | 0 |
| 1 | P (L) | P (L) | 1 | P (L) | P (H) | Va/2 | 1 |

FIG. 36B

| S140 | | | | |
|---|---|---|---|---|
| DAT2 | ic3 | ic4 | Rs2 | |
| | S1 | S2 | S1 | S2 |
| 1 | I12 | I45 | P (L) | P (L) |
| 0 | I21 | | AP (H) | AP (H) |
| 0 | I21 | | AP (H) | AP (H) |
| 1 | | | P (L) | P (L) |

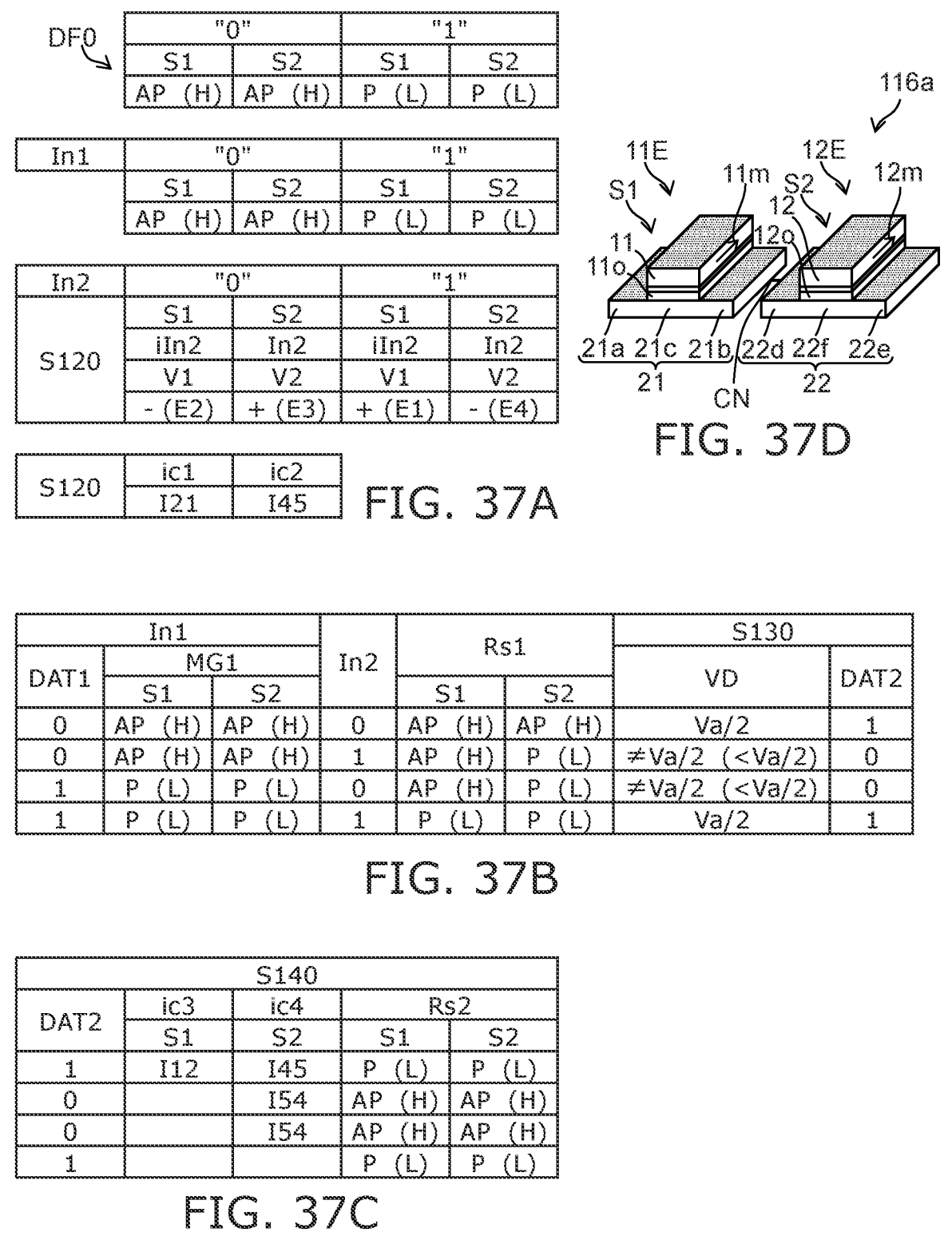

| "0" | | "1" | |
|---|---|---|---|
| S1 | S2 | S1 | S2 |
| AP (H) | AP (H) | P (L) | P (L) |

| In1 | "0" | | "1" | |
|---|---|---|---|---|
| | S1 | S2 | S1 | S2 |
| | AP (H) | AP (H) | P (L) | P (L) |

| In2 | "0" | | "1" | |
|---|---|---|---|---|
| S120 | S1 | S2 | S1 | S2 |
| | iIn2 | In2 | iIn2 | In2 |
| | V1 | V2 | V1 | V2 |
| | - (E2) | + (E3) | + (E1) | - (E4) |

| S120 | ic1 | ic2 |
|---|---|---|
| | I21 | I45 |

| In1 | | | In2 | Rs1 | | S130 | |
|---|---|---|---|---|---|---|---|
| DAT1 | MG1 | | | | | VD | DAT2 |
| | S1 | S2 | | S1 | S2 | | |
| 0 | AP (H) | AP (H) | 0 | AP (H) | AP (H) | Va/2 | 1 |
| 0 | AP (H) | AP (H) | 1 | AP (H) | P (L) | ≠Va/2 (<Va/2) | 0 |
| 1 | P (L) | P (L) | 0 | AP (H) | P (L) | ≠Va/2 (<Va/2) | 0 |
| 1 | P (L) | P (L) | 1 | P (L) | P (L) | Va/2 | 1 |

FIG. 37B

| S140 | | | | |
|---|---|---|---|---|
| DAT2 | ic3 | ic4 | Rs2 | |
| | S1 | S2 | S1 | S2 |
| 1 | I12 | I45 | P (L) | P (L) |
| 0 | | I54 | AP (H) | AP (H) |
| 0 | | I54 | AP (H) | AP (H) |
| 1 | | | P (L) | P (L) |

| "0" | | "1" | |
|---|---|---|---|
| S1 | S2 | S1 | S2 |
| P (L) | AP (H) | AP (H) | P (L) |

| In1 | "0" | | "1" | |
|---|---|---|---|---|
| | S1 | S2 | S1 | S2 |
| | P (L) | AP (H) | AP (H) | P (L) |

| In2 | "0" | | "1" | |
|---|---|---|---|---|
| S120 | S1 | S2 | S1 | S2 |
| | In2 | iIn2 | In2 | iIn2 |
| | V1 | V2 | V1 | V2 |
| | + (E1) | - (E4) | - (E2) | + (E3) |

| S120 | ic1 | ic2 |
|---|---|---|
| | I21 | I45 |

| In1 | | | In2 | Rs1 | | S130 | |
|---|---|---|---|---|---|---|---|
| DAT1 | MG1 | | | | | VD | DAT2 |
| | S1 | S2 | | S1 | S2 | | |
| 0 | P (L) | AP (H) | 0 | P (L) | P (L) | =Va/2 | 1 |
| 0 | P (L) | AP (H) | 1 | P (L) | AP (H) | ≠Va/2 (>Va/2) | 0 |
| 1 | AP (H) | P (L) | 0 | AP (H) | P (L) | ≠Va/2 (<Va/2) | 0 |
| 1 | AP (H) | P (L) | 1 | P (L) | P (L) | =Va/2 | 1 |

| S140 | | | | |
|---|---|---|---|---|
| DAT2 | ic3 | ic4 | Rs2 | |
| | S1 | S2 | S1 | S2 |
| 1 | I12 | | AP (H) | P (L) |
| 0 | | | P (L) | AP (H) |
| 0 | I21 | I54 | P (L) | AP (H) |
| 1 | I12 | | AP (H) | P (L) |

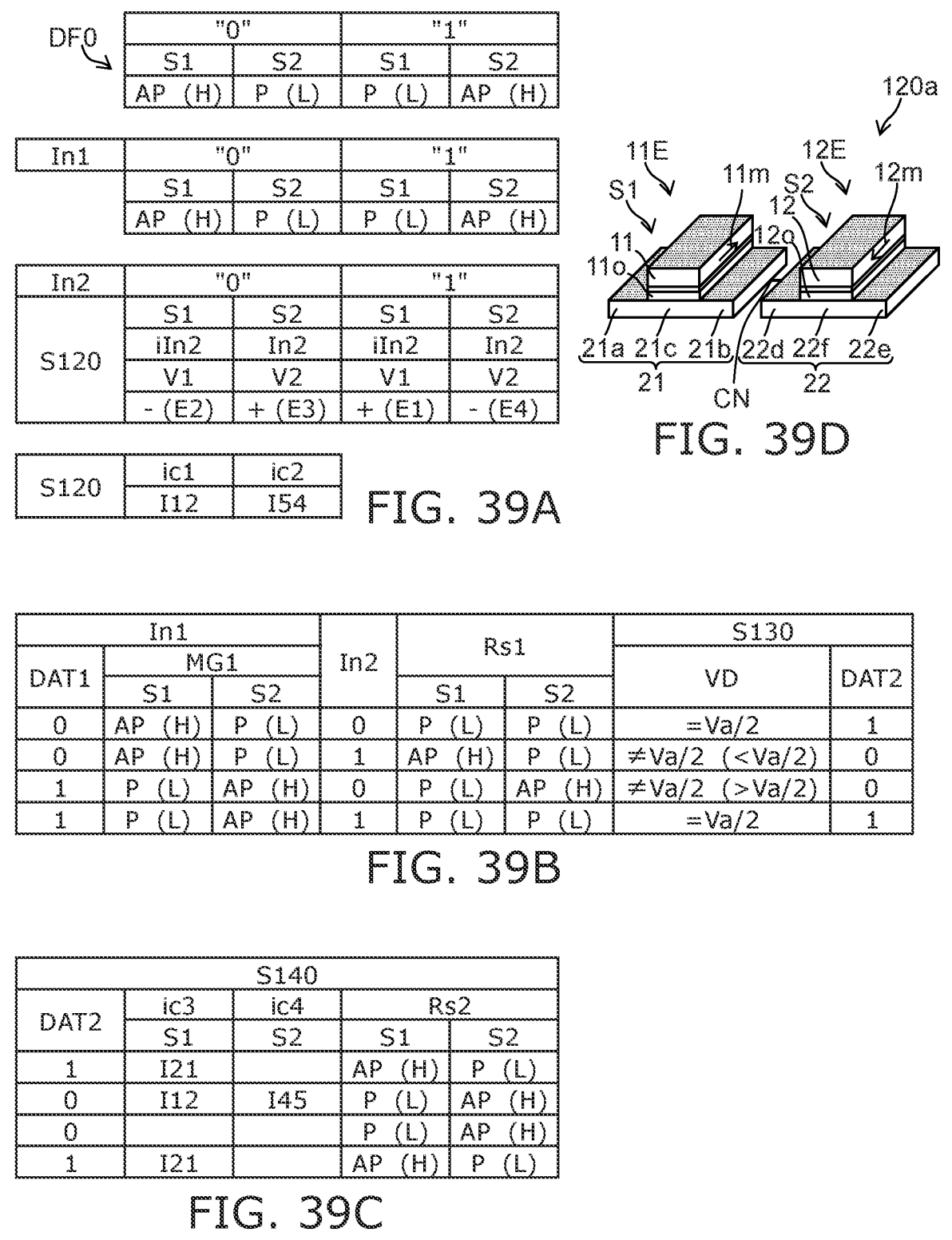

DF0

| "0" | | "1" | |
|---|---|---|---|
| S1 | S2 | S1 | S2 |
| AP (H) | P (L) | P (L) | AP (H) |

| In1 | "0" | | "1" | |
|---|---|---|---|---|
| | S1 | S2 | S1 | S2 |
| | AP (H) | P (L) | P (L) | AP (H) |

| In2 | "0" | | "1" | |
|---|---|---|---|---|
| S120 | S1 | S2 | S1 | S2 |
| | iIn2 | In2 | iIn2 | In2 |
| | V1 | V2 | V1 | V2 |
| | - (E2) | + (E3) | + (E1) | - (E4) |

| S120 | ic1 | ic2 |
|---|---|---|
| | I12 | I54 |

| In1 | | | In2 | Rs1 | | S130 | |
|---|---|---|---|---|---|---|---|
| DAT1 | MG1 | | | | | VD | DAT2 |
| | S1 | S2 | | S1 | S2 | | |
| 0 | AP (H) | P (L) | 0 | P (L) | P (L) | =Va/2 | 1 |
| 0 | AP (H) | P (L) | 1 | AP (H) | P (L) | ≠Va/2 (<Va/2) | 0 |
| 1 | P (L) | AP (H) | 0 | P (L) | AP (H) | ≠Va/2 (>Va/2) | 0 |
| 1 | P (L) | AP (H) | 1 | P (L) | P (L) | =Va/2 | 1 |

FIG. 39B

| S140 | | | | |
|---|---|---|---|---|
| DAT2 | ic3 | ic4 | Rs2 | |
| | S1 | S2 | S1 | S2 |
| 1 | I21 | | AP (H) | P (L) |
| 0 | I12 | I45 | P (L) | AP (H) |
| 0 | | | P (L) | AP (H) |
| 1 | I21 | | AP (H) | P (L) |

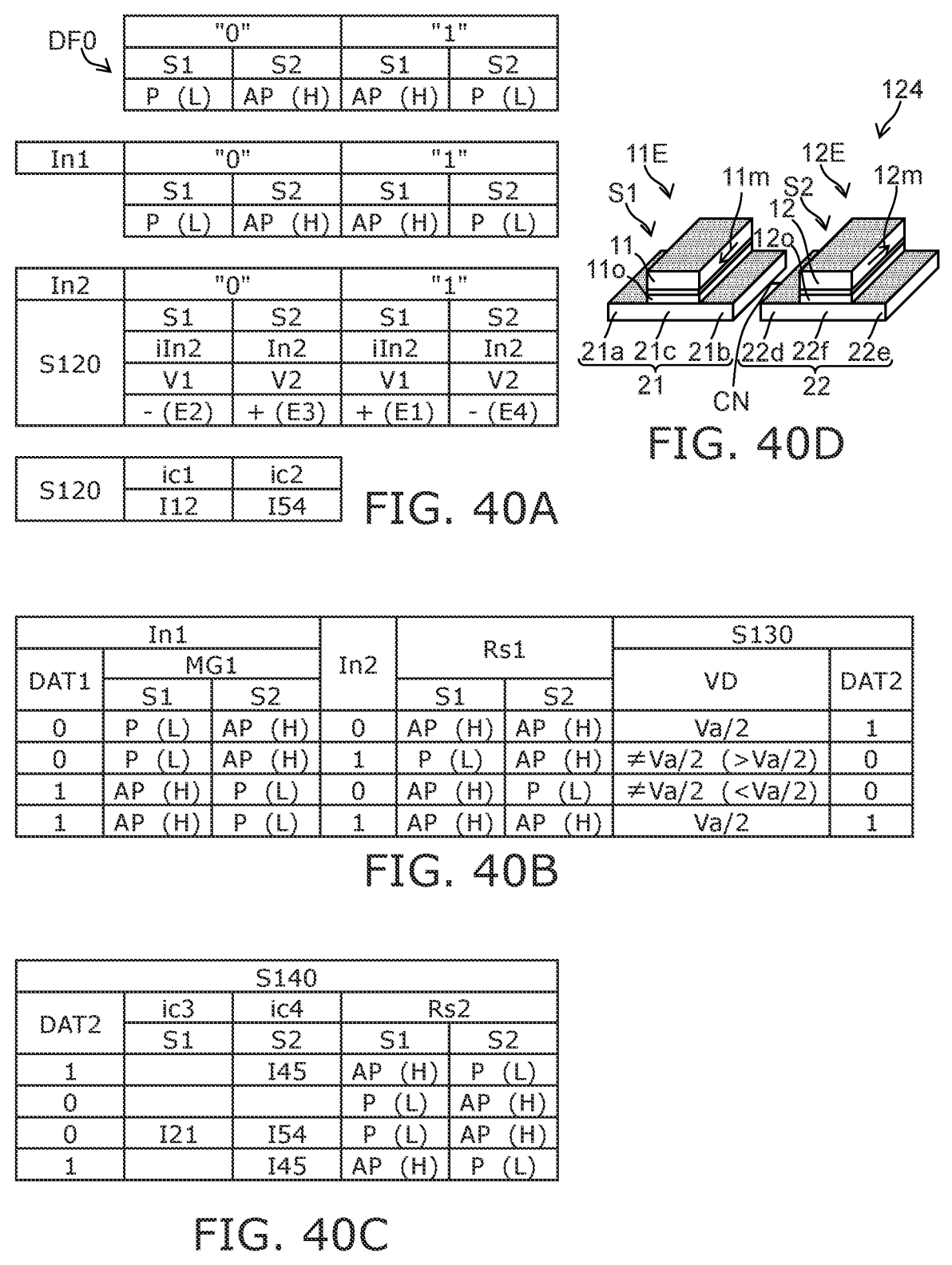

| "0" | | "1" | |
|---|---|---|---|
| S1 | S2 | S1 | S2 |
| P (L) | AP (H) | AP (H) | P (L) |

| In1 | "0" | | "1" | |
|---|---|---|---|---|
| | S1 | S2 | S1 | S2 |
| | P (L) | AP (H) | AP (H) | P (L) |

| In2 | "0" | | "1" | |
|---|---|---|---|---|
| S120 | S1 | S2 | S1 | S2 |
| | iIn2 | In2 | iIn2 | In2 |
| | V1 | V2 | V1 | V2 |
| | - (E2) | + (E3) | + (E1) | - (E4) |

| S120 | ic1 | ic2 |
|---|---|---|
| | I12 | I54 |

| In1 | | | In2 | Rs1 | | S130 | |
|---|---|---|---|---|---|---|---|
| DAT1 | MG1 | | | | | VD | DAT2 |
| | S1 | S2 | | S1 | S2 | | |
| 0 | P (L) | AP (H) | 0 | AP (H) | AP (H) | Va/2 | 1 |
| 0 | P (L) | AP (H) | 1 | P (L) | AP (H) | ≠Va/2 (>Va/2) | 0 |
| 1 | AP (H) | P (L) | 0 | AP (H) | P (L) | ≠Va/2 (<Va/2) | 0 |
| 1 | AP (H) | P (L) | 1 | AP (H) | AP (H) | Va/2 | 1 |

FIG. 40B

| S140 | | | | |
|---|---|---|---|---|
| DAT2 | ic3 | ic4 | Rs2 | |
| | S1 | S2 | S1 | S2 |
| 1 | | I45 | AP (H) | P (L) |
| 0 | | | P (L) | AP (H) |
| 0 | I21 | I54 | P (L) | AP (H) |
| 1 | | I45 | AP (H) | P (L) |

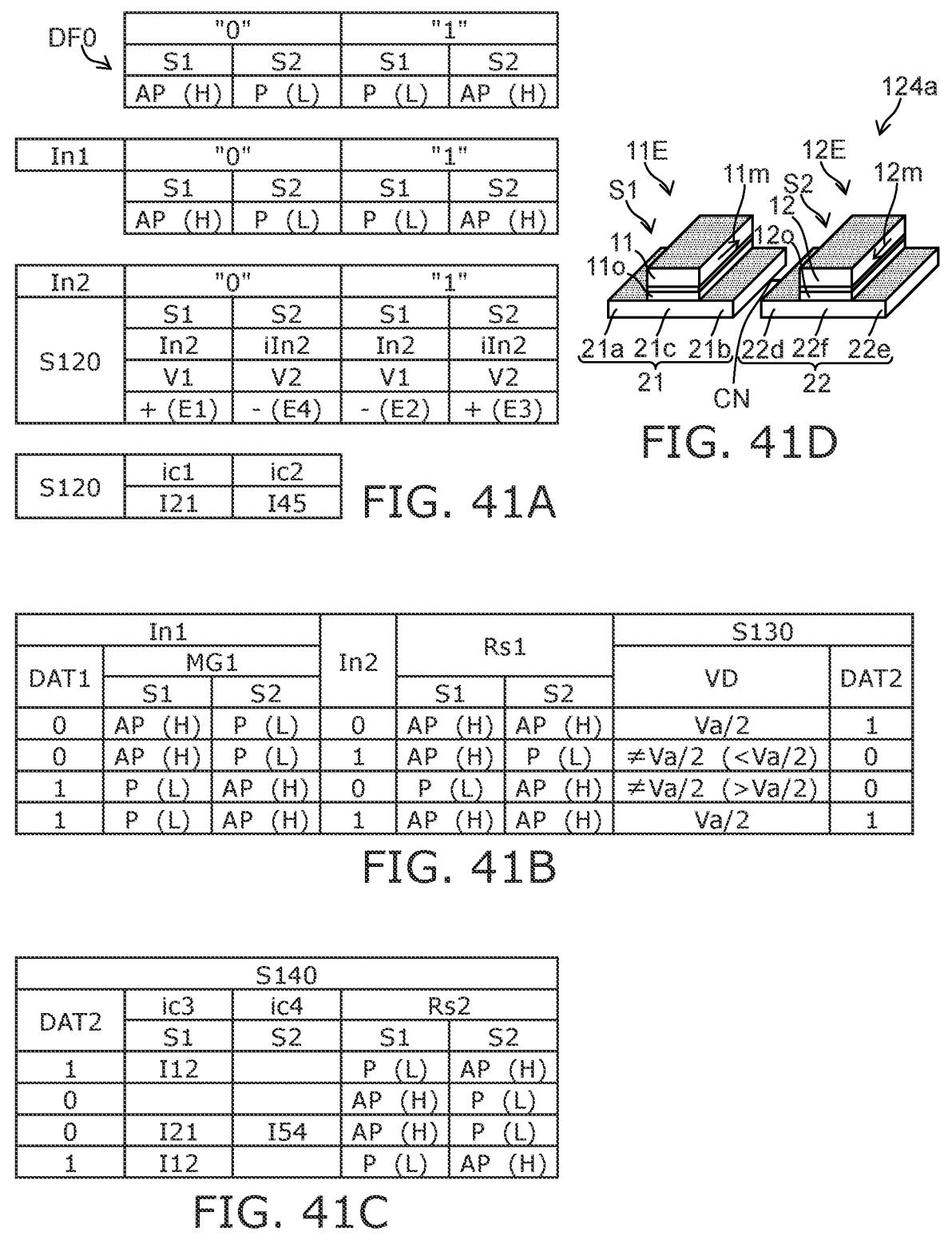

| "0" | | "1" | |
|---|---|---|---|
| S1 | S2 | S1 | S2 |
| AP (H) | P (L) | P (L) | AP (H) |

| In1 | "0" | | "1" | |
|---|---|---|---|---|
| | S1 | S2 | S1 | S2 |
| | AP (H) | P (L) | P (L) | AP (H) |

| In2 | "0" | | "1" | |
|---|---|---|---|---|
| S120 | S1 | S2 | S1 | S2 |
| | In2 | iIn2 | In2 | iIn2 |
| | V1 | V2 | V1 | V2 |
| | + (E1) | - (E4) | - (E2) | + (E3) |

| S120 | ic1 | ic2 |
|---|---|---|
| | I21 | I45 |

| In1 | | | In2 | Rs1 | | S130 | |
|---|---|---|---|---|---|---|---|
| DAT1 | MG1 | | | | | VD | DAT2 |
| | S1 | S2 | | S1 | S2 | | |
| 0 | AP (H) | P (L) | 0 | AP (H) | AP (H) | Va/2 | 1 |
| 0 | AP (H) | P (L) | 1 | AP (H) | P (L) | ≠Va/2 (<Va/2) | 0 |
| 1 | P (L) | AP (H) | 0 | P (L) | AP (H) | ≠Va/2 (>Va/2) | 0 |
| 1 | P (L) | AP (H) | 1 | AP (H) | AP (H) | Va/2 | 1 |

FIG. 41B

| S140 | | | | |
|---|---|---|---|---|
| DAT2 | ic3 | ic4 | Rs2 | |
| | S1 | S2 | S1 | S2 |
| 1 | I12 | | P (L) | AP (H) |
| 0 | | | AP (H) | P (L) |
| 0 | I21 | I54 | AP (H) | P (L) |
| 1 | I12 | | P (L) | AP (H) |

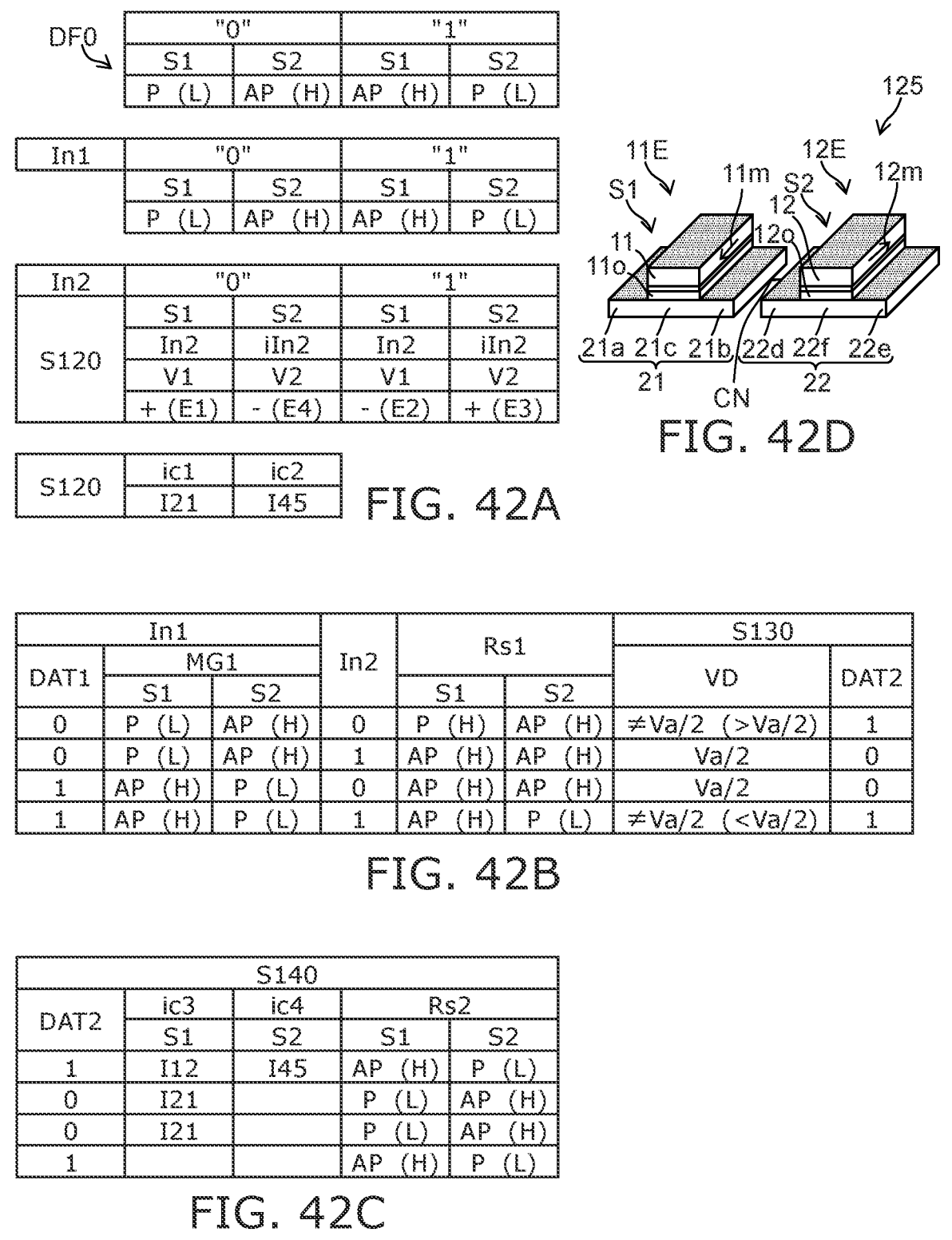

| "0" | | "1" | |
|---|---|---|---|
| S1 | S2 | S1 | S2 |
| P (L) | AP (H) | AP (H) | P (L) |

| In1 | "0" | | "1" | |
|---|---|---|---|---|
| | S1 | S2 | S1 | S2 |
| | P (L) | AP (H) | AP (H) | P (L) |

| In2 | "0" | | "1" | |
|---|---|---|---|---|
| S120 | S1 | S2 | S1 | S2 |
| | In2 | iIn2 | In2 | iIn2 |
| | V1 | V2 | V1 | V2 |
| | + (E1) | - (E4) | - (E2) | + (E3) |

| S120 | ic1 | ic2 |
|---|---|---|
| | I21 | I45 |

FIG. 42A

| In1 | | | In2 | Rs1 | | S130 | |
|---|---|---|---|---|---|---|---|
| DAT1 | MG1 | | | | | VD | DAT2 |
| | S1 | S2 | | S1 | S2 | | |
| 0 | P (L) | AP (H) | 0 | P (H) | AP (H) | ≠Va/2 (>Va/2) | 1 |
| 0 | P (L) | AP (H) | 1 | AP (H) | AP (H) | Va/2 | 0 |
| 1 | AP (H) | P (L) | 0 | AP (H) | AP (H) | Va/2 | 0 |
| 1 | AP (H) | P (L) | 1 | AP (H) | P (L) | ≠Va/2 (<Va/2) | 1 |

FIG. 42B

| S140 | | | | |
|---|---|---|---|---|
| DAT2 | ic3 | ic4 | Rs2 | |
| | S1 | S2 | S1 | S2 |
| 1 | I12 | I45 | AP (H) | P (L) |
| 0 | I21 | | P (L) | AP (H) |
| 0 | I21 | | P (L) | AP (H) |
| 1 | | | AP (H) | P (L) |

| "0" | | "1" | |
|---|---|---|---|
| S1 | S2 | S1 | S2 |
| AP (H) | P (L) | P (L) | AP (H) |

| In1 | "0" | | "1" | |
|---|---|---|---|---|
| | S1 | S2 | S1 | S2 |
| | AP (H) | P (L) | P (L) | AP (H) |

| In2 | "0" | | "1" | |
|---|---|---|---|---|
| S120 | S1 | S2 | S1 | S2 |
| | iIn2 | In2 | iIn2 | In2 |
| | V1 | V2 | V1 | V2 |
| | - (E2) | + (E3) | + (E1) | - (E4) |

| S120 | ic1 | ic2 |
|---|---|---|
| | I21 | I45 |

| In1 | | | In2 | Rs1 | | S130 | |
|---|---|---|---|---|---|---|---|
| DAT1 | MG1 | | | | | VD | DAT2 |
| | S1 | S2 | | S1 | S2 | | |
| 0 | AP (H) | P (L) | 0 | AP (H) | P (L) | ≠Va/2 (<Va/2) | 1 |
| 0 | AP (H) | P (L) | 1 | AP (H) | AP (H) | Va/2 | 0 |
| 1 | P (L) | AP (H) | 0 | AP (H) | AP (H) | Va/2 | 0 |
| 1 | P (L) | AP (H) | 1 | P (L) | AP (H) | ≠Va/2 (>Va/2) | 1 |

| S140 | | | | |
|---|---|---|---|---|
| DAT2 | ic3 | ic4 | Rs2 | |
| | S1 | S2 | S1 | S2 |
| 1 | I12 | I45 | P (L) | AP (H) |
| 0 | | I54 | AP (H) | P (L) |
| 0 | | I54 | AP (H) | P (L) |
| 1 | | | P (L) | AP (H) |

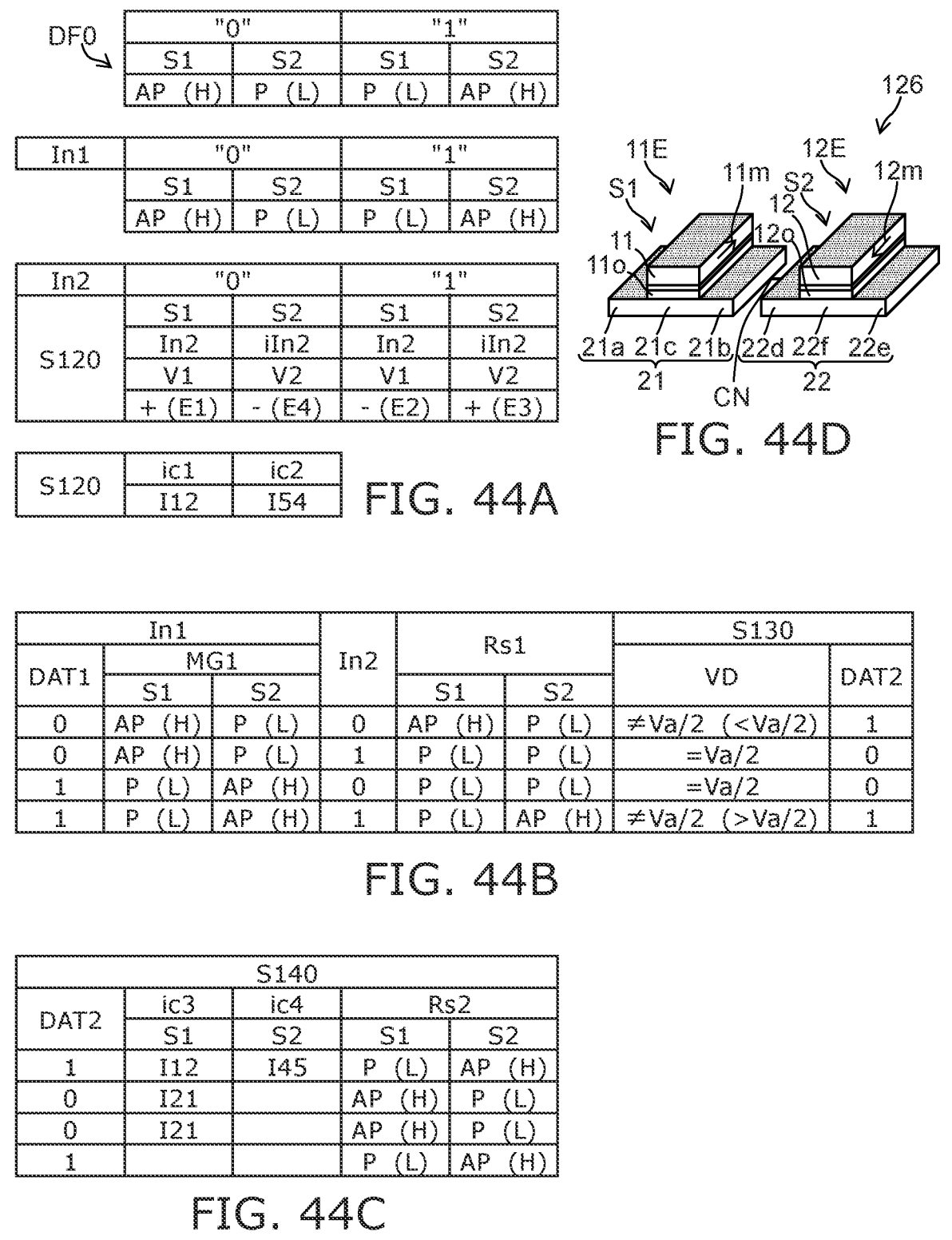

DF0

| "0" | | "1" | |
|---|---|---|---|
| S1 | S2 | S1 | S2 |
| AP (H) | P (L) | P (L) | AP (H) |

| In1 | "0" | | "1" | |
|---|---|---|---|---|
| | S1 | S2 | S1 | S2 |
| | AP (H) | P (L) | P (L) | AP (H) |

| In2 | "0" | | "1" | |
|---|---|---|---|---|
| S120 | S1 | S2 | S1 | S2 |
| | In2 | iIn2 | In2 | iIn2 |
| | V1 | V2 | V1 | V2 |
| | + (E1) | - (E4) | - (E2) | + (E3) |

| S120 | ic1 | ic2 |
|---|---|---|
| | I12 | I54 |

| In1 | | | In2 | Rs1 | | S130 | |
|---|---|---|---|---|---|---|---|
| DAT1 | MG1 | | | | | VD | DAT2 |
| | S1 | S2 | | S1 | S2 | | |
| 0 | AP (H) | P (L) | 0 | AP (H) | P (L) | ≠Va/2 (<Va/2) | 1 |
| 0 | AP (H) | P (L) | 1 | P (L) | P (L) | =Va/2 | 0 |
| 1 | P (L) | AP (H) | 0 | P (L) | P (L) | =Va/2 | 0 |
| 1 | P (L) | AP (H) | 1 | P (L) | AP (H) | ≠Va/2 (>Va/2) | 1 |

FIG. 44B

| S140 | | | | |
|---|---|---|---|---|
| DAT2 | ic3 | ic4 | Rs2 | |
| | S1 | S2 | S1 | S2 |
| 1 | I12 | I45 | P (L) | AP (H) |
| 0 | I21 | | AP (H) | P (L) |
| 0 | I21 | | AP (H) | P (L) |
| 1 | | | P (L) | AP (H) |

| | "0" | | "1" | |
|---|---|---|---|---|
| | S1 | S2 | S1 | S2 |
| | P (L) | AP (H) | AP (H) | P (L) |

| In1 | "0" | | "1" | |
|---|---|---|---|---|
| | S1 | S2 | S1 | S2 |
| | P (L) | AP (H) | AP (H) | P (L) |

| In2 | "0" | | "1" | |
|---|---|---|---|---|
| S120 | S1 | S2 | S1 | S2 |
| | iIn2 | In2 | iIn2 | In2 |
| | V1 | V2 | V1 | V2 |
| | - (E2) | + (E3) | + (E1) | - (E4) |

| S120 | ic1 | ic2 |
|---|---|---|
| | I21 | I45 |

| In1 | | | In2 | Rs1 | | S130 | |
|---|---|---|---|---|---|---|---|
| DAT1 | MG1 | | | | | VD | DAT2 |
| | S1 | S2 | | S1 | S2 | | |
| 0 | P (L) | AP (H) | 0 | P (L) | AP (H) | ≠Va/2 (>Va/2) | 1 |
| 0 | P (L) | AP (H) | 1 | P (L) | P (L) | =Va/2 | 0 |
| 1 | AP (H) | P (L) | 0 | P (L) | P (L) | =Va/2 | 0 |
| 1 | AP (H) | P (L) | 1 | AP (H) | P (L) | ≠Va/2 (<Va/2) | 1 |

| S140 | | | | |
|---|---|---|---|---|
| DAT2 | ic3 | ic4 | Rs2 | |
| | S1 | S2 | S1 | S2 |
| 1 | I12 | I45 | AP (H) | P (L) |
| 0 | | I54 | P (L) | AP (H) |
| 0 | | I54 | P (L) | AP (H) |
| 1 | | | AP (H) | P (L) |

ARITHMETIC DEVICE

CROSS-REFERENCE TO RELATED APPLICATIONS

This is a continuation application of International Application PCT/JP2020/047144, filed on Dec. 17, 2020; the entire contents of which are incorporated herein by reference.

FIELD

Embodiments described herein relate generally to an arithmetic device.

BACKGROUND

There is an arithmetic device that uses a magnetic element. In such an arithmetic device, a simpler configuration is desired.

BRIEF DESCRIPTION OF THE DRAWINGS

FIG. 11 is a schematic view illustrating the operation of the arithmetic device according to the first embodiment;

FIG. 12 is a schematic view illustrating the operation of the arithmetic device according to the first embodiment;

FIG. 23 is a schematic perspective view illustrating the operation of the arithmetic device according to the second embodiment;

FIG. 24 is a schematic perspective view illustrating the operation of the arithmetic device according to the second embodiment;

FIGS. 30A to 30D are schematic views illustrating the operation of the arithmetic device according to the embodiment;

FIGS. 34A to 34D are schematic views illustrating the operation of an arithmetic device according to the embodiment;

FIGS. 36A to 36D are schematic views illustrating the operation of an arithmetic device according to the embodiment;

FIGS. 37A to 37D are schematic views illustrating the operation of an arithmetic device according to the embodiment;

FIGS. 39A to 39D are schematic views illustrating the operation of an arithmetic device according to the embodiment;

FIGS. 40A to 40D are schematic views illustrating the operation of an arithmetic device according to the embodiment;

FIGS. 41A to 41D are schematic views illustrating the operation of an arithmetic device according to the embodiment;

FIGS. 42A to 42D are schematic views illustrating the operation of an arithmetic device according to the embodiment;

FIGS. 44A to 44D are schematic views illustrating the operation of an arithmetic device according to the embodiment.

DETAILED DESCRIPTION

Figure 1:
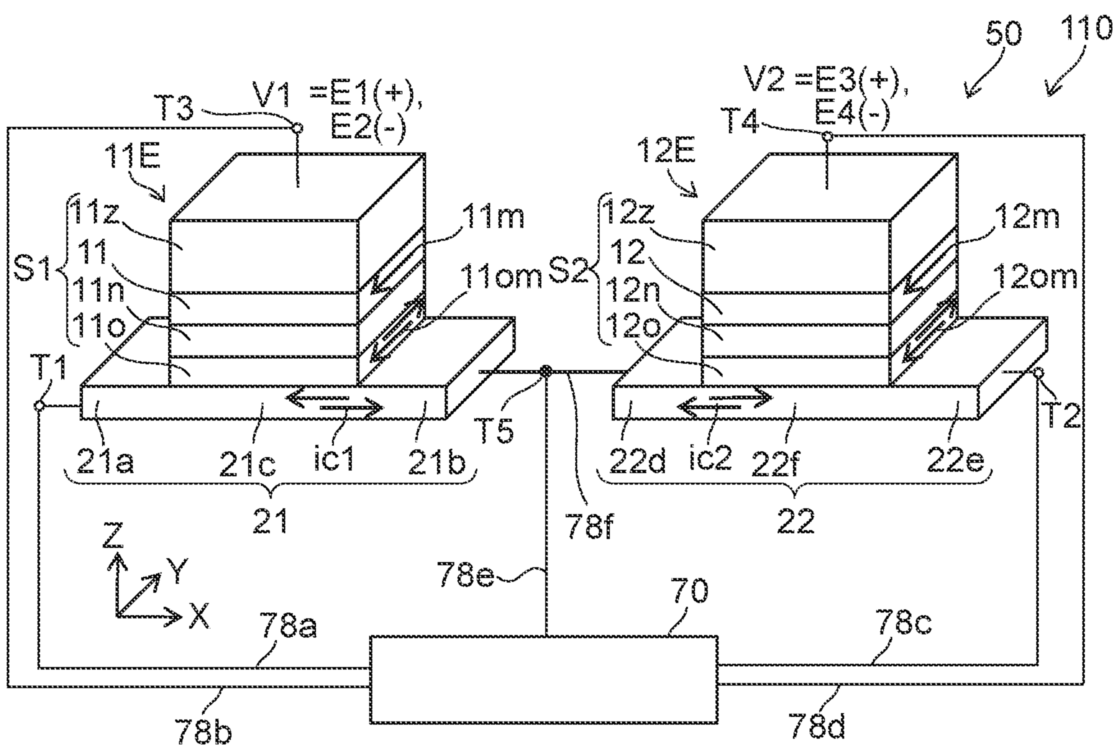
FIG. 1 is a schematic perspective view illustrating an arithmetic device according to a first embodiment.

According to one embodiment, an arithmetic device includes an arithmetic element part, and a controller. The arithmetic element part includes a first element and a second element. The first element includes a first conductive member and a first stacked body. The first conductive member includes a first portion, a second portion, and a third portion between the first portion and the second portion. The first stacked body includes a first magnetic layer, and a first counter magnetic layer provided between the third portion and the first magnetic layer. The second element includes a second conductive member and a second stacked body. The second conductive member includes a fourth portion, a fifth portion, and a sixth portion between the fourth portion and the fifth portion. The second stacked body includes a second magnetic layer, and a second counter magnetic layer provided between the sixth portion and the second magnetic layer. The second portion and the fourth portion are electrically connected. The controller is configured to perform an XNOR operation of a first input and a second input. The first input corresponds to a first electrical resistance of the first stacked body and a second electrical resistance of the second stacked body. The second input corresponds to a potential of the first magnetic layer and a potential of the second magnetic layer.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic perspective view illustrating an arithmetic device according to a first embodiment.

As shown in FIG. 1, an arithmetic device 110 according to the embodiment includes an arithmetic element part 50 and a controller 70. The arithmetic element part 50 includes a first element 11E and a second element 12E.

The first element 11E includes a first conductive member 21 and a first stacked body S1. The first conductive member 21 includes a first portion 21*a*, a second portion 21*b* and a third portion 21*c*. The third portion 21*c* is between the first portion 21*a* and the second portion 21*b*.

The first stacked body S1 includes a first magnetic layer 11 and a first counter magnetic layer 110. The first counter magnetic layer 110 is between the third portion 21*c* and the first magnetic layer 11.

For example, a direction from the first portion 21*a* to the second portion 21*b* is defined as an X-axis direction. One direction perpendicular to the X-axis direction is defined as a Z-axis direction. A direction perpendicular to the X-axis direction and the Z-axis direction is defined as a Y-axis direction.

A direction from the third portion 21*c* to the first magnetic layer 11 is, for example, along the Z-axis direction.

In this example, the first stacked body S1 further includes a first non-magnetic layer 11*n*. The first non-magnetic layer 11*n* is between the first counter magnetic layer 110 and the first magnetic layer 11.

In this example, the first stacked body S1 further includes a magnetic layer 11*z*. There is the first magnetic layer 11 between the third portion 21*c* and the magnetic layer 11*z*.

The second element 12E includes a second conductive member 22 and a second stacked body S2. The second conductive member 22 includes a fourth portion 22*d*, a fifth portion 22*e*, and a sixth portion 22*f*. The sixth portion 22*f* is between the fourth portion 22*d* and the fifth portion 22*e*.

The second stacked body S2 includes a second magnetic layer 12 and a second counter magnetic layer 120. The second counter magnetic layer 120 is between the sixth portion 22*f* and the second magnetic layer 12.

A direction from the sixth portion 22*f* to the second magnetic layer 12 is, for example, along the Z-axis direction.

In this example, the second stacked body S2 further includes a second non-magnetic layer 12*n*. The second non-magnetic layer 12*n* is between the second counter magnetic layer 120 and the second magnetic layer 12.

In this example, the second stacked body S2 further includes a magnetic layer 12*z*. There is the second magnetic layer 12 between the sixth portion 22*f* and the magnetic layer 12*z*.

The first stacked body S1 and the second stacked body S2 include, for example, MTJ (Magnetic Tunnel Junction).

The second portion 21*b* and the fourth portion 22*d* are electrically connected. In this example, the arithmetic device 110 includes a conductive part 78*f*. The conductive part 78*f* electrically connects the second portion 21*b* and the fourth portion 22*d*. As a material of the conductive part 78*f*, for example, materials of the first conductive member 21 and the second conductive member 22 may be applied.

The controller 70 is electrically connected to the connection point (fifth terminal T5) of the conductive part 78*f* by a conductive part 78*e*.

For example, the controller 70 is electrically connected to the first portion 21*a* by a conductive part 78*a*. For example, the controller 70 is electrically connected to the second portion 21*b* by the conductive part 78*e*. The controller 70 is configured to supply a first current ic1 to the first conductive member 21 by these conductive parts.

For example, the controller 70 is electrically connected to the fifth portion 22*e* by a conductive part 78*c*. For example, the controller 70 is electrically connected to the fourth portion 22*d* by the conductive part 78*e*. The controller 70 is configured to supply a second current ic2 to the second conductive member 22 by these conductive parts.

The controller 70 is electrically connected to the first magnetic layer 11 by a conductive part 78*b*. The controller 70 is configured to set a potential of the first magnetic layer 11. The potential of the first magnetic layer 11 may be regarded as substantially a potential of the magnetic layer 11*z* or a potential of the conductive part 78*b*.

The controller 70 is electrically connected to the second magnetic layer 12 by a conductive part 78*d*. The controller 70 is configured to set a potential of the second magnetic layer 12. The potential of the second magnetic layer 12 may be regarded as substantially a potential of the magnetic layer 12*z* or a potential of the conductive part 78*d*.

For example, a potential V1 of the first magnetic layer 11 can be set to a first potential E1 or a second potential E2. The first potential E1 corresponds to a "Deactive" potential. The second potential E2 corresponds to an "Active" potential. When the potential V1 is the "Active" potential, a first electrical resistance of the first stacked body S1 becomes a value corresponding to an orientation of the first current ic1. When the potential V1 is the "Deactive" potential, even if the first current ic1 is supplied, the first electrical resistance does not substantially change.

It is considered that magnetic anisotropy of the first counter magnetic layer 110 changes when the potential V1 is the "Deactive" potential or the "Active" potential. It is considered that this changes ease of changing an orientation of magnetization 110*m* of the first counter magnetic layer 110.

When the potential V1 is the "Active" potential, for example, the first electrical resistance of the first stacked body S1 can be changed by the orientation of the first current ic1 flowing through the first conductive member 21. The change in electrical resistance changes according to the relationship between an orientation of the magnetization 11*m* of the first magnetic layer 11 and an orientation of the magnetization 110*m* of the first counter magnetic layer 110. The change in electrical resistance is based, for example, on a magnetoresistance effect. The change in the orientation of the magnetization 110*m* is based on, for example, a spin Hall effect in the first conductive member 21.

For example, when the orientation of the magnetization 110*m* of the first counter magnetic layer 110 includes the same component as orientation of the magnetization 11*m* of the first magnetic layer 11, it is regarded as a "parallel state" (P state). When the orientation of the magnetization 110*m* includes a component opposite to the orientation of the magnetization 11*m*, it is regarded as an "anti-parallel state" (AP state).

For example, a potential V2 of the second magnetic layer 12 can be set to a third potential E3 or a fourth potential E4. The third potential E3 corresponds to the "Deactive" potential. The fourth potential E4 corresponds to the "Active" potential. When the potential V2 is the "Active" potential, a second electrical resistance of the second stacked body S2 becomes a value corresponding to the orientation of the second current ic2. When the potential V2 is the "Deactive" potential, even if the second current ic2 is supplied, the second electrical resistance does not substantially change.

It is considered that magnetic anisotropy of the second counter magnetic layer 120 changes when the potential V2 is the "Deactive" potential or the "Active" potential. It is considered that this changes ease of changing an orientation of the magnetization 120*m* of the second counter magnetic layer 120.

When the potential V2 is the "Active" potential, for example, the second electrical resistance of the second stacked body S2 can be changed by the orientation of the second current ic2 flowing through the second conductive member 22. The change in electrical resistance changes according to the relationship between an orientation of the magnetization 12*m* of the second magnetic layer 12 and an orientation of the magnetization 120*m* of the second counter magnetic layer 120. The change in electrical resistance is based, for example, on a magnetoresistance effect. The change in the orientation of the magnetization 120*m* is based on, for example, a spin Hall effect in the second conductive member 22.

For example, when the orientation of the magnetization 120*m* of the second counter magnetic layer 120 includes the same component as the orientation of the magnetization 12*m* of the second magnetic layer 12, it is regarded as a "parallel state" (P state). When the orientation of the magnetization 120*m* includes a component opposite to the orientation of the magnetization 12*m*, it is regarded as an "anti-parallel state" (AP state).

A "low resistance state" corresponds to, for example, the P state. A "high resistance state" corresponds to, for example, the AP state.

In the following example, the polarity of the second potential E2 is opposite to the polarity of the first potential E1. The polarity of the fourth potential E4 is opposite to the polarity of the third potential E3. The polarity of the fourth potential E4 is opposite to the polarity of the first potential E1.

The first magnetic layer 11 and the second magnetic layer 12 correspond to, for example, a reference layer. The first counter magnetic layer 110 and the second counter magnetic layer 120 correspond to, for example, a free magnetic layer, and for example, a memory layer.

In the following, the polarity of the first potential E1 is positive ("+"), and the polarity of the second potential E2 is negative ("−"). In this case, the polarity of the third potential E3 is positive, and the polarity of the fourth potential E4 is negative. The polarities of the first potential E1 and the second potential E2 are based on, for example, the potential of the first conductive member 21. The polarities of the third potential E3 and the fourth potential E4 are based on, for example, the potential of the second conductive member 22.

As shown in FIG. 1, the first to fifth terminals T1 to T5 may be provided. The first terminal T1 is electrically connected to, for example, the first portion 21*a*. The second terminal T2 is electrically connected to, for example, the fifth portion 22*e*. The third terminal T3 is electrically connected to the first magnetic layer 11. The fourth terminal T4 is electrically connected to the second magnetic layer 12. The fifth terminal T5 is electrically connected to the second portion 21*b* and the fourth portion 22*d*.

The controller 70 can be electrically connected to these terminals. As will be described later, a switch element such as a transistor may be provided between the controller 70 and these terminals. When connected by the switch element, it is also included in the "electrically connected state".

In the embodiment, the controller 70 can output XNOR of a first input and a second input. The above first input corresponds to the first electrical resistance of the first stacked body S1 and the second electrical resistance of the second stacked body S2. The second input corresponds to the potential V1 of the first magnetic layer 11 and the potential V2 of the second magnetic layer 12. The potential V1 of the first magnetic layer 11 is, for example, the first potential E1 or the second potential E2. The potential V2 of the second magnetic layer 12 is, for example, the third potential E3 or the fourth potential E4.

The arithmetic device 110 having such a configuration can provide an arithmetic device having a simple configuration. In the following, an example of the operation in the arithmetic device 110 will be described.

Figure 2:
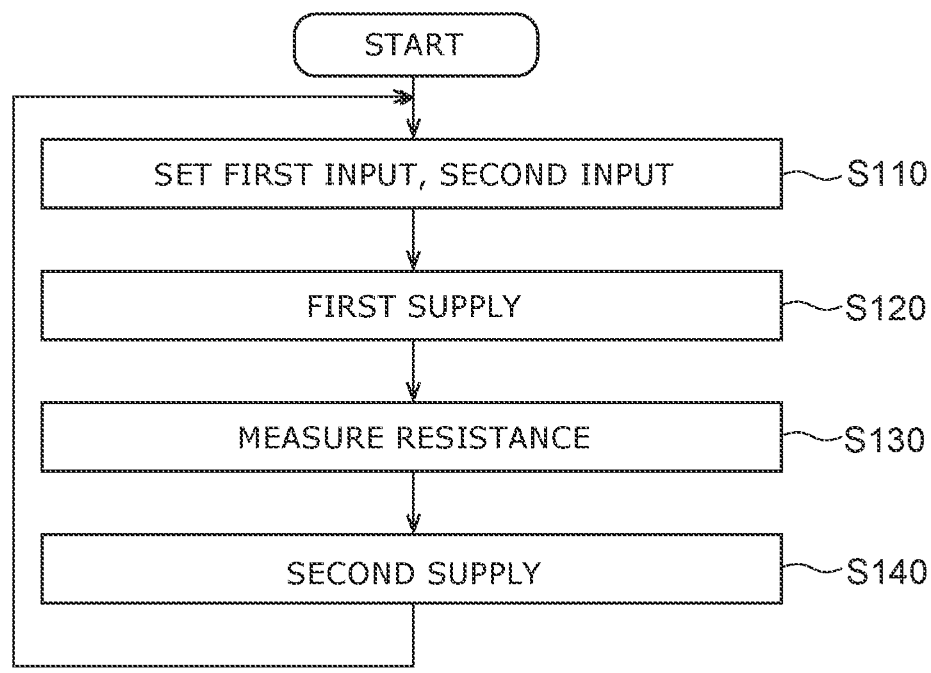
FIG. 2 is a flow chart illustrating the operation of the arithmetic device according to the first embodiment.

FIG. 2 is a flow chart illustrating the operation of the arithmetic device according to the first embodiment.

As shown in FIG. 2, the first input and the second input are set (step S110). As described above, the first input corresponds to the first electrical resistance of the first stacked body S1 and the second electrical resistance of the second stacked body S2. The second input corresponds to the potential V1 of the first magnetic layer 11 and the potential V2 of the second magnetic layer 12. These inputs may be set according to the purpose of the operation.

As shown in FIG. 2, the controller 70 performs a first supply operation (step S120). In the first supply operation, the controller 70 supplies the first current ic1 to the first conductive member 21 and supplies the second current ic2 to the second conductive member 22.

In one example, in the first supply operation, the first current ic1 has an orientation from the second portion 21*b* to the first portion 21*a*. The second current ic2 has an orientation from the fourth portion 22*d* to the fifth portion 22*e*.

As shown in FIG. 2, the controller 70 performs a measurement operation (step S130). In the measurement operation, the controller 70 measures the first electrical resistance after the supply of the first current ic1 and the second electrical resistance after the supply of the second current ic2.

As shown in FIG. 2, the controller 70 performs a second supply operation (step S140). In the second supply operation, the controller 70 supplies a third current to the first conductive member 21 and supplies a fourth current to the second conductive member 22 after the above measurement operation.

As will be described later, in the second supply operation, when the third current has an orientation from the first portion 21*a* to the second portion 21*b*, the fourth current has the orientation from the fourth portion 22*d* to the fifth portion 22*e*. On the other hand, when the third current has the orientation from the second portion 21*b* to the first portion 21*a*, the fourth current has an orientation from the fifth portion 22*e* to the fourth portion 22*d*.

By such an operation, the XNOR operation result can be obtained by a simple configuration and a simple operation.

An example of such an operation will be described below.

In the following example, in the case where the first electrical resistance of the first stacked body S1 is in the "low resistance state" (first low resistance state: P), and the second electrical resistance of the second stacked body S2 is in the "low resistance state" (second low resistance state: P), the first input is set to "0". In the case where the first electrical resistance is in the first high resistance state (AP) higher than the first low resistance state and the second electrical resistance is in the second high resistance state (AP) higher than the second low resistance state, the first input is set to "1".

In the following, the combination of the first low resistance state and the second low resistance state is defined as a (L, L) state or a (P, P) state. The combination of the first low resistance state and the second high resistance state is defined as the (L, H) state or the (P, AP) state. The combination of the first high resistance state and the second low resistance state is defined as the (H, L) state or the (AP, P) state. The combination of the first high resistance state and the second high resistance state is defined as the (H, H) state or the (AP, AP) state.

In the following example, in the second supply operation, the first element 11E is set to "Deactive" when the second input is "0", and the first element 11E is set to "Active" when the second input is "1". On the other hand, the second element 12E is set to "negative" of the second input. For example, when the second input is "0", the second element 12E is set to "Active", and when the second input is "1", the second element 12E is set to "Deactive".

For example, when the second input is "0", in the first supply operation (step S120), the potential V1 of the first magnetic layer 11 is the first potential E1, and the potential V2 of the second magnetic layer 12 is the fourth potential E4. When the second input is "1", in the first supply operation, the potential V1 of the first magnetic layer 11 is the second potential E2, and the potential V2 of the second magnetic layer 12 is the third potential E3.

FIGS. 3A, 3B, 4A, 4B, 5A, 5B, 6A, 6B, 7A, 7B, 8A, 8B, 9A, 9B, 10A, and 10B are schematic perspective views illustrating the operations of the arithmetic device according to the first embodiment.

In these figures, the magnetic layer 11*z* and the magnetic layer 12*z* are omitted.

Figure 3A:
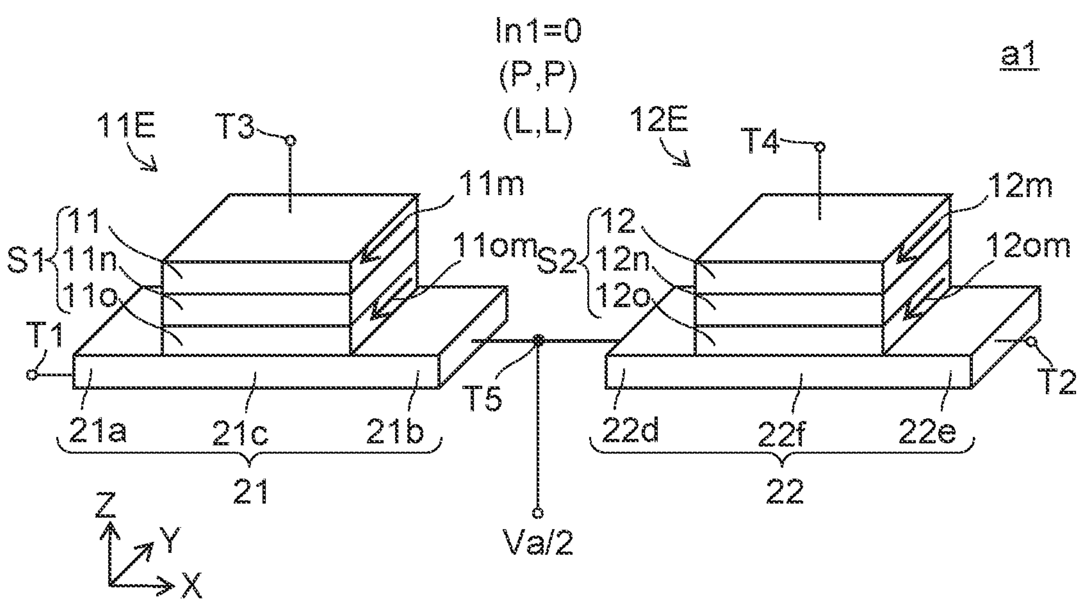
FIGS. 3A and 3B are schematic perspective views illustrating the operation of the arithmetic device according to the first embodiment.

In a state a1 illustrated in FIG. 3A, the first stacked body S1 and the second stacked body S2 are in the (P, P) state (for example, the (L, L) state). In this state, when a first potential difference Va is applied to the first magnetic layer 11 with reference to the second magnetic layer 12, the potential at the connection point (fifth terminal T5) between the second portion 21*b* and the fourth portion 22*d* is substantially ½ (ie, Va/2) of the first potential difference Va.

Figure 3B:
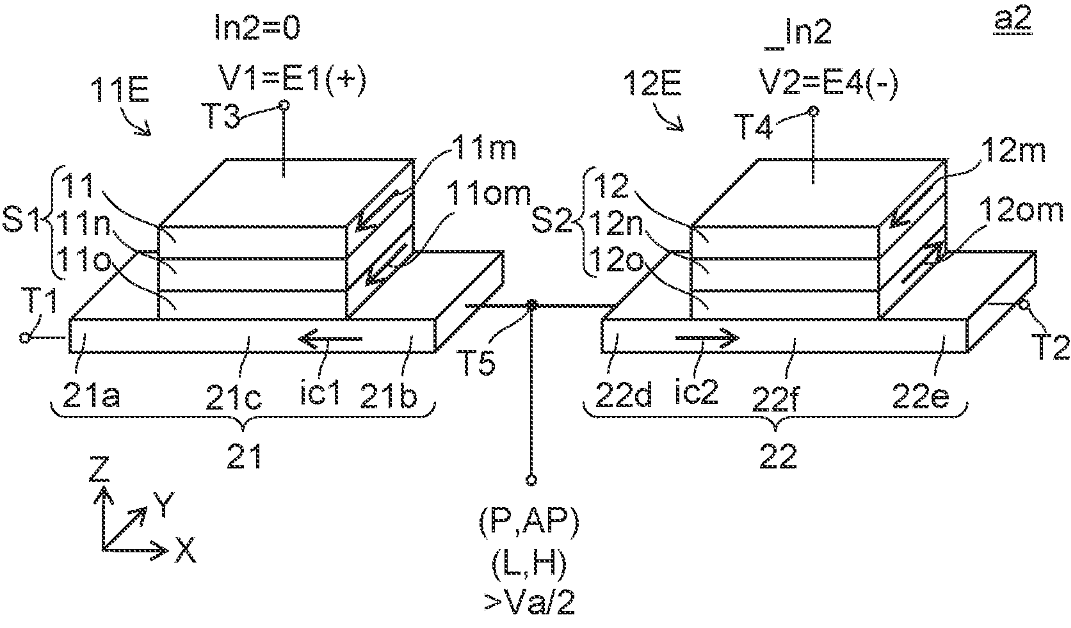

As shown in FIG. 3B (state a2), in the first supply operation, the second input In2 is "0", and the potential V1 of the first magnetic layer 11 is the first potential E1. In the first supply operation, the potential V1 of the first magnetic layer 11 is set to the second input In2, and the potential V2 of the second magnetic layer 12 is set to the negative "_In2" of the second input In2. In this case, the potential V2 of the second magnetic layer 12 is the fourth potential E4. The first current ic1 supplied to the first conductive member 21 has the orientation from the second portion 21*b* to the first portion 21*a*. The second current ic2 supplied to the second conductive member 22 has the orientation from the fourth portion 22*d* to the fifth portion 22*e*.

Figure 4A:
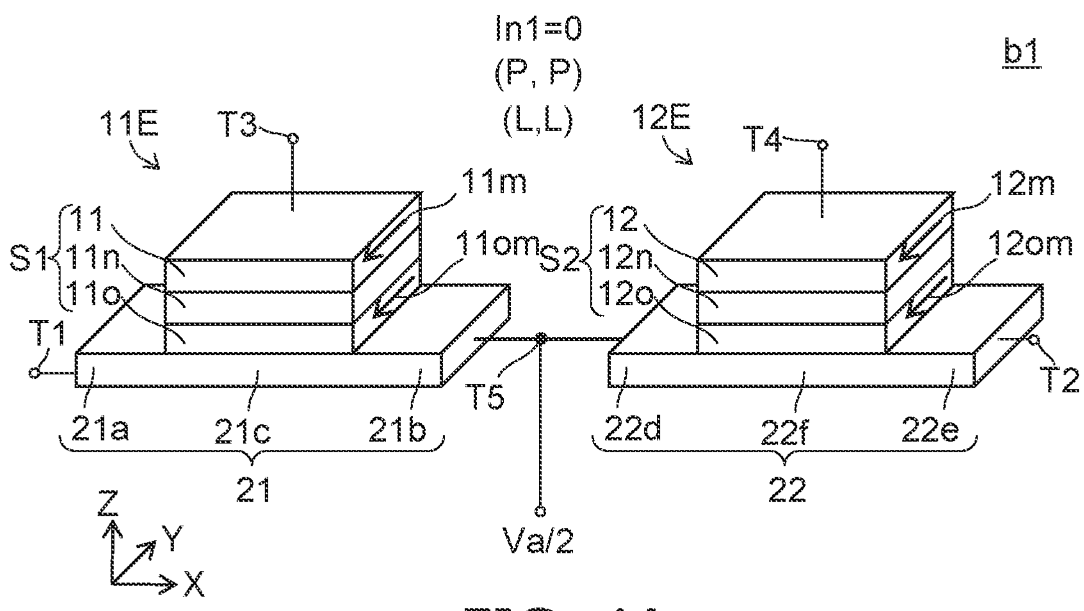
FIGS. 4A and 4B are schematic perspective views illustrating the operation of the arithmetic device according to the first embodiment.

In a state b1 illustrated in FIG. 4A, the first stacked body S1 and the second stacked body S2 are in the (P, P) state (for example, the (L, L) state). In this state, when the first potential difference Va is applied to the first magnetic layer 11 with reference to the second magnetic layer 12, the potential at the connection point (fifth terminal T5) is substantially ½ (ie, Va/2) of the first potential difference Va.

Figure 4B:
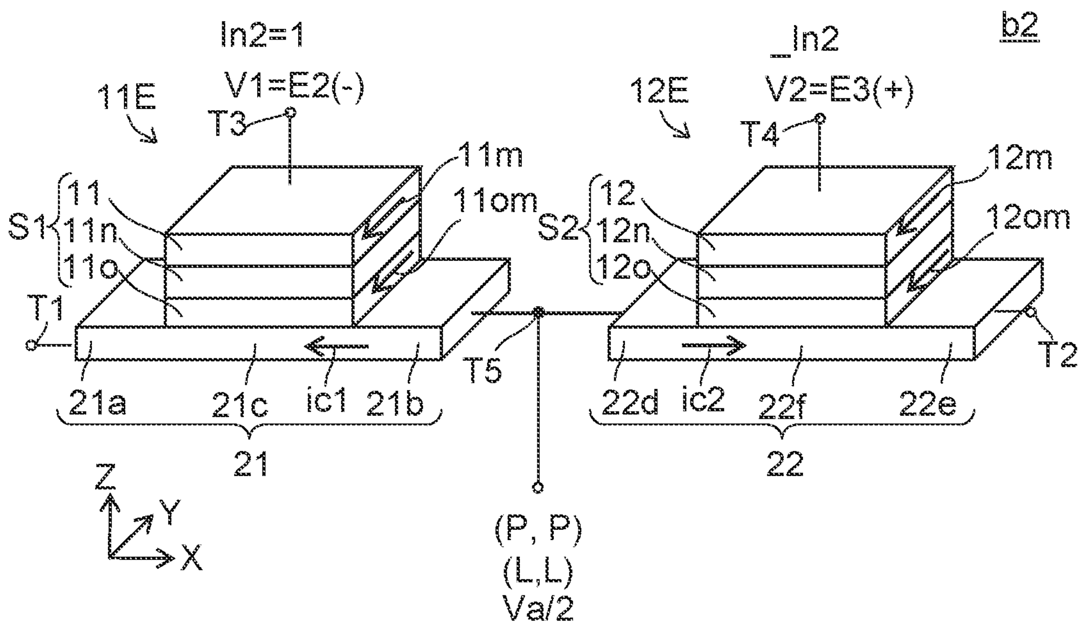

As shown in FIG. 4B (state b2), in the first supply operation, the second input In2 is "1", the potential V1 of the first magnetic layer 11 is the second potential E2, and the potential V2 of the second magnetic layer 12 is the third potential E3. The first current ic1 has the orientation from the second portion 21*b* to the first portion 21*a*. The second current ic2 has the orientation from the fourth portion 22*d* to the fifth portion 22*e*.

Figure 5A:
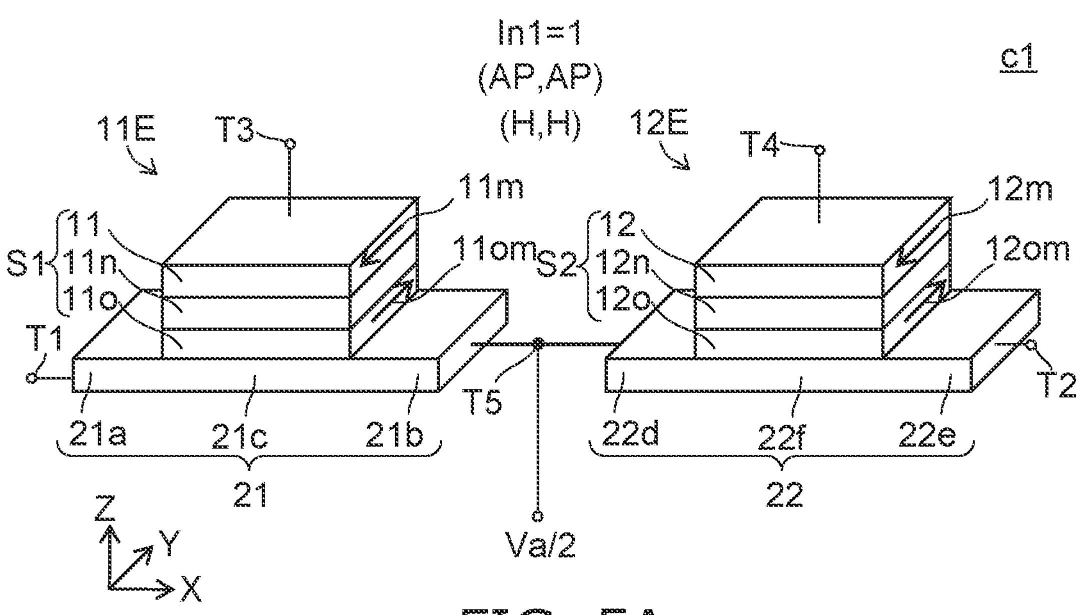
FIGS. 5A and 5B are schematic perspective views illustrating the operation of the arithmetic device according to the first embodiment.

In a state c1 illustrated in FIG. 5A, the first stacked body S1 and the second stacked body S2 are in the (AP, AP) state (for example, the (H, H) state). In this state, when the first potential difference Va is applied to the first magnetic layer 11 with reference to the second magnetic layer 12, the potential of the connection point (fifth terminal T5) is substantially ½ (ie, Va/2) of the first potential difference Va (5th terminal T5).

Figure 5B:
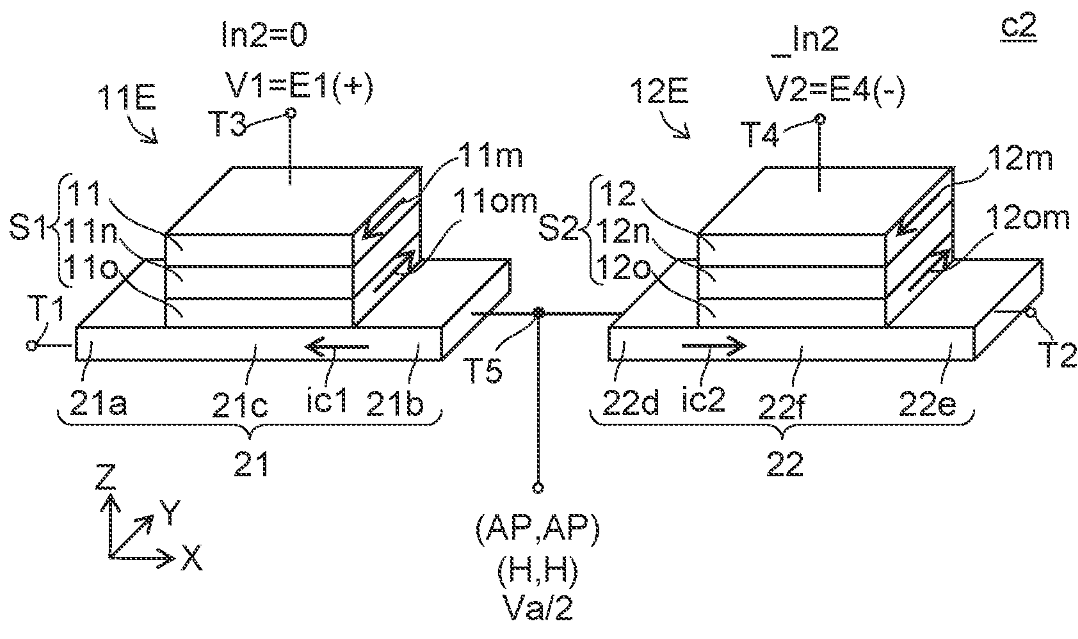

As shown in FIG. 5B (state c2), in the first supply operation, the second input In2 is "0", the potential V1 of the first magnetic layer 11 is the first potential E1, and the potential V2 of the second magnetic layer 12 is the fourth potential E4. The first current ic1 has the orientation from the second portion 21*b* to the first portion 21*a*. The second current ic2 has the orientation from the fourth portion 22*d* to the fifth portion 22*e*.

Figure 6A:
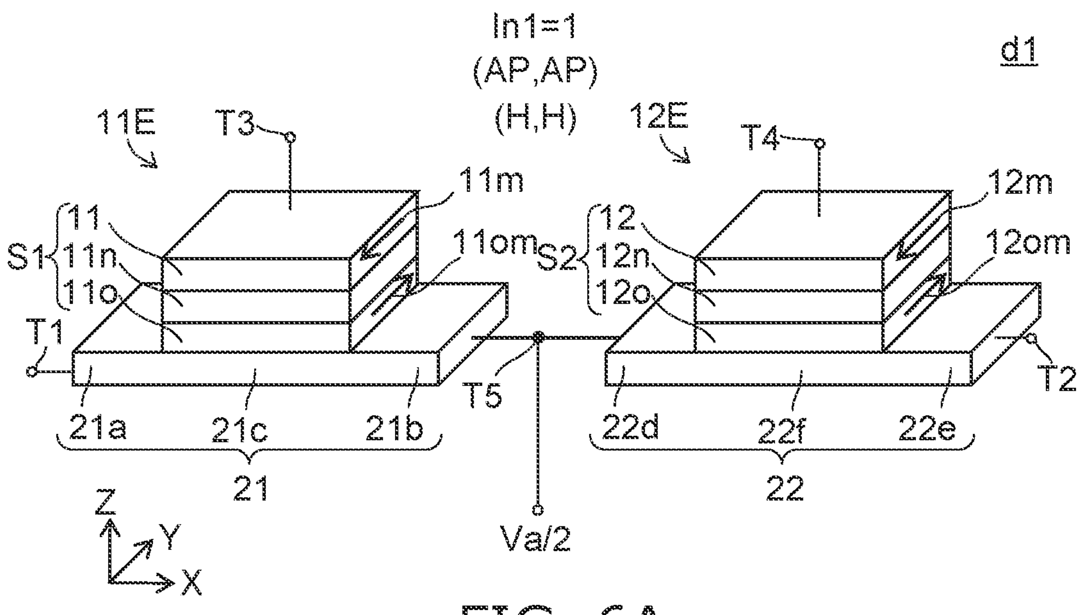
FIGS. 6A and 6B are schematic perspective views illustrating the operation of the arithmetic device according to the first embodiment.

In a state d1 exemplified in FIG. 6A, the first stacked body S1 and the second stacked body S2 are in the (AP, AP) state (for example, the (H, H state)). When the first potential difference Va is applied to the first magnetic layer 11 with reference to the second magnetic layer 12, the potential of the connection point (fifth terminal T5) is substantially ½ (ie, Va/2) of the first potential difference Va.

Figure 6B:
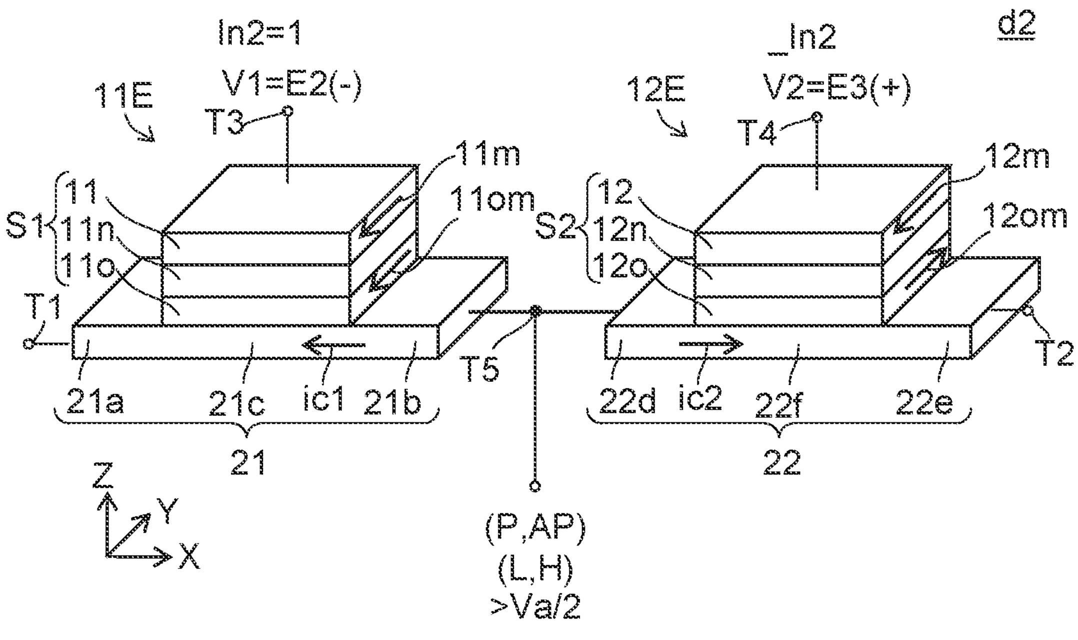

As shown in FIG. 6B (state d2), in the first supply operation, the second input In2 is "1", the potential V1 of the first magnetic layer 11 is the second potential E2, and the potential V2 of the second magnetic layer 12 is the third potential E3. The first current ic1 has the orientation from the second portion 21*b* to the first portion 21*a*. The second current ic2 has the orientation from the fourth portion 22*d* to the fifth portion 22*e*.

Figure 7A:
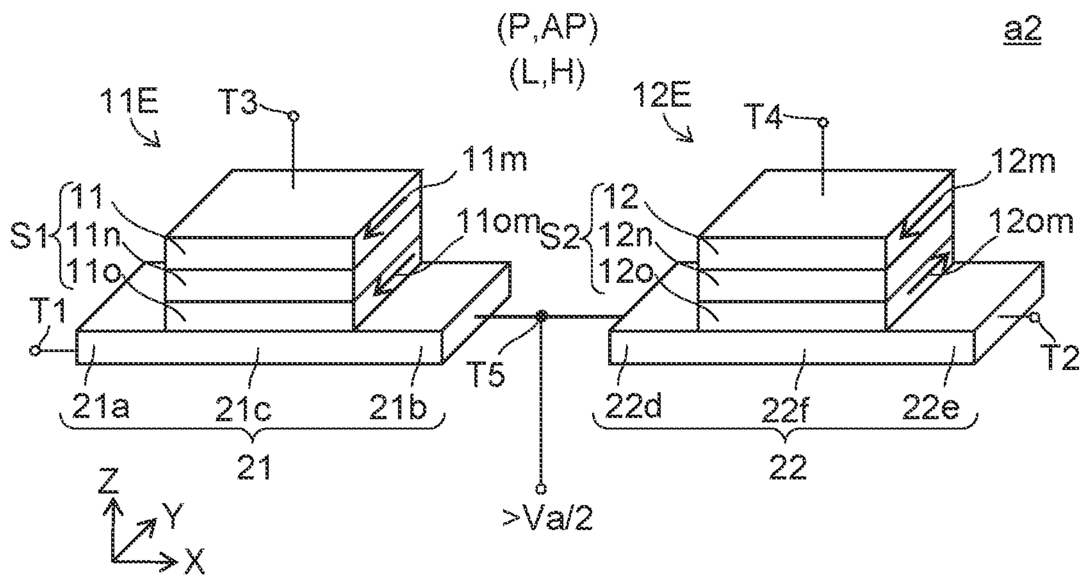
FIGS. 7A and 7B are schematic perspective views illustrating the operation of the arithmetic device according to the first embodiment.

As shown in FIG. 7A, the measurement operation is performed in the state a2. In the state a2, when the first potential difference Va is applied to the first magnetic layer 11 with reference to the second magnetic layer 12, the potential at the connection point (fifth terminal T5) is higher than Va/2 (>Va/2). In the state a2, the result obtained by the measurement operation is that the first electrical resistance is in the first low resistance state and the second electrical resistance is in the second high resistance state ((L, H) state).

Figure 7B:
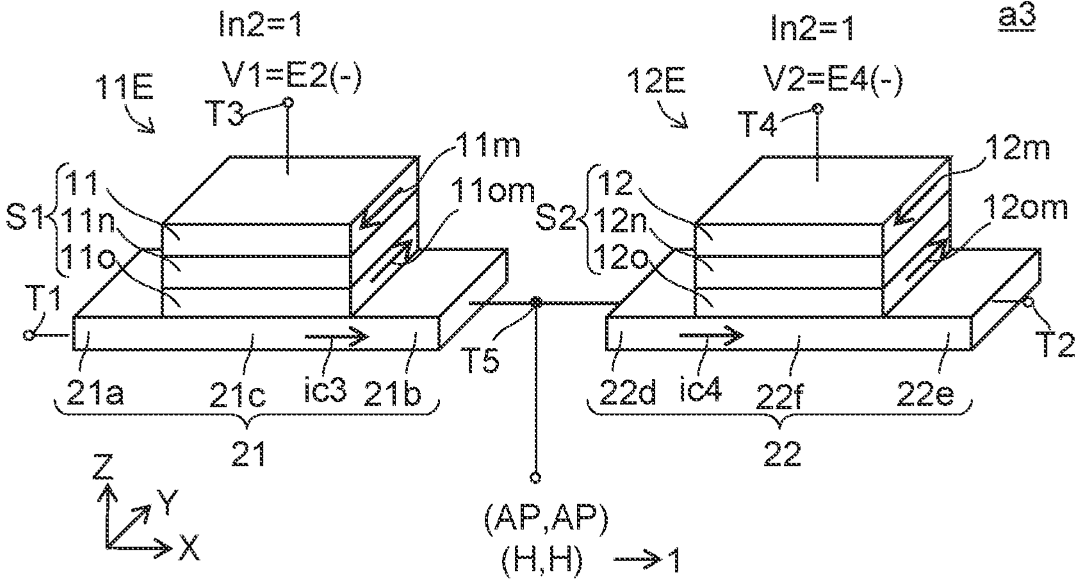

As in a state a3 exemplified in FIG. 7B, the second supply operation is performed. The second supply operation is performed based on the measurement result of the potential at the connection point (fifth terminal T5). In the case of the state a2, the result obtained by the measurement operation is in the (L, H) state. The third current ic3 has the orientation from the first portion 21*a* to the second portion 21*b*, and the fourth current ic4 has the orientation from the fourth portion 22*d* to the fifth portion 22*e*. In the second supply operation, the first magnetic layer 11 is at the second potential E2, and the second magnetic layer 12 is at the fourth potential E4.

Figure 8A:
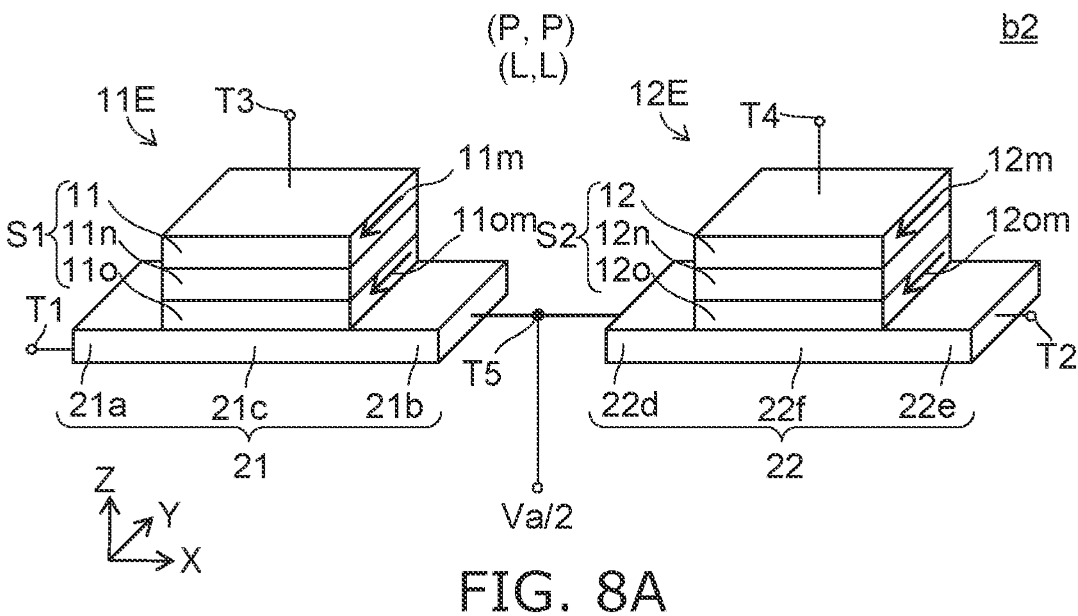
FIGS. 8A and 8B are schematic perspective views illustrating the operation of the arithmetic device according to the first embodiment.

As shown in FIG. 8A, the measurement operation is performed in the state b2. In the state b2, when the first potential difference Va is applied to the first magnetic layer 11 with reference to the second magnetic layer 12, the potential at the connection point (fifth terminal T5) corresponds to Va/2. In the state b2, the result obtained by the measurement operation is that the first electrical resistance is in the first low resistance state and the second electrical resistance is in the second low resistance state ((L, L) state).

Figure 8B:
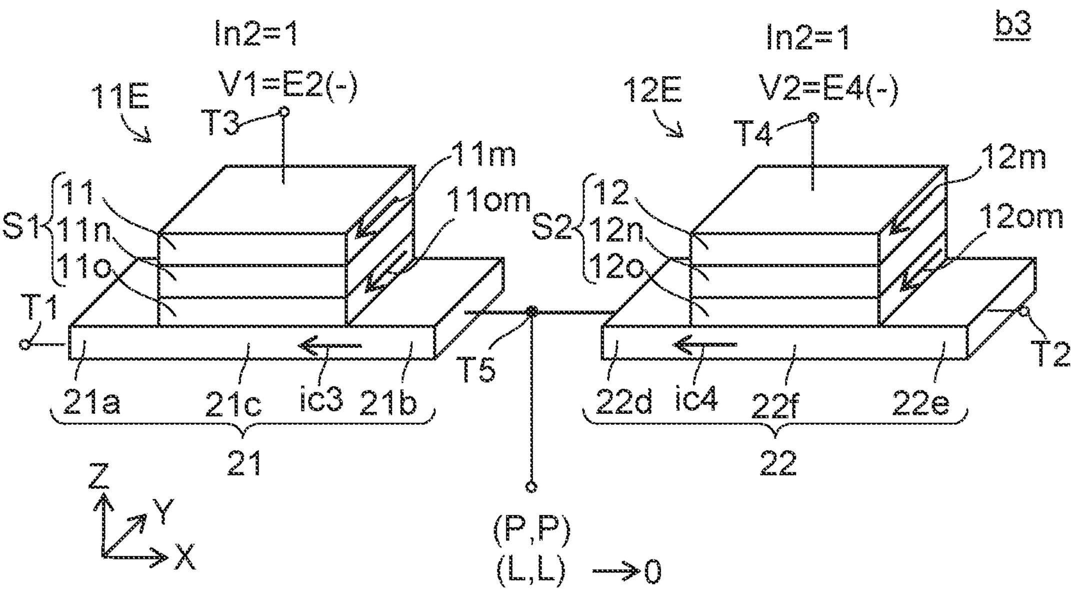

The second supply operation is performed as in the state b3 illustrated in FIG. 8B. The second supply operation is performed based on the measurement result of the potential at the connection point (fifth terminal T5). In the case of the state b2, the result obtained by the measurement operation is in the (L, L) state. The third current ic3 has the orientation from the second portion 21*b* to the first portion 21*a*. The fourth current ic4 has the orientation from the fifth portion 22*e* to the fourth portion 22*d*. In the second supply operation, the first magnetic layer 11 is at the second potential E2, and the second magnetic layer 12 is at the fourth potential E4.

Figure 9A:
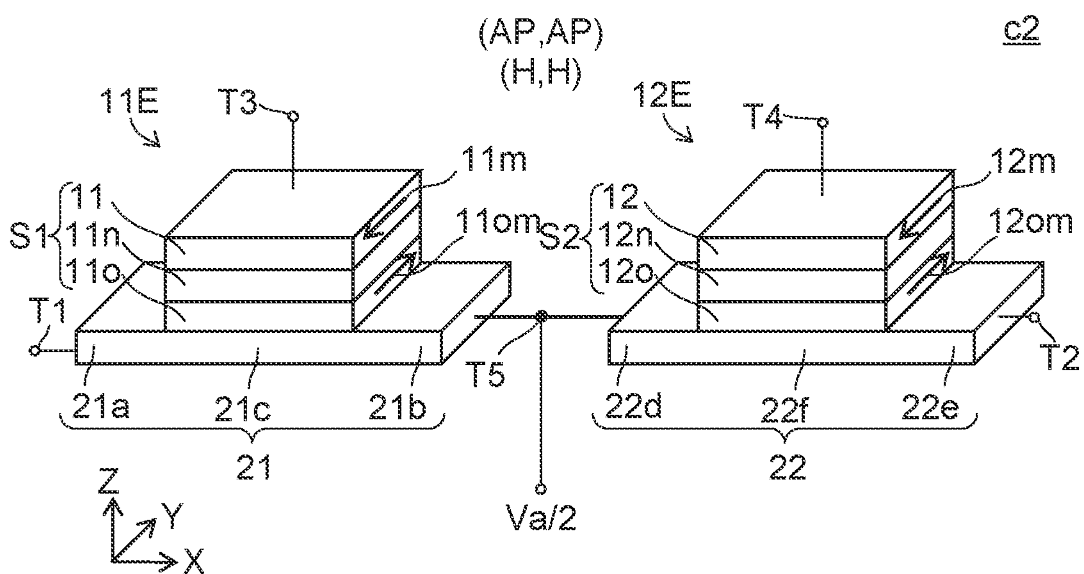
FIGS. 9A and 9B are schematic perspective views illustrating the operation of the arithmetic device according to the first embodiment.

As shown in FIG. 9A, the measurement operation is performed in the state c2. When the first potential difference Va is applied to the first magnetic layer 11 with reference to the second magnetic layer 12, the potential at the connection point (fifth terminal T5) corresponds to Va/2. In the state c2, the result obtained by the measurement operation is that the first electrical resistance is the first high resistance state and the second electrical resistance is in the second high resistance state ((H, H) state).

Figure 9B:
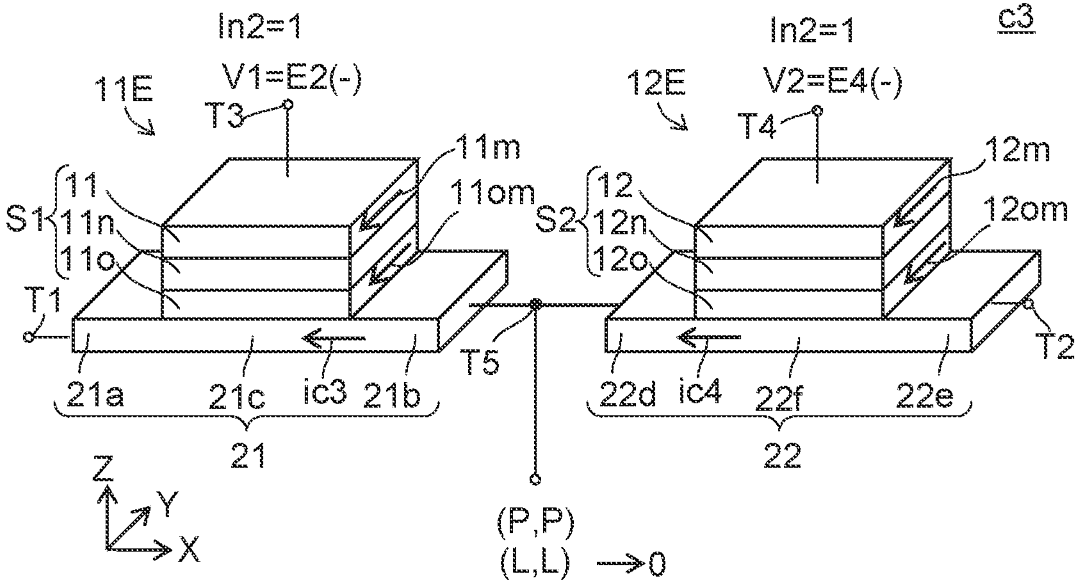

The second supply operation is performed as in the state c3 illustrated in FIG. 9B. The second supply operation is performed based on the measurement result of the potential at the connection point (fifth terminal T5). In the case of the state c2, the result obtained by the measurement operation is in the (H, H) state. The third current ic3 has the orientation from the second portion 21*b* to the first portion 21*a*. The fourth current ic4 has the orientation from the fifth portion 22*e* to the fourth portion 22*d*. In the second supply operation, the first magnetic layer 11 is at the second potential E2, and the second magnetic layer 12 is at the fourth potential E4.

Figure 10A:
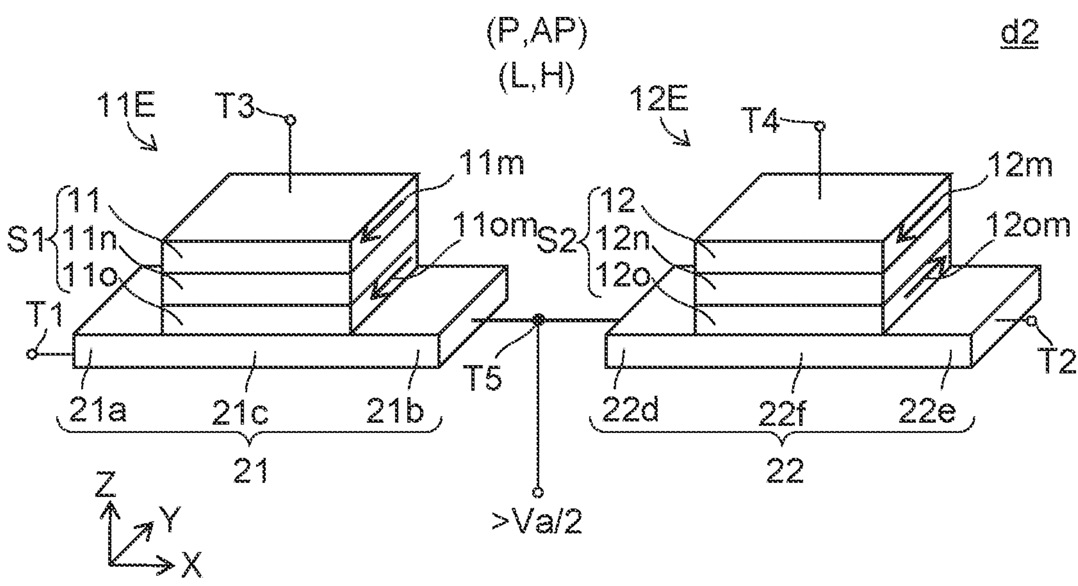
FIGS. 10A and 10B are schematic perspective views illustrating the operation of the arithmetic device according to the first embodiment.

The state d2 shown in FIG. 10A is the same as the state a2 as shown in FIG. 7A. In the state d2, the potential at the connection point (fifth terminal T5) is higher than Va/2 (>Va/2). In the state a2, it is in the (L, H) state.

Figure 10B:
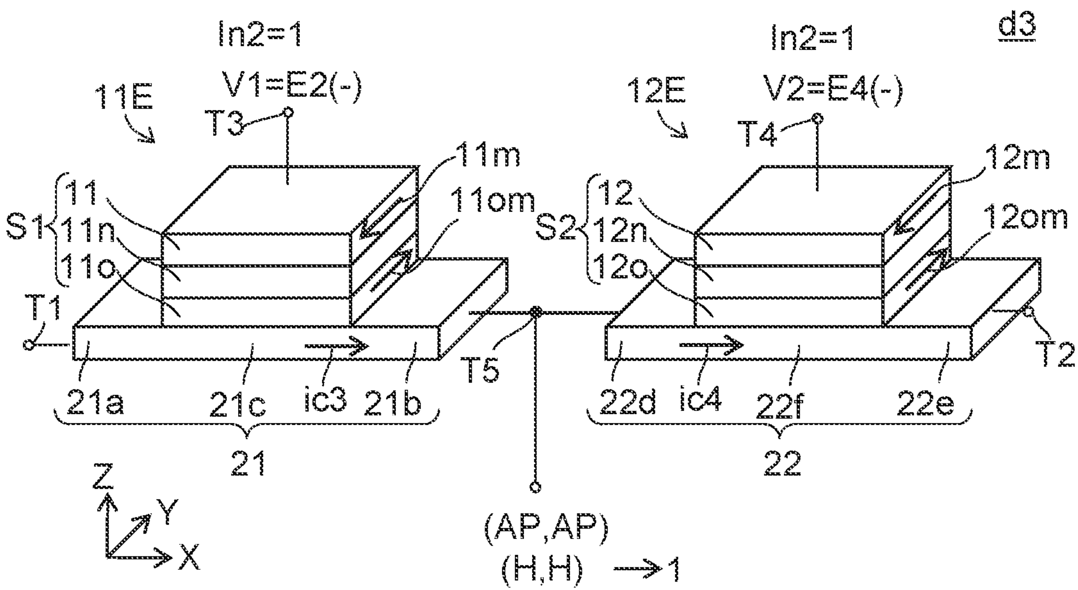

In a state d3 shown in FIG. 10B, the same second supply operation as in the state a3 shown in FIG. 7B is performed. The third current ic3 has the orientation from the first portion 21*a* to the second portion 21*b*, and the fourth current ic4 has the orientation from the fourth portion 22*d* to the fifth portion 22*e*. In the second supply operation, the first magnetic layer 11 is at the second potential E2, and the second magnetic layer 12 is at the fourth potential E4.

As illustrated in FIGS. 8A and 9A above, in the measurement operation, when the first potential difference Va is applied to the first magnetic layer 11 with reference to the second magnetic layer 12, the potential at the connection point (fifth terminal T5) of the second portion 21*b* and the fourth portion 22*d* may correspond to substantially ½ (Va/2) of the first potential difference Va. In this case, as illustrated in FIGS. 8B and 9B, the third current ic3 has the orientation from the second portion 21*b* to the first portion 21*a*, and the fourth current ic4 has the orientation from the fifth portion 22*e* to the fourth portion 22*d*. In the second supply operation, the first magnetic layer 11 is at the second potential E2, and the second magnetic layer 12 is at the fourth potential E4.

As illustrated in FIGS. 7A and 10A above, in the measurement operation, when the first potential difference Va is applied to the first magnetic layer 11 with reference to the second magnetic layer 12, the potential at the connection point (fifth terminal T5) of the second portion 21*b* and the fourth portion 22*d* may be higher than substantially ½ of the first potential difference Va (>Va/2). In this case, as shown in FIGS. 7B and 10B, the third current ic3 has the orientation from the first portion 21*a* to the second portion 21*b*, and the fourth current ic4 has the orientation from fourth portion 22*d* to the fifth portion 22*e*. In the second supply operation, the first magnetic layer 11 is at the second potential E2, and the second magnetic layer 12 is at the fourth potential E4.

As described above, the first potential E1 and the third potential E3 correspond to the "Deactive" potential. The second potential E2 and the fourth potential E4 correspond to the "Active" potential.

When the potential V1 of the first magnetic layer 11 is at the second potential E2, the state of the first electrical resistance of the first stacked body S1 can be changed according to the orientation of the current flowing through the first conductive member 21. When the potential V1 of the first magnetic layer 11 is at the first potential E1, the state of the first electrical resistance maintains the state before the current flows through the first conductive member 21.

When the potential V2 of the second magnetic layer 12 is at the fourth potential E4, the state of the second electrical resistance of the second stacked body S2 can be changed according to the orientation of the current flowing through the second conductive member 22. When the potential V2 of the second magnetic layer 12 is at the third potential E3, the state of the second electrical resistance maintains the state before the current flows through the second conductive member 22.

In the arithmetic device 110, when the first magnetic layer 11 is at the second potential E2 and a current in the orientation from the second portion 21*b* to the first portion 21*a* flows through the first conductive member 21, the first electrical resistance becomes the first low resistance state. When the first magnetic layer 11 is at the second potential E2 and a current in the orientation from the first portion 21*a* to the second portion 21*b* flows through the first conductive member 21, the first electrical resistance becomes the first high resistance state.

In the arithmetic device 110, when the second magnetic layer 12 is at the fourth potential E4 and a current in the orientation from the fourth portion 22*d* to the fifth portion 22*e* flows through the second conductive member 22, the second electrical resistance becomes the second high resistance state. When the second magnetic layer 12 is at the fourth potential E4 and a current in the orientation from the fifth portion 22*e* to the fourth portion 22*d* flows through the second conductive member 22, the second electrical resistance becomes the second low resistance state.

As shown in FIG. 1, the magnetization 11*m* of the first magnetic layer 11 has a component of a current magnetic field in the orientation at the position of the first magnetic layer 11. The current magnetic field is based on the current having the orientation from the first portion 21*a* to the second portion 21*b*. The magnetization 12*m* of the second magnetic layer 12 has a component of a current magnetic field in the orientation at the position of the second magnetic layer 12. The current magnetic field is based on the current having the orientation from the fourth portion 22*d* to the fifth portion 22*e*. The orientation of the above magnetization may be changed, for example, depending on the polarity of the spin Hall effect of the conductive member.

As shown in FIGS. 7B and 10B, the (H, H) state corresponds to "1". As shown in FIGS. 8B and 9B, the (L, L) state corresponds to "0".

FIGS. 11 and 12 are schematic views illustrating the operation of the arithmetic device according to the first embodiment.

As shown in FIG. 11, in the state corresponding to the result Rs1 of the first supply operation (state a2, state b2, state c2 and state d2), the (P, AP) state, the (P, P) state, the (AP, AP) state and the (P, AP) state are obtained corresponding to the first input In1 and the second input In2.

As shown in FIG. 12, in the states (states a3, state b3, state c3 and state d3) corresponding to a result Rs2 of the second supply operation, the (AP, AP) state, the (P, P) state, (P, P) state and the (AP, AP) state are obtained. The result Rs2 of the second supply operation corresponds to the XNOR operation result of the first input In1 and the second input In2. In this way, the arithmetic device 110 can derive the XNOR operation result of the first input In1 and the second input In2.

Figure 13A:
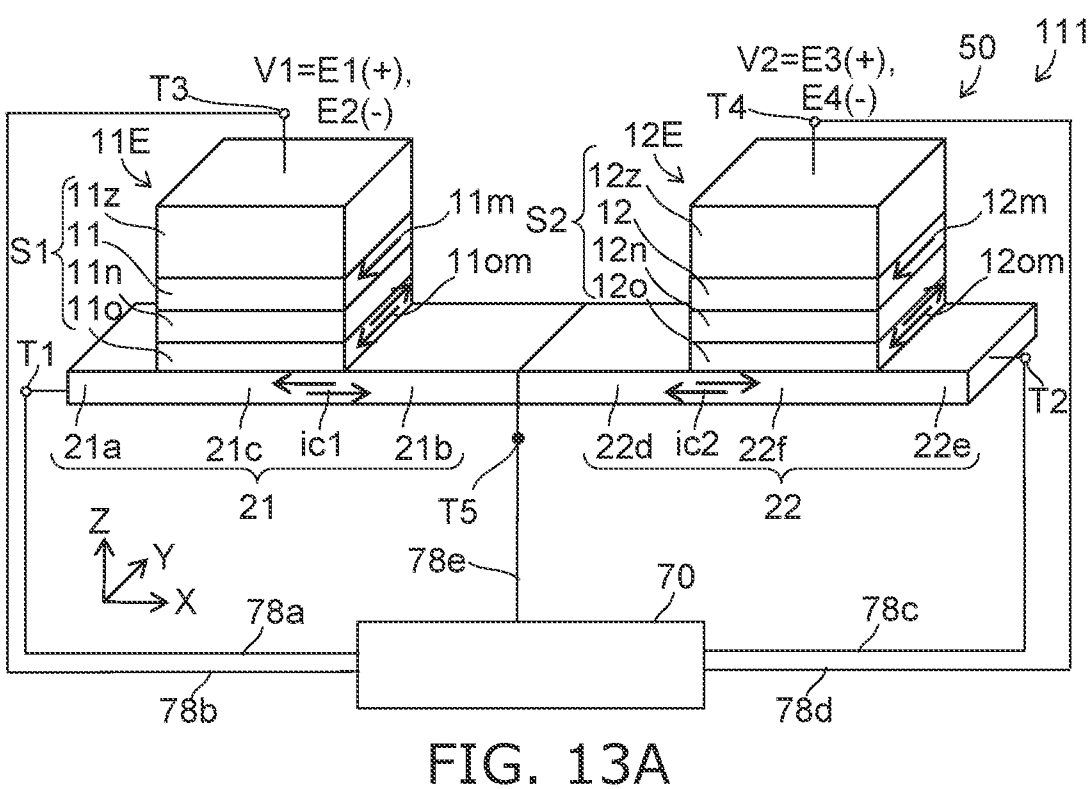
FIGS. 13A and 13B are schematic perspective views illustrating arithmetic devices according to the first embodiment.
Figure 13B:
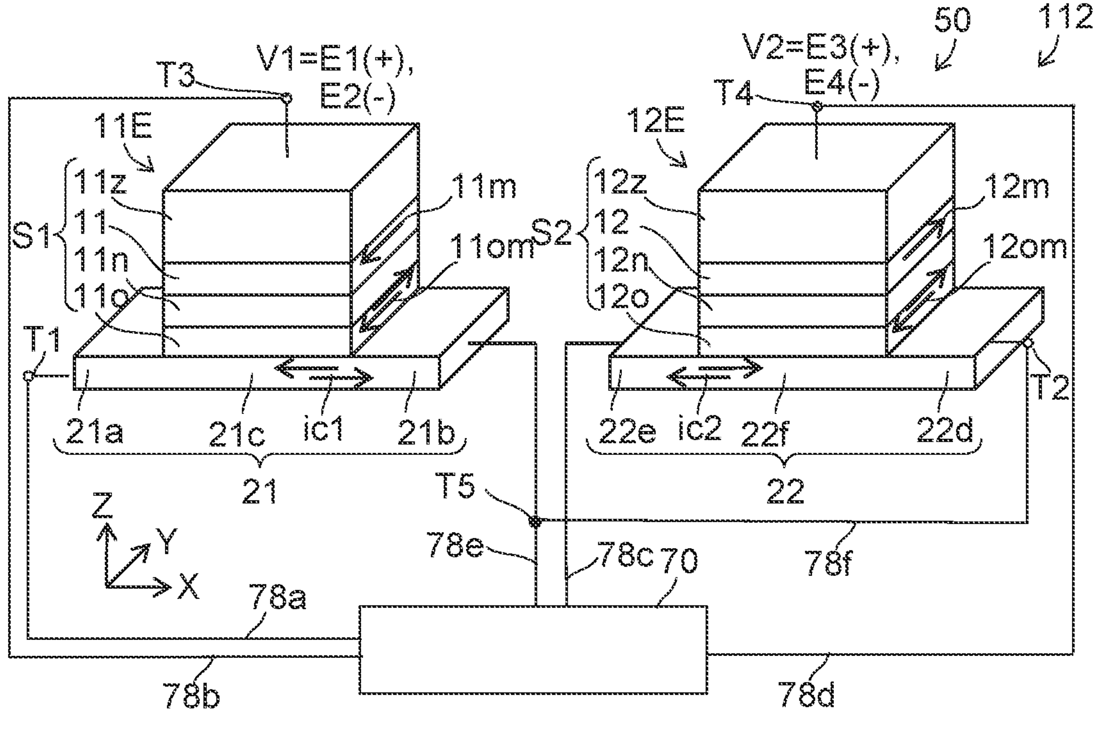

FIGS. 13A and 13B are schematic perspective views illustrating arithmetic devices according to the first embodiment.

As shown in FIG. 13A, in the arithmetic device 111 according to the embodiment, the fourth portion 22*d* is continuous with the second portion 21*b*. The orientation from the fourth portion 22*d* to the fifth portion 22*e* has a component in the orientation from the first portion 21*a* to the second portion 21*b*.

As shown in FIG. 13B, in an arithmetic device 112 according to the embodiment, the second portion 21*b* and the fourth portion 22*d* are electrically connected by the conductive part 78*f*. The orientation from the fourth portion 22*d* to the fifth portion 22*e* has a component in the orientation from the second portion 21*b* to the first portion 21*a*. As described above, the arithmetic device according to the embodiment may further include a conductive part 78*f* that electrically connects the second portion 21*b* and the fourth portion 22*d*.

Second Embodiment

Figure 14:
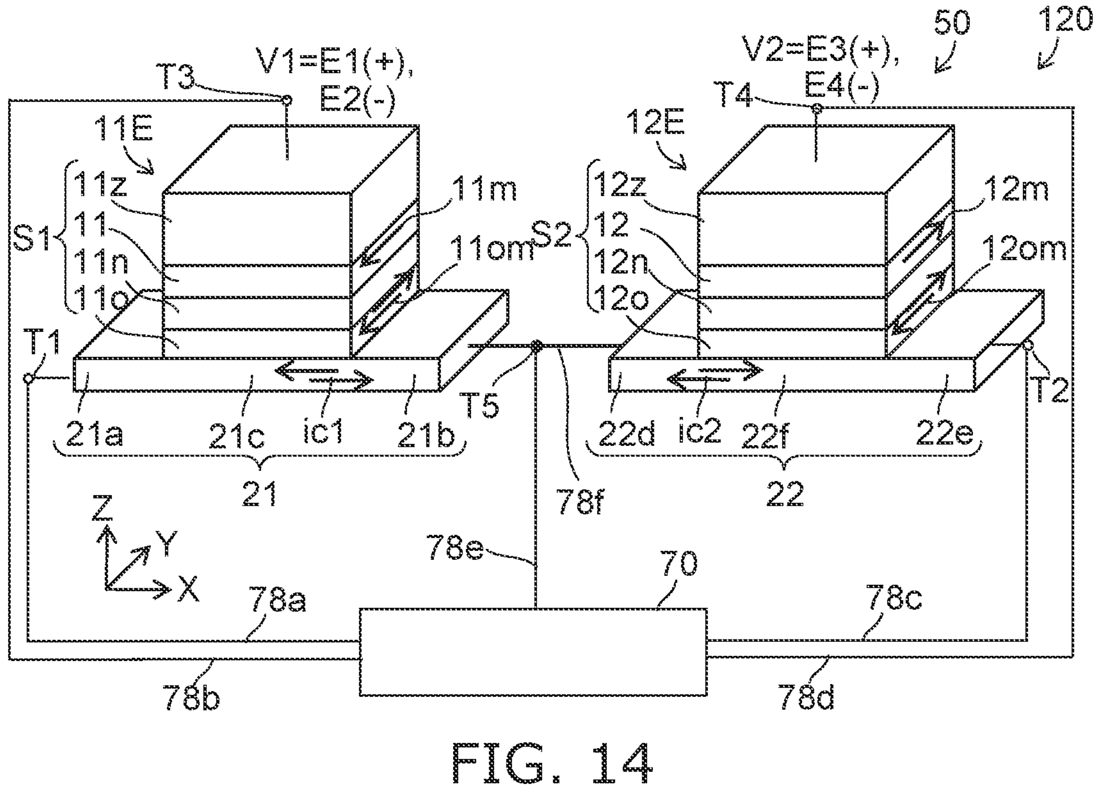
FIG. 14 is a schematic perspective view illustrating an arithmetic device according to a second embodiment.

FIG. 14 is a schematic perspective view illustrating an arithmetic device according to a second embodiment.

As shown in FIG. 14, an arithmetic device 120 according to the embodiment also includes the first element 11E, the second element 12E, and the controller 70. In the arithmetic device 120, the orientation of the magnetization 12*m* of the second magnetic layer 12 is opposite to the orientation of the magnetization 11*m* of the first magnetic layer 11. In the following, with respect to the example of the arithmetic device 120, the description of the same portion as that of the arithmetic device 110 will be omitted.

In the arithmetic device 120, when the first electrical resistance of the first stacked body S1 is in the low resistance state (first low resistance state), and the second electrical resistance of the second stacked body S2 is in the high resistance state (second high resistance state), the first input In1 is "0". In this case, the arithmetic element part 50 is, for example, in the (L, H) state, for example, in the (P, AP) state.

When the first electrical resistance is in the high resistance state (first high resistance state) and the second electrical resistance is in the low resistance state (second low resistance state), the first input In1 is "1". The first high resistance state is higher than the first low resistance state. The second low resistance state is lower than the second high resistance state. In this case, the arithmetic element part 50 is in the (H, L) state, for example, the (AP, P) state.

FIGS. 15A, 15B, 16A, 16B, 17A, 17B, 18A, 18B, 19A, 19B, 20A, 20B, 21A, 21B, 22A, and 22B are schematic perspective views illustrating the operation of the arithmetic device according to the embodiment.

In these figures, the magnetic layer 11*z* and the magnetic layer 12*z* are omitted.

Figure 15A:
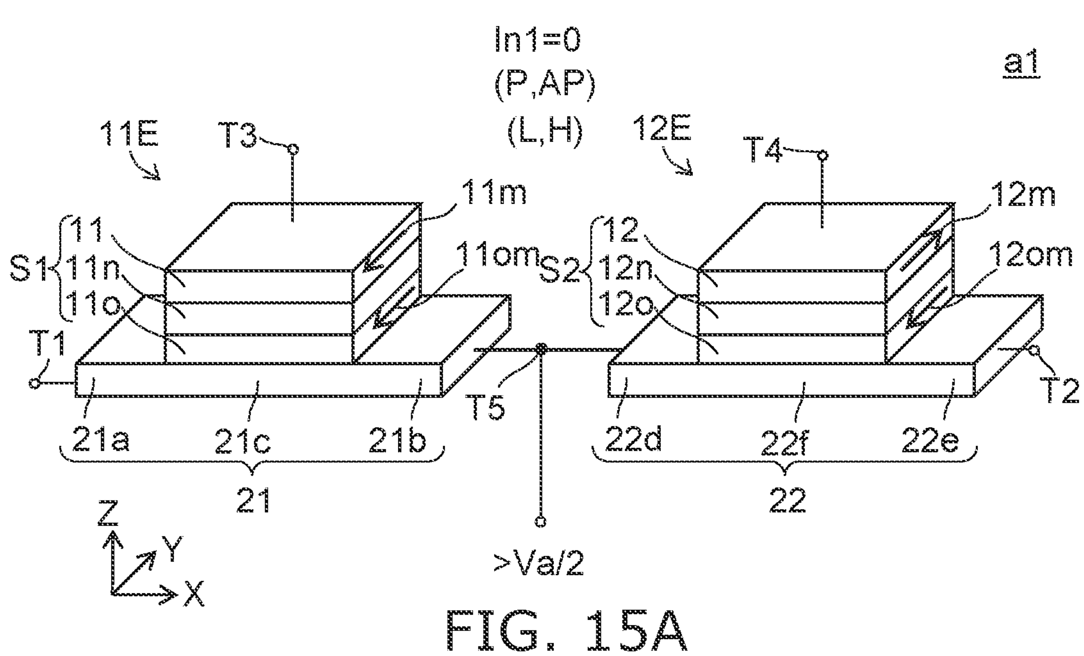
FIGS. 15A and 15B are schematic perspective views illustrating the operation of the arithmetic device according to the second embodiment.
Figure 16A:
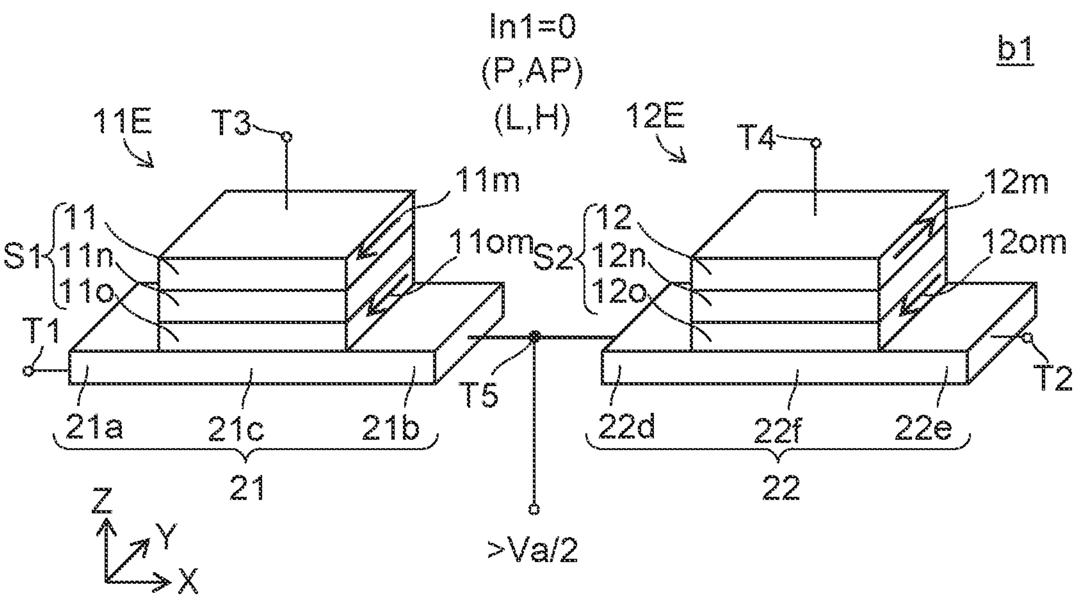
FIGS. 16A and 16B are schematic perspective views illustrating the operation of the arithmetic device according to the second embodiment.

In the states a1 and b1 illustrated in FIGS. 15A and 16A, the first stacked body S1 and the second stacked body S2 are in the (P, AP) state (for example, the (L, H) state). In this state, when the first potential difference Va is applied to the first magnetic layer 11 with reference to the second magnetic layer 12, the potential of the connection point (fifth terminal T5) is higher than Va/2.

Figure 15B:
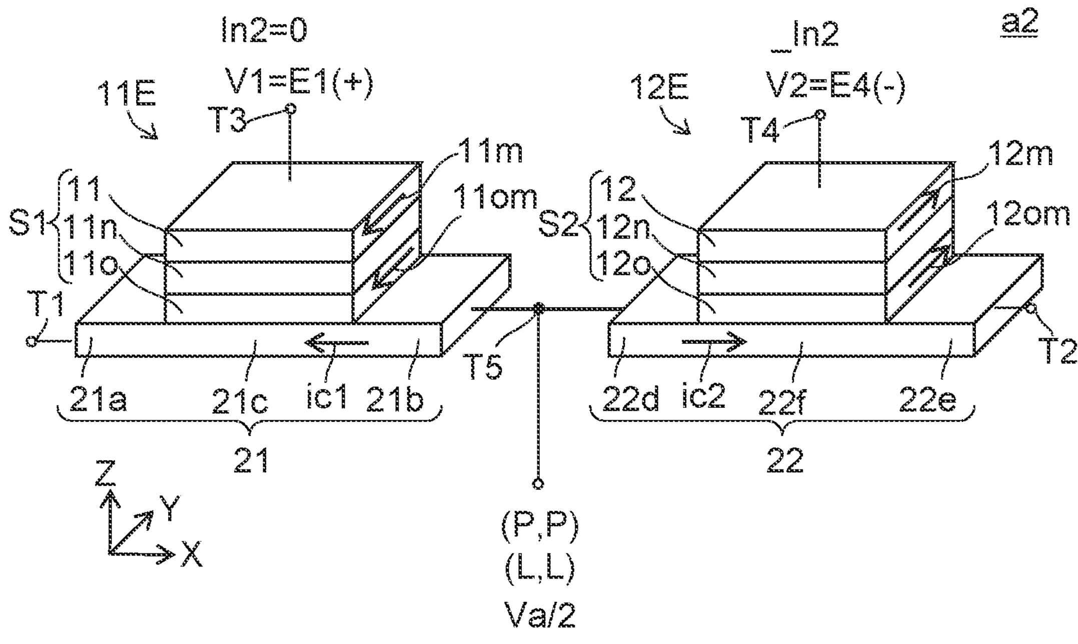

As shown in FIG. 15B (state a2), in the first supply operation, the second input In2 is "0", and the potential V1 of the first magnetic layer 11 is the first potential E1. In this case, the potential V2 of the second magnetic layer 12 is the fourth potential E4 (negative "_In2"). The first current ic1 supplied to the first conductive member 21 has the orientation from the second portion 21*b* to the first portion 21*a*. The second current ic2 supplied to the second conductive member 22 has the orientation from the fourth portion 22*d* to the fifth portion 22*e*.

Figure 16B:
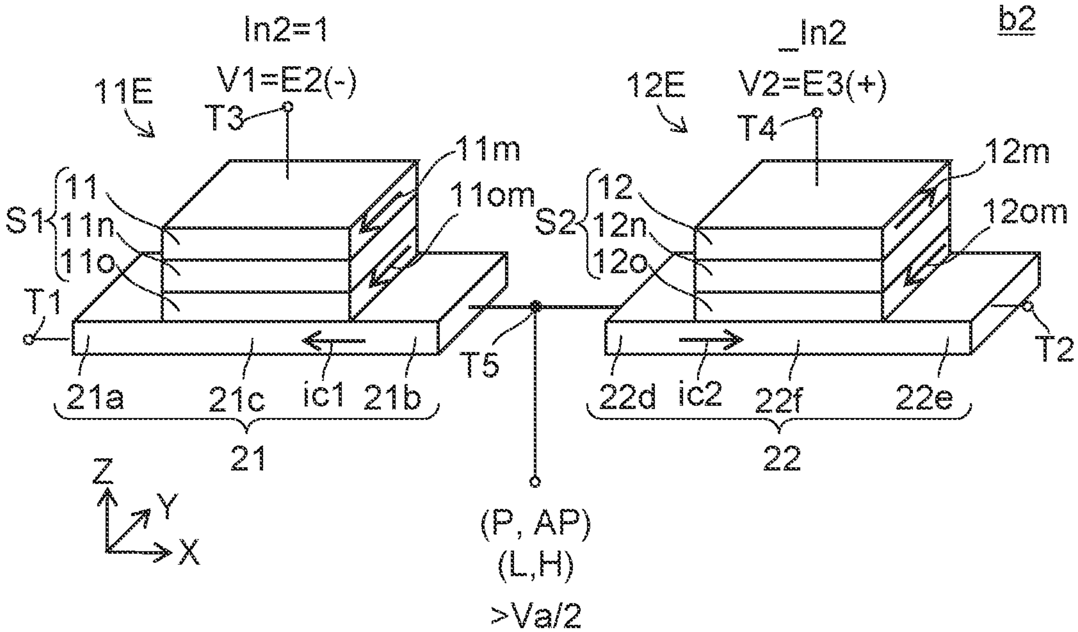

As shown in FIG. 16B (state b2), in the first supply operation, the second input In2 is "1", and the potential V1 of the first magnetic layer 11 is the second potential E2. In this case, the potential V2 of the second magnetic layer 12 is the third potential E3. The first current ic1 has the orientation from the second portion 21*b* to the first portion 21*a*. The second current ic2 has the orientation from the fourth portion 22*d* to the fifth portion 22*e*.

Figure 17A:
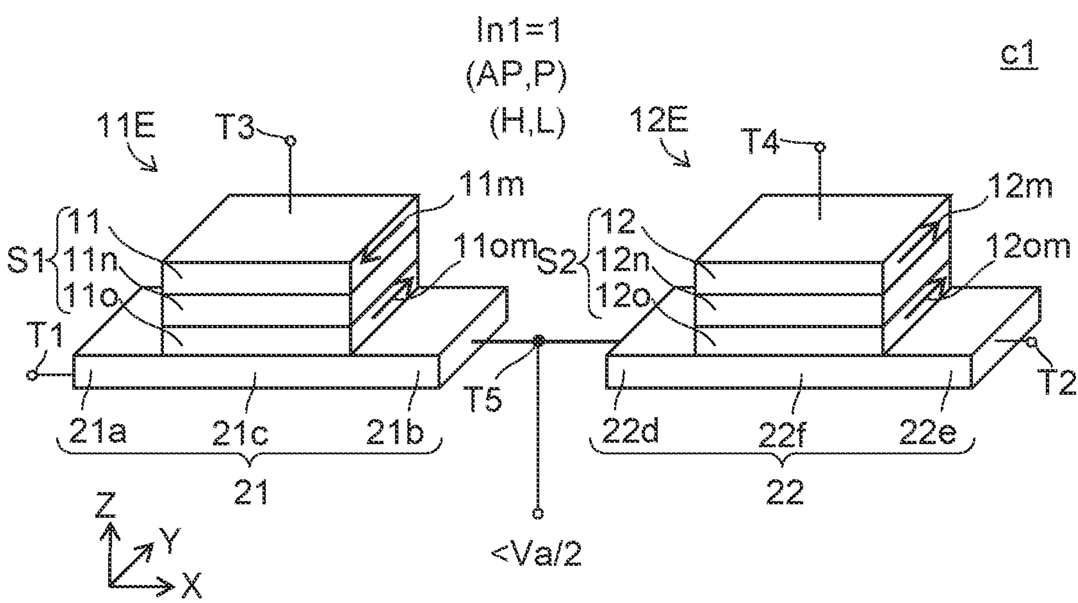
FIGS. 17A and 17B are schematic perspective views illustrating the operation of the arithmetic device according to the second embodiment.
Figure 18A:
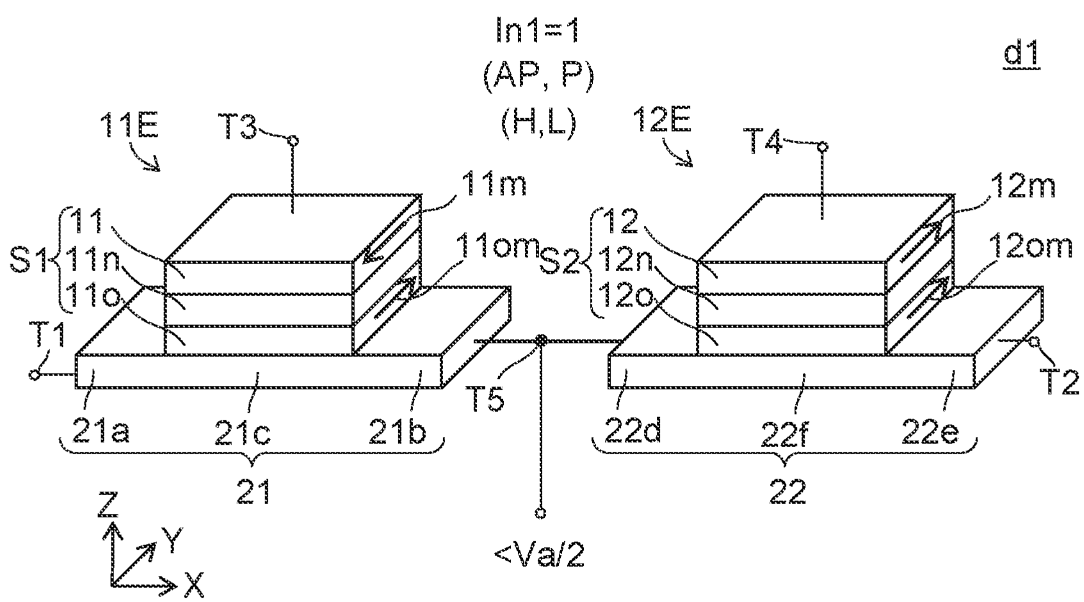
FIGS. 18A and 18B are schematic perspective views illustrating the operation of the arithmetic device according to the second embodiment.

In the states c1 and d1 illustrated in FIGS. 17A and 18A, the first stacked body S1 and the second stacked body S2 are in the (AP, P) state (for example, the (H, L) state). In this state, when the first potential difference Va is applied to the first magnetic layer 11 with reference to the second magnetic layer 12, the potential of the connection point (fifth terminal T5) is lower than Va/2.

Figure 17B:
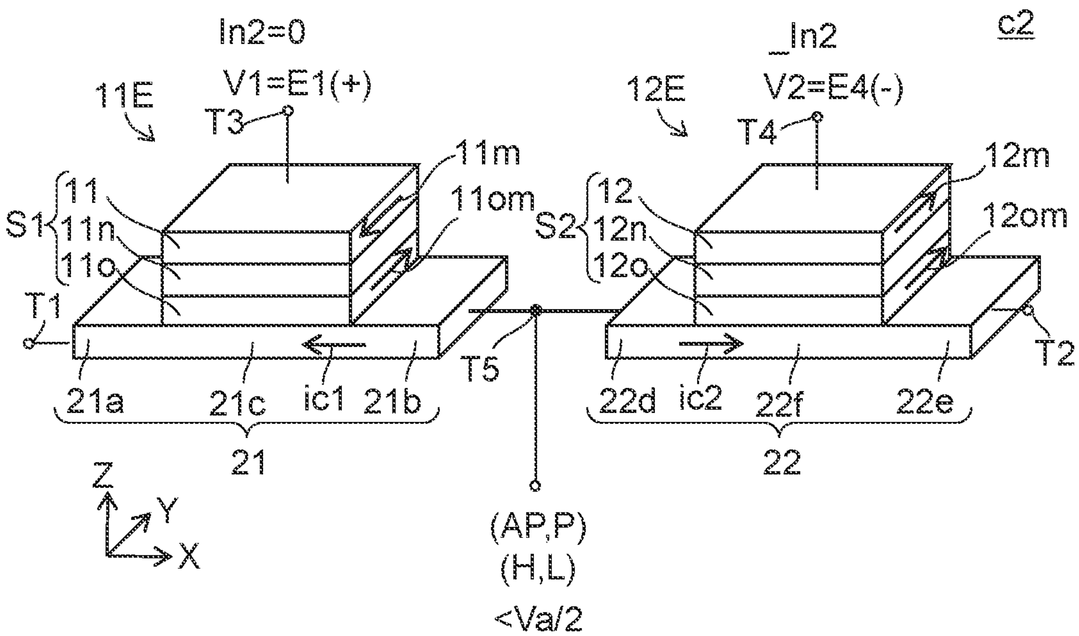

As shown in FIG. 17B (state c2), in the first supply operation, the second input In2 is "0", and the potential V1 of the first magnetic layer 11 is the first potential E1. In this case, the potential V2 of the second magnetic layer 12 is the fourth potential E4. The first current ic1 has the orientation from the second portion 21*b* to the first portion 21*a*. The second current ic2 has the orientation from the fourth portion 22*d* to the fifth portion 22*e*.

Figure 18B:
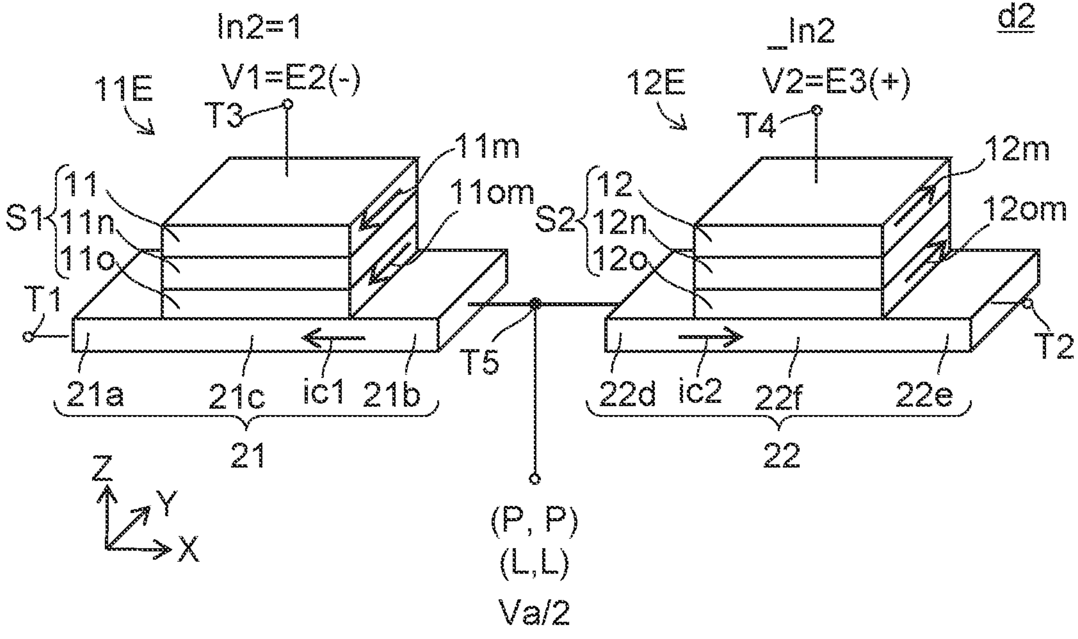

As shown in FIG. 18B (state d2), in the first supply operation, the second input In2 is "1", and the potential V1 of the first magnetic layer 11 is the second potential E2. In this case, the potential V2 of the second magnetic layer 12 is the third potential E3. The first current ic1 has the orientation from the second portion 21*b* to the first portion 21*a*. The second current ic2 has the orientation from the fourth portion 22*d* to the fifth portion 22*e*.

Figures 19A, 19B:
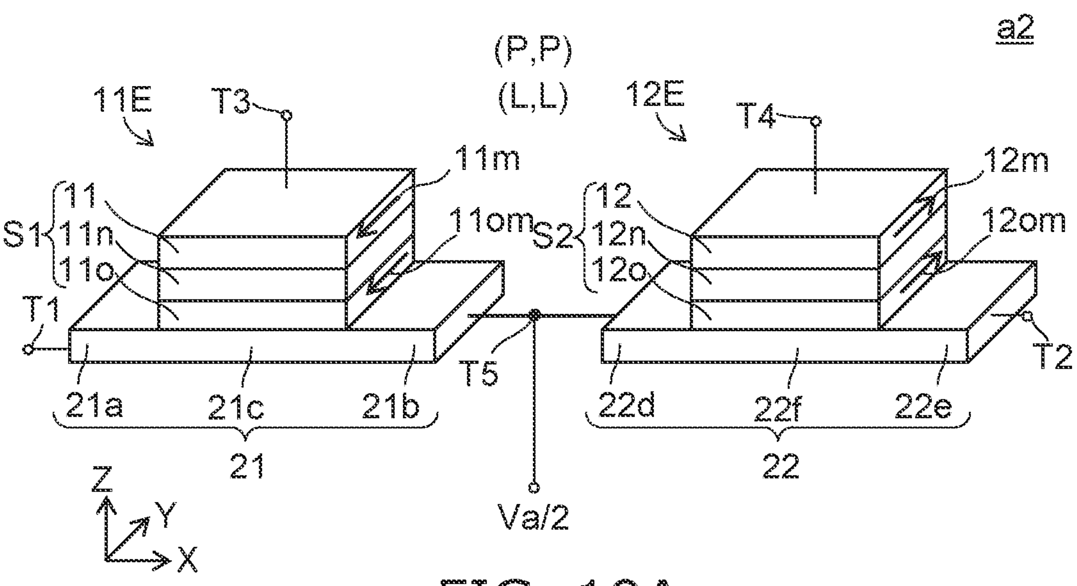
FIGS. 19A and 19B are schematic perspective views illustrating the operation of the arithmetic device according to the second embodiment.

As shown in FIG. 19A, the measurement operation is performed in the state a2. In the state a2, when the first potential difference Va is applied to the first magnetic layer 11 with reference to the second magnetic layer 12, the potential at the connection point (fifth terminal T5) is substantially Va/2 (>Va/2). In the state a2, in the result obtained by the measurement operation, the first electrical resistance is in the first low resistance state and the second electrical resistance is in the second low resistance state ((L, L) state).

As in the state a3 illustrated in FIG. 19B, the second supply operation is performed. The second supply operation is performed based on the measurement result of the potential at the connection point (fifth terminal T5). In the case of the state a2, the result obtained by the measurement operation is in the (H, L) state. The third current ic3 has the orientation from the second portion 21*b* to the first portion 21*a*, and the fourth current ic4 has the orientation from the fourth portion 22*d* to the fifth portion 22*e*. In the second supply operation, the first magnetic layer 11 is at the second potential E2, and the second magnetic layer 12 is at the fourth potential E4.

Figure 20A:
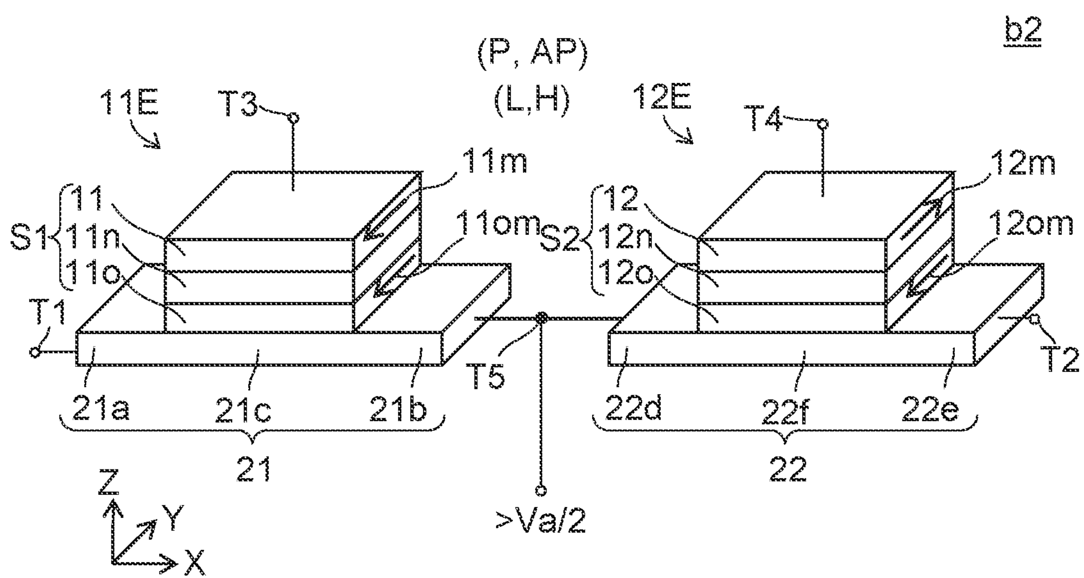
FIGS. 20A and 20B are schematic perspective views illustrating the operation of the arithmetic device according to the second embodiment.

As shown in FIG. 20A, the measurement operation is performed in the state b2. In the state b2, when the first potential difference Va is applied to the first magnetic layer 11 with reference to the second magnetic layer 12, the potential at the connection point (fifth terminal T5) is higher than Va/2. In the state b2, in the result obtained by the measurement operation, the first electrical resistance is in the first low resistance state and the second electrical resistance is in the second high resistance state ((L, H) state).

Figure 20B:
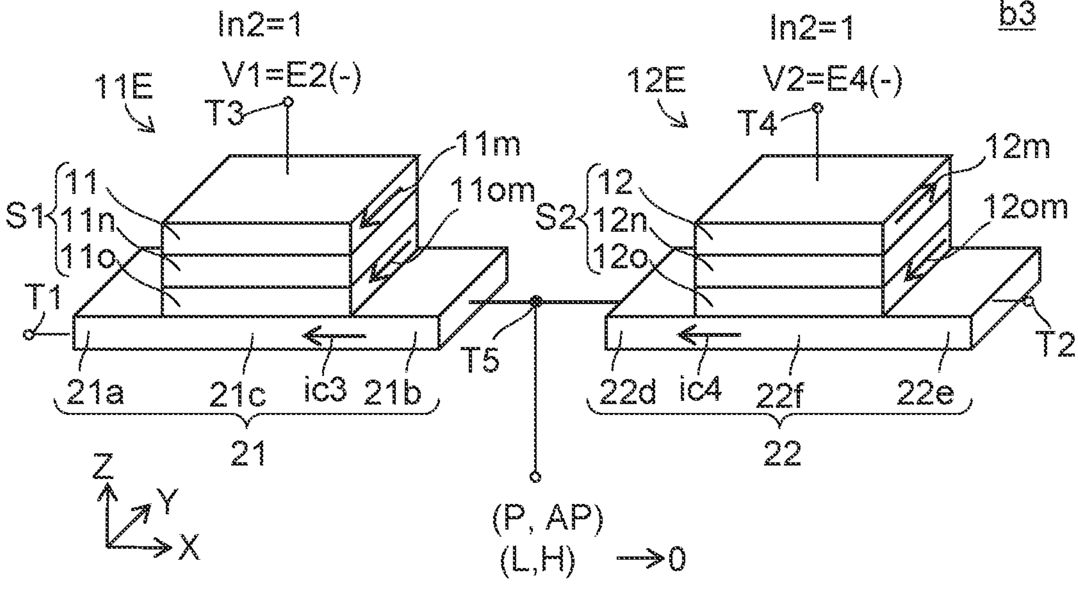

The second supply operation is performed as in the state b3 illustrated in FIG. 20B. The second supply operation is performed based on the measurement result of the potential at the connection point (fifth terminal T5). In the case of the state b2, the result obtained by the measurement operation is in the (L, H) state. The third current ic3 has the orientation from the second portion 21*b* to the first portion 21*a*. The fourth current ic4 has the orientation from the fifth portion 22*e* to the fourth portion 22*d*. In the second supply operation, the first magnetic layer 11 is at the second potential E2, and the second magnetic layer 12 is at the fourth potential E4.

Figure 21A:
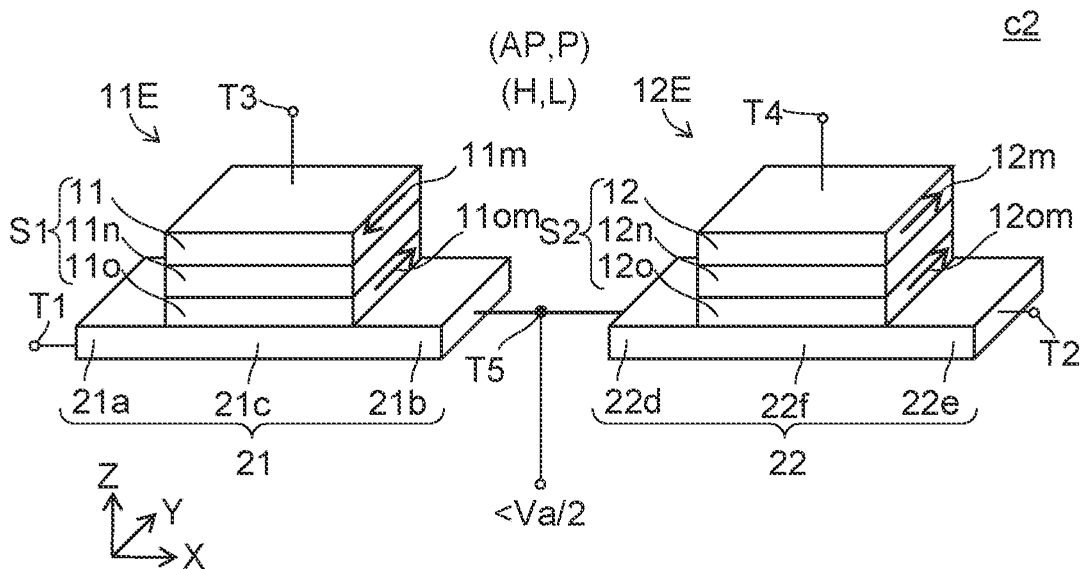
FIGS. 21A and 21B are schematic perspective views illustrating the operation of the arithmetic device according to the second embodiment.

As shown in FIG. 21A, the measurement operation is performed in the state c2. When the first potential difference Va is applied to the first magnetic layer 11 with reference to the second magnetic layer 12, the potential at the connection point (fifth terminal T5) is lower than Va/2. In the state c2, in the result obtained by the measurement operation, the first electrical resistance is in the first high resistance state and the second electrical resistance is in the second low resistance state ((H, L) state).

Figure 21B:
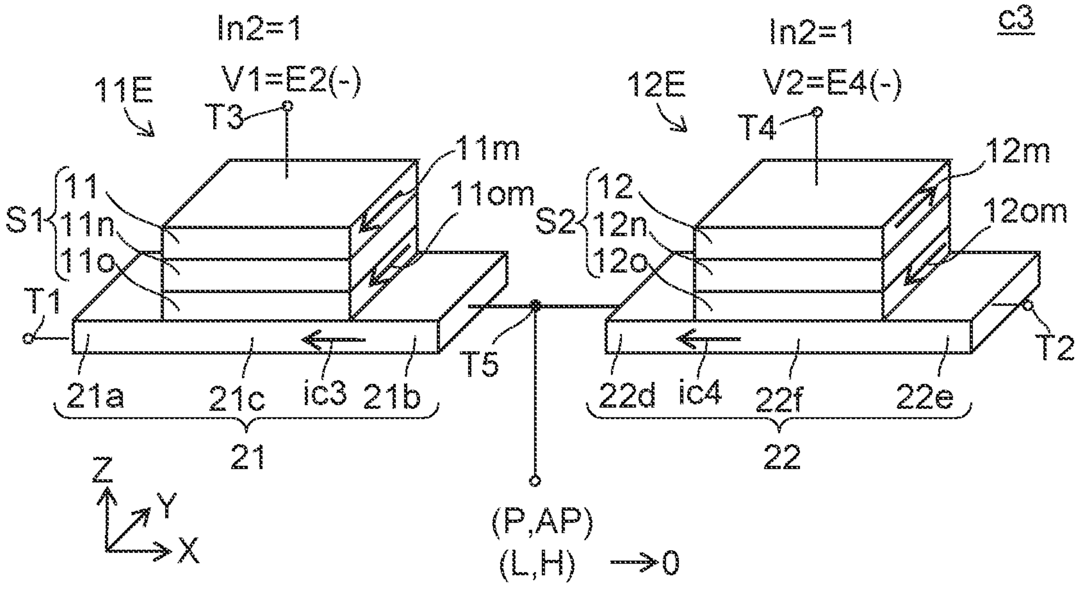

The second supply operation is performed as in the state c3 illustrated in FIG. 21B. The second supply operation is performed based on the measurement result of the potential at the connection point (fifth terminal T5). In the case of the state c2, the result obtained by the measurement operation is in the (L, H) state. The third current ic3 has the orientation from the second portion 21*b* to the first portion 21*a*. The fourth current ic4 has the orientation from the fifth portion 22*e* to the fourth portion 22*d*. In the second supply operation, the first magnetic layer 11 is at the second potential E2, and the second magnetic layer 12 is at the fourth potential E4.

Figure 22A:
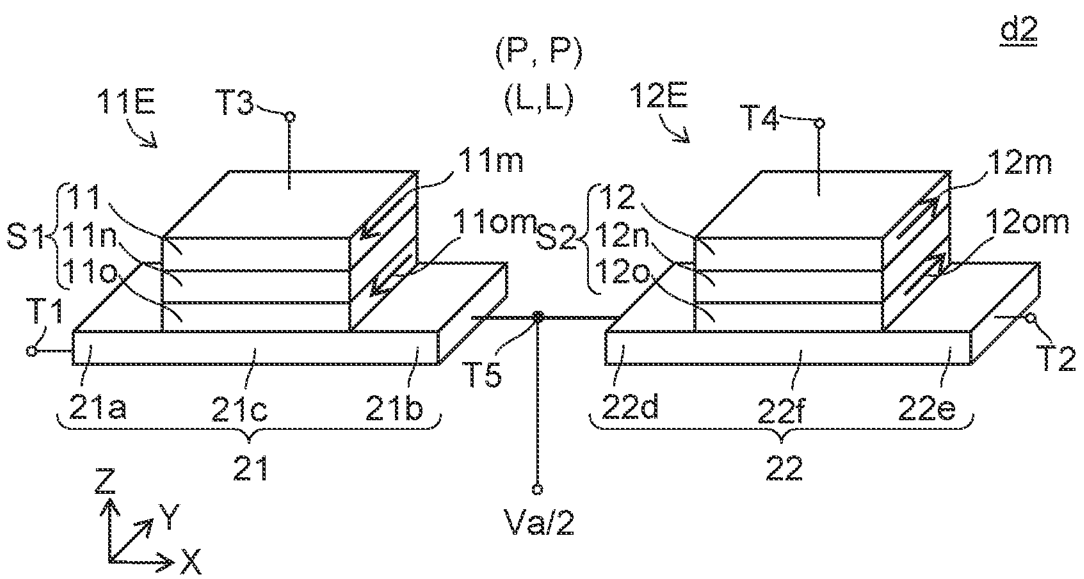
FIGS. 22A and 22B are schematic perspective views illustrating the operation of the arithmetic device according to the second embodiment.

The state d2 shown in FIG. 22A is the same as the state a2 as shown in FIG. 19A. In the state d2, the potential at the connection point (fifth terminal T5) is substantially Va/2. In state d2, it is in the (L, L) state.

Figure 22B:
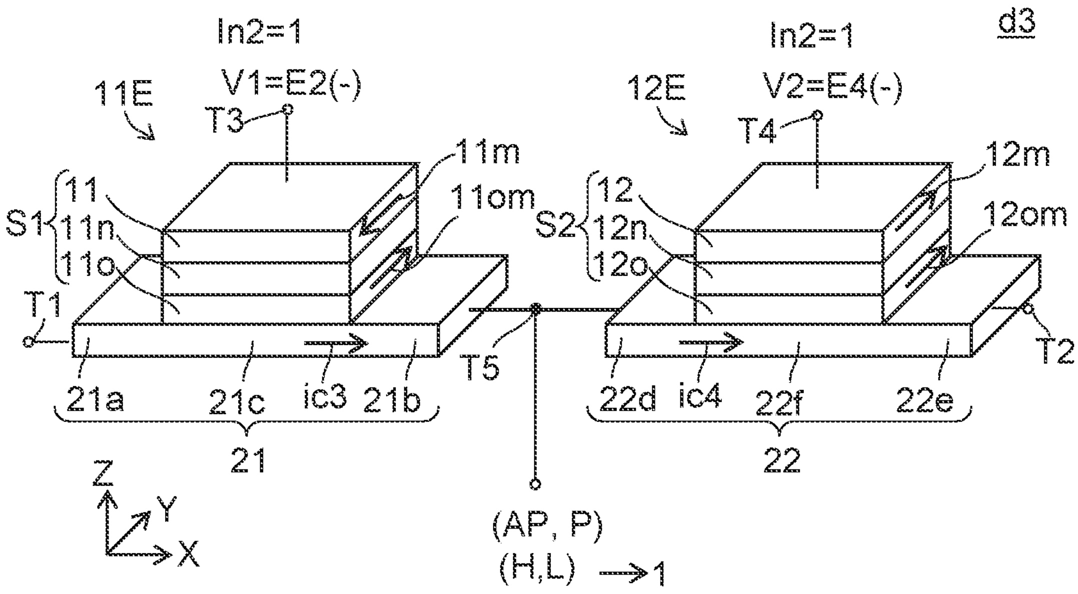

In the state d3 shown in FIG. 22B, the same second supply operation as in the state a3 shown in FIG. 19B is performed. The third current ic3 has the orientation from the first portion 21*a* to the second portion 21*b*, and the fourth current ic4 has the orientation from the fourth portion 22*d* to the fifth portion 22*e*. In the second supply operation, the first magnetic layer 11 is at the second potential E2, and the second magnetic layer 12 is at the fourth potential E4.

As described above, as illustrated in FIGS. 19A and 22A, when the first potential difference Va is applied to the first magnetic layer 11 with reference to the second magnetic layer 12 in the measurement operation, the potential at the connection point (fifth terminal T5) of the second portion 21*b* and the fourth portion 22*d* may correspond to substantially ½ (Va/2) of the first potential difference Va. In this case, as illustrated in FIGS. 19B and 22B, the third current ic3 has the orientation from the first portion 21*a* to the second portion 21*b*, and the fourth current ic4 has the orientation from the fourth portion 22*d* to the fifth portion 22*e*. In the second supply operation, the first magnetic layer 11 is at the second potential E2, and the second magnetic layer 12 is at the fourth potential E4.

As described above, as illustrated in FIGS. 20A and 21A, when the first potential difference Va is applied to the first magnetic layer 11 with reference to the second magnetic layer 12 in the measurement operation, there is a case where the potential at the connection point (fifth terminal T5) of the second portion 21*b* and the fourth portion 22*d* is higher than Va/2 (>Va/2) or lower than Va/2 (<Va/2). In this case, as shown in FIGS. 20B and 21B, the third current ic3 has the orientation from the second portion 21*b* to the first portion 21*a*, and the fourth current ic4 has the orientation from the fifth portion 22*e* to the fourth portion 22*d*. In the second supply operation, the first magnetic layer 11 is at the second potential E2, and the second magnetic layer 12 is at the fourth potential E4.

Also in the second embodiment, the XNOR operation results of the first input In1 and the second input In2 can be derived. Also in the second embodiment, it is possible to provide an arithmetic device having a simple configuration.

Also in the second embodiment, when the second input In2 is "0", in the first supply operation, the potential V1 of the first magnetic layer 11 is the first potential E1 and the potential V2 of the second magnetic layer 12 is the fourth potential E4 (see FIG. 19B and the like). When the second input In2 is "1", in the first supply operation, the potential V1 of the first magnetic layer 11 is the second potential E2, and the potential V2 of the second magnetic layer 12 is the third potential E3 (see FIG. 20B and the like).

In the arithmetic device 120, when the first magnetic layer 11 is at the second potential E2 and the current in the orientation from the second portion 21*b* to the first portion 21*a* flows through the first conductive member 21, the first electrical resistance becomes the low electrical resistance state (see FIG. 21B). When the first magnetic layer 11 is at the second potential E2 and the current in the orientation from the first portion 21*a* to the second portion 21*b* flows through the first conductive member 21, the first electrical resistance becomes the first high resistance state (see FIG. 22B).

In the arithmetic device 120, when the second magnetic layer 12 is at the fourth potential E4 and the current in the orientation from the fourth portion 22*d* to the fifth portion 22*e* flows through the second conductive member 22, the second electrical resistance becomes the second low resistance state (see FIG. 15B). When the second magnetic layer 12 is at the fourth potential E4 and the current in the orientation from the fifth portion 22*e* to the fourth portion 22*d* flows through the second conductive member 22, the second electrical resistance becomes the second high resistance state (see FIG. 21B).

As shown in FIG. 14, in the arithmetic device 120, for example, the magnetization 11*m* of the first magnetic layer 11 has a component of the current magnetic field in the orientation at the position of the first magnetic layer 11. The current magnetic field is based on the current having the orientation from the first portion 21*a* to the second portion 21*b*. The magnetization of the second magnetic layer has, for example, a component of the current magnetic field in the orientation at the position of the second magnetic layer 12. The current magnetic field is based on the current having the orientation from the fifth portion 22*e* to the fourth portion 22*d*.

FIGS. 23 and 24 are schematic views illustrating the operation of the arithmetic device according to the second embodiment.

As shown in FIG. 23, in the states (states a2, state b2, state c2 and state d2) corresponding to the result Rs1 of the first supply operation, the (P, P) state, the (P, AP) state, the (AP, P) state and the (P, P) state are obtained corresponding to the first input In1 and the second input In2.

As shown in FIG. 24, in the states (states a3, state b3, state c3 and state d3) corresponding to the result Rs2 of the second supply operation, the (AP, P) state, the (P, AP) state, the (P, AP) state and the (AP, P) state are obtained. The result Rs2 of the second supply operation corresponds to the XNOR operation result of the first input In1 and the second input In2. In this way, the arithmetic device 120 can derive the XNOR operation result of the first input In1 and the second input In2.

Figure 25A:
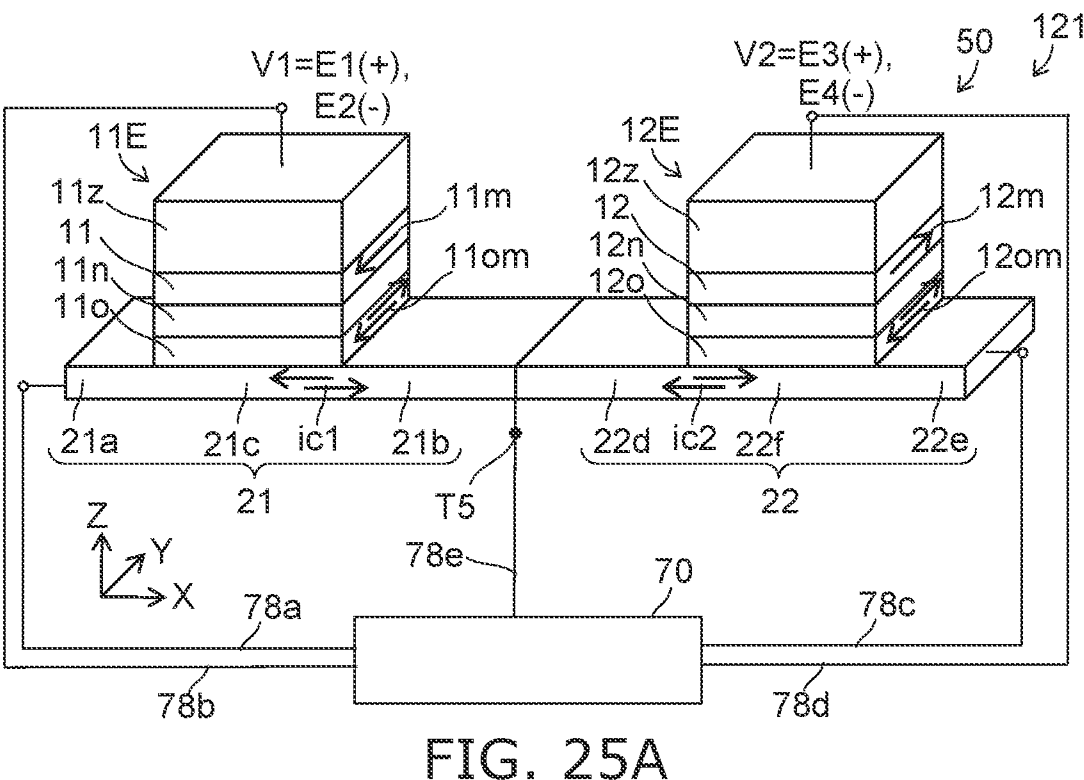
FIGS. 25A and 25B are schematic perspective views illustrating arithmetic devices according to the second embodiment.
Figure 25B:
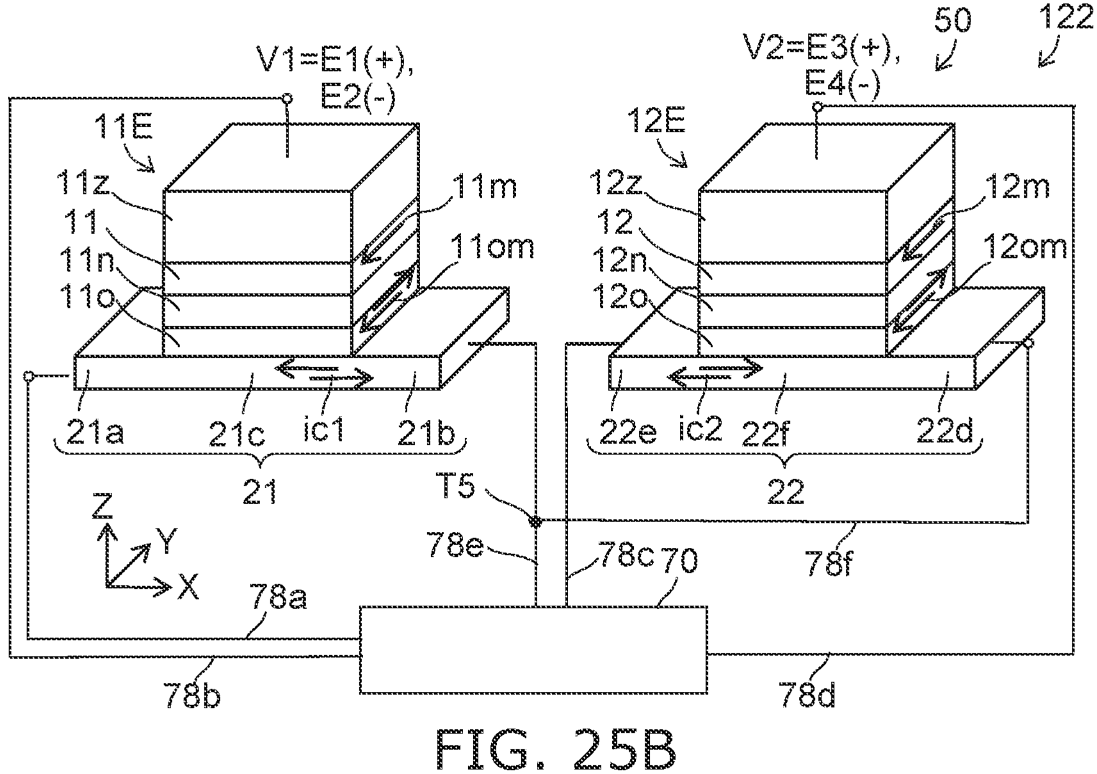

FIGS. 25A and 25B are schematic perspective views illustrating arithmetic devices according to the second embodiment.

As shown in FIG. 25A, in an arithmetic device 121 according to the embodiment, the fourth portion 22*d* is continuous with the second portion 21*b*. The orientation from the fourth portion 22*d* to the fifth portion 22*e* has a component in the orientation from the first portion 21*a* to the second portion 21*b*.

As shown in FIG. 25B, in an arithmetic device 122 according to the embodiment, the second portion 21*b* and the fourth portion 22*d* are electrically connected by the conductive part 78*f*. The orientation from the fourth portion 22*d* to the fifth portion 22*e* has a component in the orientation from the second portion 21*b* to the first portion 21*a*. As described above, the arithmetic device according to the embodiment may further include the conductive part 78*f* that electrically connects the second portion 21*b* and the fourth portion 22*d*.

In the arithmetic devices according to the first embodiment and the second embodiment, at least a part of the processes illustrated in FIG. 2 may be repeatedly performed. The controller 70 is configured to repeat the process including, for example, the first supply operation, the measurement operation, and the second supply operation. The process repeatedly performed may include a setting operation of the first input In1 and the second input In2 (step S110).

Third Embodiment

Figure 26:
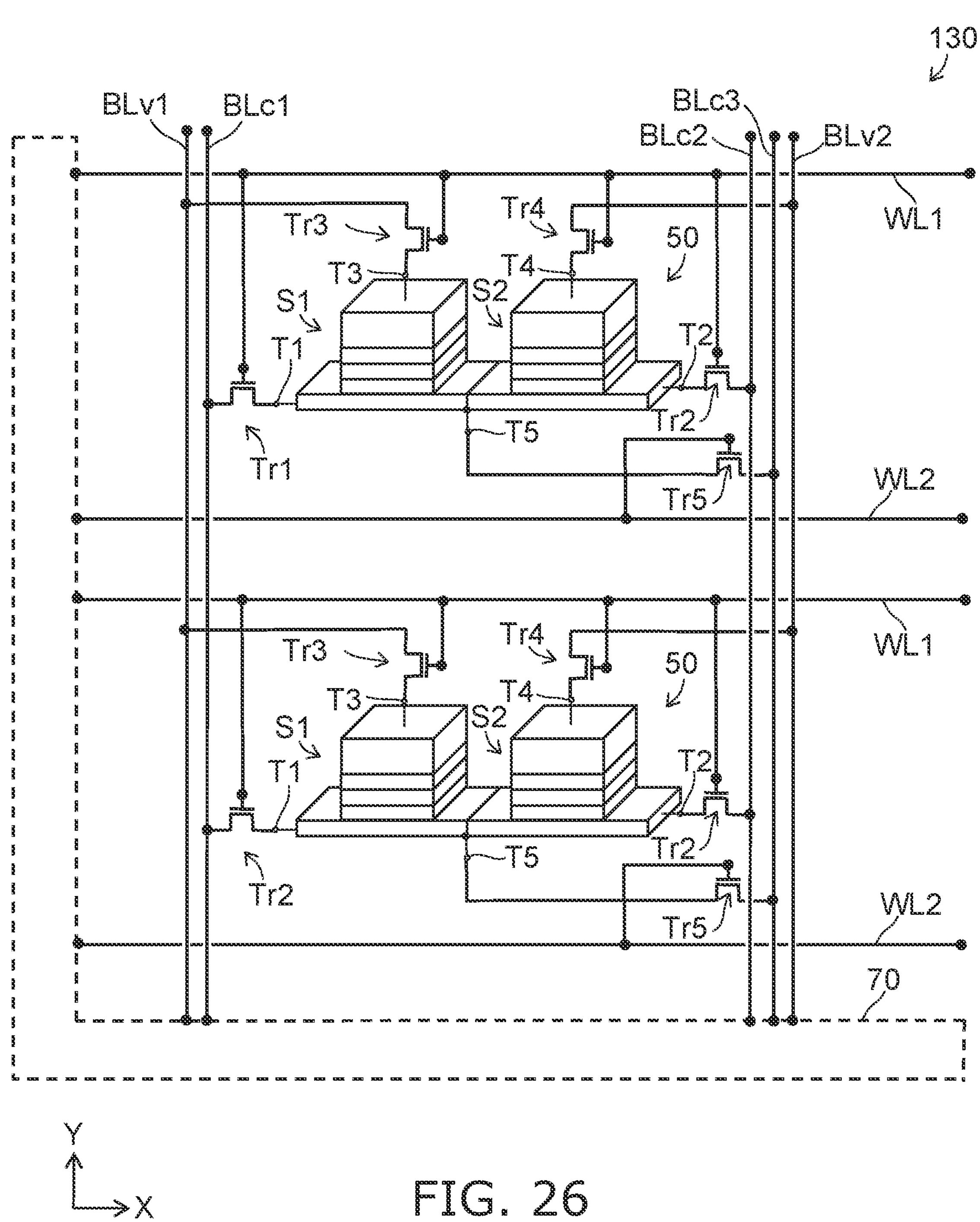
FIG. 26 is a schematic perspective view illustrating an arithmetic device according to a third embodiment.

FIG. 26 is a schematic perspective view illustrating an arithmetic device according to a third embodiment.

As shown in FIG. 26, an arithmetic device 130 according to the embodiment includes a wiring BLv1, a wiring BLv2, a wiring BLc1, a wiring BLc2, a wiring BLc3, a wiring WL1, and a wiring WL2 in addition to the arithmetic element part 50. The arithmetic element part 50 has the configuration described with respect to the first embodiment or the second embodiment. Multiple arithmetic element parts 50 may be provided.

In this example, the wiring BLv1, the wiring BLv2, the wiring BLc1, the wiring BLc2, and the wiring BLc3 extend along the Y-axis direction. The wiring WL1 and the wiring WL2 extend along the X-axis direction.

The wiring BLc1 can be electrically connected to the first terminal T1 of one of the multiple arithmetic element parts 50 via a first transistor Tr1. The wiring BLc2 can be electrically connected to the second terminal T2 of one of the multiple arithmetic element parts 50 via a second transistor Tr2. The wiring BLc3 can be electrically connected to the fifth terminal T5 of one of the multiple arithmetic element parts 50 via a fifth transistor Tr5.

The wiring BLv1 can be electrically connected to the third terminal T3 of one of the multiple arithmetic element parts 50 via a third transistor Tr3. The wiring BLv2 can be electrically connected to the fourth terminal T4 of one of the multiple arithmetic element parts 50 via a fourth transistor Tr4.

The gate of the first transistor Tr1, the gate of the second transistor Tr2, the gate of the third transistor Tr3, and the gate of the fourth transistor Tr4 are electrically connected to the wiring WL1. The gate of the fifth transistor Tr5 is electrically connected to the wiring WL2.

The wiring BLv1 is, for example, a first voltage control bit line. The wiring BLv2 is, for example, a second voltage control 2-bit line. The wiring BLc1 is a first program current bit line. The wiring BLc2 is, for example, a second program current bit line. The wiring BLc3 is, for example, a second program current bit line. The wiring WL1 is, for example, a first word line. The wiring WL2 is, for example, a second word line.

These wirings are electrically connected to the controller 70. The controller 70 performs the above operation via these wirings. Each of the multiple arithmetic element parts 50 is selected, and the above operation is performed. The first to fifth transistors Tr1 to Tr5 may be included in the controller 70.

In the example of FIG. 26, the multiple arithmetic element parts 50 are arranged in the Y-axis direction. In the embodiment, the multiple arithmetic element parts 50 may be arranged in a matrix along the Y-axis direction and the X-axis direction.

Figure 27:
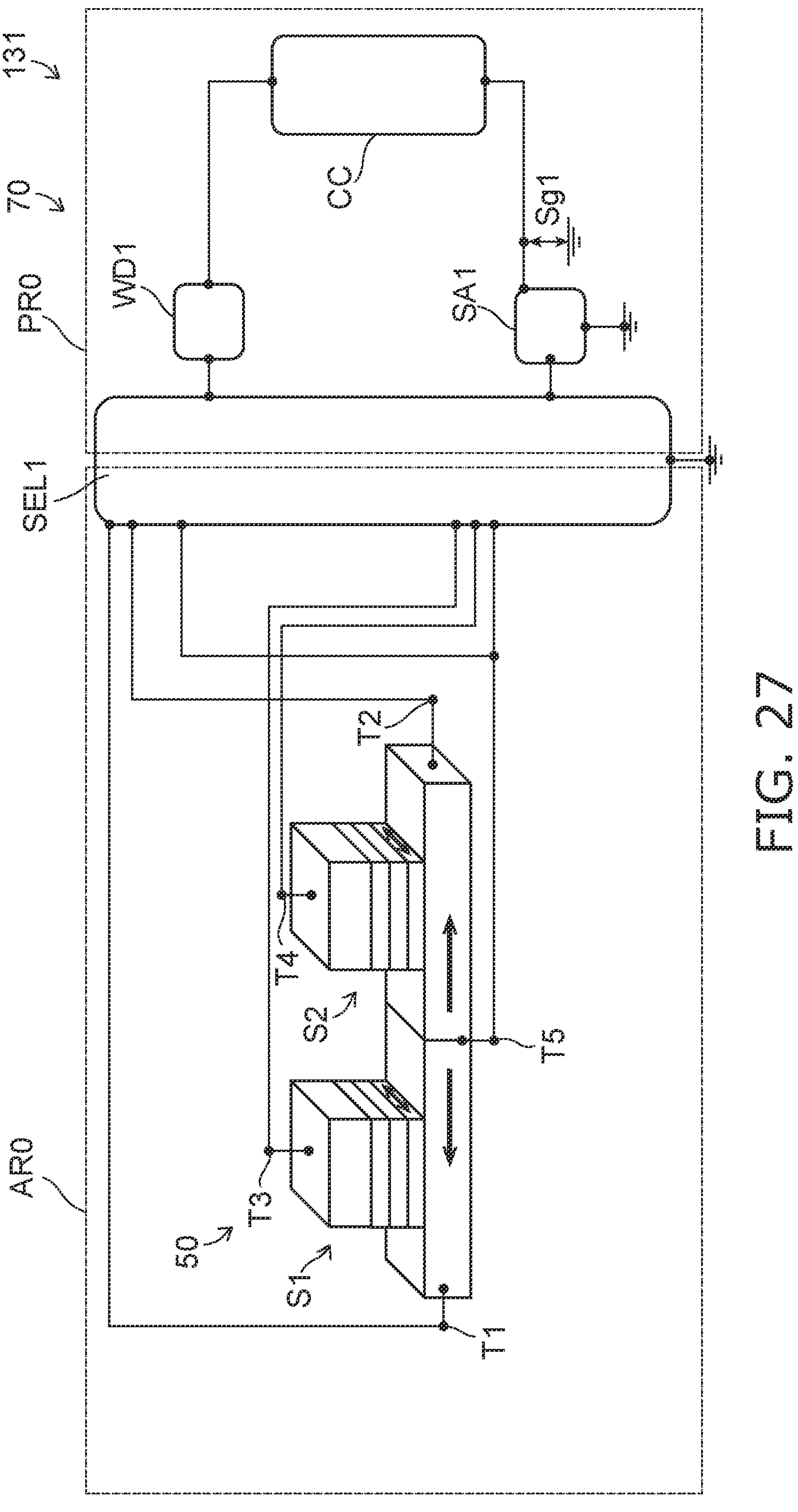
FIG. 27 is a schematic perspective view illustrating an arithmetic device according to the third embodiment.

FIG. 27 is a schematic diagram illustrating an arithmetic device according to the third embodiment.

As shown in FIG. 27, in an arithmetic device 131 according to the embodiment, an array region AR0 and a peripheral region PR0 are provided. At least one arithmetic element part 50 is provided in the array region AR0. At least a part of the controller 70 is provided in the peripheral region PR0.

The arithmetic device 131 includes a selector SEL1. A part of the selector SEL1 may be provided in the array region AR0. A part of the selector SEL1 may be provided in the peripheral region PR0. At least a part of the selector SEL1 may be included in the controller 70.

In this example, the controller 70 includes a program driver WD1, a sense amplifier SA1, and a control circuit CC. The program driver WD1 programs data to the arithmetic element part 50. The sense amplifier SA1 detects the state of resistance in the arithmetic element part 50. A signal Sg1 corresponding to the state of the resistance is supplied from the sense amplifier SA1 to the control circuit CC. The control circuit CC controls the program driver WD1 based on, for example, the signal Sg1. The above operation is performed by such a controller 70.

The arithmetic device 131 may include the multiple arithmetic element parts 50 and the selector SEL1. The selector SEL1 can control the read operation, the program operation, and the logic operation of the information (electrical resistance) in the multiple arithmetic element parts 50. The selector SEL1 may be shared by at least two of the multiple arithmetic element parts 50.

The selector SEL1 may correspond to a bit selector. The selector SEL1 may correspond to a column selector. The selector SEL1 may include the bit selector and the column selector.

With a configuration like the arithmetic device 131, for example, many XNOR Logic-gates can share less Write-drivers or less Read-amplifiers. Thereby, for example, the occupied area can be reduced. For example, the number of Write-drivers and Read-amplifiers in the operating state can be reduced. As a result, power consumption can be significantly reduced.

Figure 28:
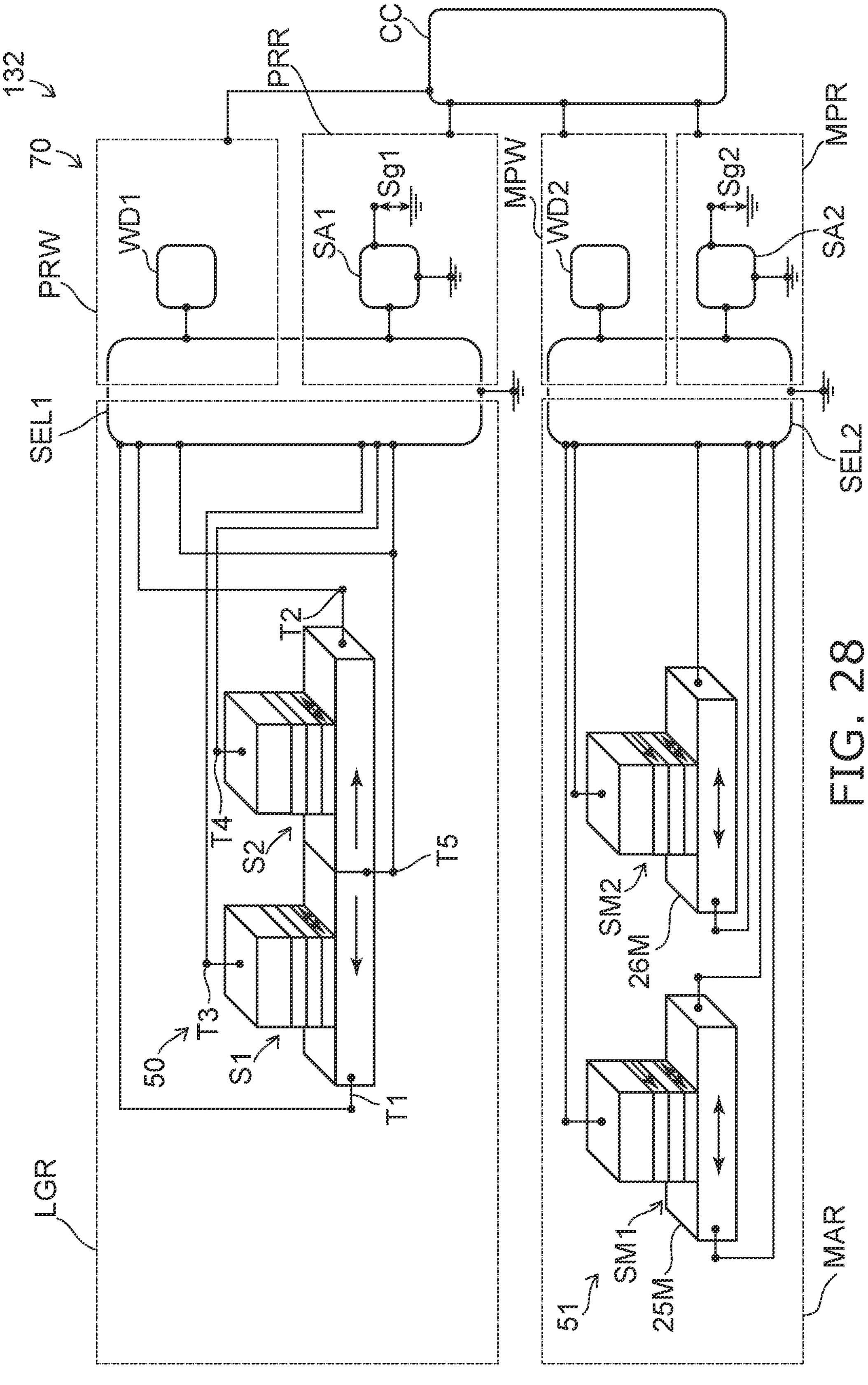
FIG. 28 is a schematic perspective view illustrating an arithmetic device according to the third embodiment.

FIG. 28 is a schematic diagram illustrating an arithmetic device according to the third embodiment.

As shown in FIG. 28, in an arithmetic device 132 according to the embodiment, a logic gate region LGR, a logic program circuit peripheral region PRW, a logic read circuit peripheral region PRR, a memory array region MAR, a memory program circuit peripheral region MPW, and a memory read circuit peripheral region MPR are provided.

The configurations of the array region AR0 and the peripheral region PR0 described with respect to FIG. 27 can be applied to the logic gate region LGR, the logic program circuit peripheral region PRW, and the logic read circuit peripheral region PRR.

At least one memory element part 51 is provided in the memory array region MAR. The memory element part 51 includes, for example, a first memory conductive member 25M, a second memory conductive member 26M, a first memory stacked body SM1, and a second memory stacked body SM2. The configurations described with respect to the first conductive member 21 and the second conductive member 22 can be applied to the first memory conductive member 25M and the second memory conductive member 26M. The configurations described with respect to the first stacked body S1 and the second stacked body S2 can be applied to the first memory stacked body SM1 and the second memory stacked body SM2. The memory element part 51 can store information, for example.

In the arithmetic device 132, the selector SEL2 may be provided. At least a part of the selector SEL2 may be provided in the memory array region MAR. At least a part of the selector SEL2 may be provided in at least one of the memory program circuit peripheral region MPW and the memory read circuit peripheral region MPR. A memory program driver WD2 is provided in the memory program circuit peripheral region MPW. A memory sense amplifier SA2 is provided in the memory read circuit peripheral region MPR. The signal Sg2 obtained from the memory sense amplifier SA2 is supplied to the control circuit CC. The control circuit CC controls the memory program driver WD2 based on, for example, the signal Sg2. Such a controller 70 performs a storage operation (read operation, program operation, etc.) in the memory array region MAR.

The memory array region MAR can store the operation results performed in the logic gate region LGR, the logic program circuit peripheral region PRW, and the logic read circuit peripheral region PRR. The logic gate region LGR, the logic program circuit peripheral region PRW, and the logic read circuit peripheral region PRR can perform arithmetic processing based on the information stored in the memory array region MAR.

The controller 70 may include at least a part of, for example, the logic program circuit peripheral region PRW, the logic read circuit peripheral region PRR, the memory program circuit peripheral region MPW, the memory read circuit peripheral region MPR, and the control circuit CC. The controller 70 may include, for example, at least a part of the selector SEL1 or the selector SEL2.

In the example of the arithmetic device 132, a Logic-gates portion and a memory array portion are provided in different regions. For example, such a configuration is applied when a large-scale Memory Array is provided.

Figure 29A:
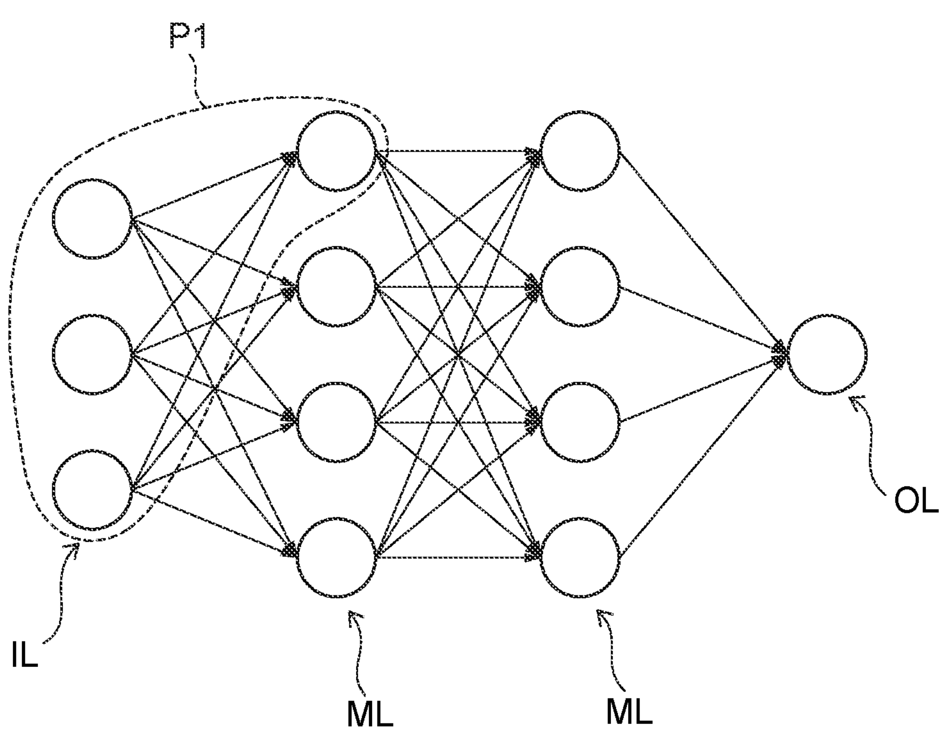
FIGS. 29A and 29B are schematic views illustrating the operation of the arithmetic device according to the embodiment.
Figure 29B:
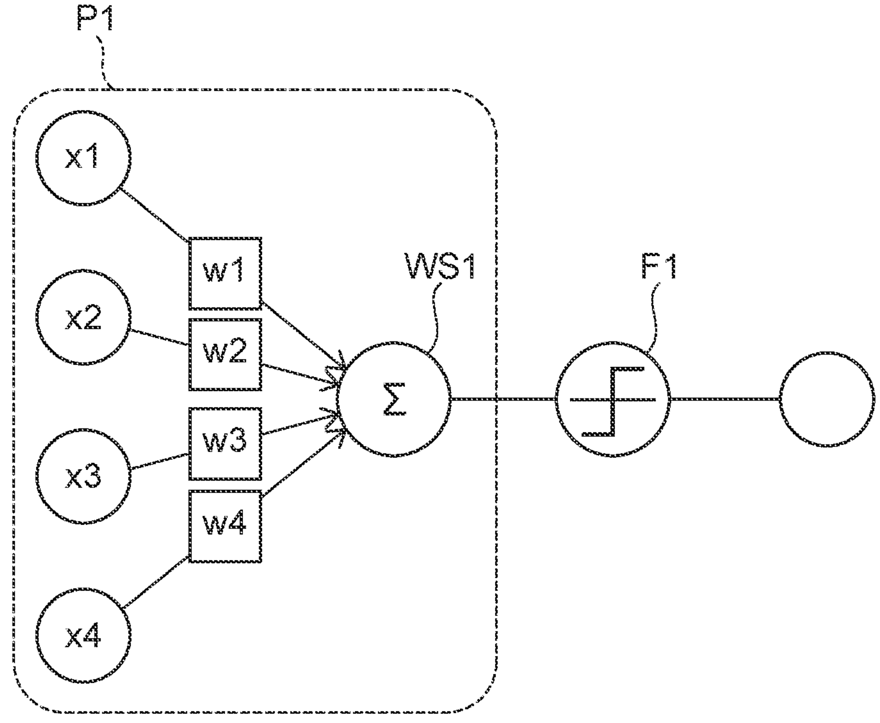

FIGS. 29A and 29B are schematic views illustrating the arithmetic device according to the embodiment. These figures illustrate the application of the arithmetic devices according to the first to third embodiments. In this example, the arithmetic device according to the embodiment is applied to a neural network. In this example, the neural network corresponds to BNN (Binary Neural Network). In FIG. 29B, a part P1 of FIG. 29A is shown in an enlarged manner.

As shown in FIG. 29A, the neural network includes, for example, an input layer 1L, multiple intermediate layers ML, and an output layer OL.

As shown in FIG. 29B, the product of multiple inputs (inputs x1, x2, x3 and x4, etc.) and weights (weights w1, w2, w3, w4, etc.) is calculated during learning and inference. That is, a weighted product-sum operation WS1 is performed. A function F1 (for example, a step function) resulting from the product-sum operation WS1 is output as a result. This output is input to the next layer and the sum of multiple products is calculated. The output based on the sum is determined.

For example, in the product-sum operation WS1, the XNOR operation is performed. The arithmetic device according to the embodiment may, for example, perform at least a part of the product-sum operation.

At the time of learning and inference, information is repeatedly stored in a logic gate. Devices used as logic gates are required to have high programing endurance. It is desirable that the logic gate is non-volatile so that the calculation result can be held. Since the calculation result is non-volatile, it is not necessary to store the calculation result in another storage part, and the power consumption can be reduced. Since the logic gate operates repeatedly during learning and inference, it is desirable that the power consumption of the logic gate is small.

In the arithmetic device according to the embodiment, high programing endurance can be obtained. Operations can be performed with a smaller current. Efficient operation can be performed with a simple configuration.

In the following, an example of the configuration of the elements included in the arithmetic device according to the embodiment will be described.

At least one of the first conductive member 21 or the second conductive member 22 includes at least one selected from the group consisting of Ta, W, Re, Os, Ir, Pt, Au, Cu, Ag and Pd. A thickness of these conductive members is, for example, not more than 3 nm and not less than 10 nm (for example, 5 nm).

At least one of the first magnetic layer 11 or the second magnetic layer 12 includes at least one selected from the group consisting of Fe and Co. These magnetic layers may include a stacked film. The stacked film has, for example, the configuration of a CoFe film (thickness is 2 nm)/Ru film (thickness is 0.8 nm)/Co film/CoFeB film (thickness is 2 nm).

At least one of the first counter magnetic layer 110 and the second counter magnetic layer 120 includes at least one selected from the group consisting of Fe and Co, and boron. A thickness of these magnetic layers is, for example, not less than 1 nm and not more than 2 nm (for example, 1.6 nm).

At least one of the first non-magnetic layer 11*n* or the second non-magnetic layer 12*n* includes Mg and oxygen. A thickness of these non-magnetic layers is, for example, not less than 1 nm and not more than 2 nm (for example, 1.4 nm).

At least one of the magnetic layer 11*z* or the magnetic layer 12*z* includes at least one selected from the group consisting of IrMn and PtMn.

The above description regarding the material and the thickness is an example, and the composition of the elements included in the arithmetic device can be changed.

In order to put an Edge-computing device, which is a key device of IOT or AI (Artificial Intelligence), into practical use, inexpensive and low energy consumption Logic-gate and memory are required. For example, a non-volatile Logic-gate that can embody XNOR Logic-Gates, which is the key of Binary Neural Network (BNN), with a simple structure is required.

In the embodiment, for example, the configuration using two Voltage-Control Spintronics Memory (VoCSM) elements is used, and a unique operation sequence is adopted. This gives XNOR Logic-Gates.

For example, edge computing and cloud computing are making rapid progress. It is required to save power between a CPU (Central Processing Unit) and an MPU (Micro Processing Unit) and a working memory for exchanging information. The working memory includes, for example, SRAM (Static Random Access Memory) or DRAM (Dynamic Random Access Memory).

For example, in AI and ML (Machine Learning), extremely frequent high-speed programing of data is performed in learning and inference. In such an application, a non-volatile working memory having a large number of programing and ultra-low power consumption, and a single-function, inexpensive and ultra-low power consumption arithmetic device are required. The embodiments can be applied to such applications.

In the VoCSM element, a bias voltage is applied to the MTJ element to control the magnetic anisotropy of the free magnetic layer (for example, a memory layer). For example, programing based on SOT (Spin Orbit Torque) is performed in a state where VCMA (Voltage Control of_Magnetic Anisotropy) is performed.

In the VoCSM element, a program current flows through the conductive member. The conductive member corresponds to, for example, SHE (Spin-Hall Electrode). It is easy to reduce the resistance of the conductive member. The program energy per bit is not more than 1/100 of that in the STT (Spin Torque Transfer) element. High melting-point metals such as Ta can be applied to the conductive member. The conductive member has high resistance to electromigration and the like. The number of program is very large.

In the embodiment, for example, XNOR Logic-Gates, which are the keys of BNN, can be provided with a simple configuration. The arithmetic element part 50 in the embodiment includes, for example, a VoCSM element. The VoCSM element is non-volatile and has low power consumption. With a simple structure and a simple operation sequence, XNOR operations can be performed. In the embodiment, a program driver, a read amplifier (sense amplifier, etc.), or the like may be shared by the multiple arithmetic element parts 50. As a result, the occupied area can be reduced. For example, power consumption can be significantly reduced.

For example, the arithmetic device according to the embodiment can be applied to the XNOR operation in the AI application using the edge device using BNN. The embodiments can provide innovation.

The embodiment may include the following configurations.

Configuration 1

Arithmetic device, comprising:

an arithmetic element part; and a controller, the arithmetic element part including a first element including a first conductive member and a first stacked body, the first conductive member including a first portion, a second portion, and a third portion between the first portion and the second portion, the first stacked body including a first magnetic layer, and a first counter magnetic layer provided between the third portion and the first magnetic layer, and a second element including a second conductive member and a second stacked body, the second conductive member including a fourth portion, a fifth portion, and a sixth portion between the fourth portion and the fifth portion, the second stacked body including a second magnetic layer, and a second counter magnetic layer provided between the sixth portion and the second magnetic layer, the second portion and the fourth portion being electrically connected, the controller being configured to perform an XNOR operation of a first input and a second input, the first input corresponding to a first electrical resistance of the first stacked body and a second electrical resistance of the second stacked body, the second input corresponding to a potential of the first magnetic layer and a potential of the second magnetic layer.

Configuration 2

The arithmetic device according to Configuration 1, wherein the controller performs a first supply operation of supplying a first current to the first conductive member, and supplying a second current to the second conductive member, the first current having an orientation from the second portion to the first portion, the second current having an orientation from the fourth portion to the fifth portion, the controller performs a measurement operation to measure the first electrical resistance after the supply of the first current, and the second electrical resistance after the supply of the second current, after the measurement operation, the controller performs a second supply operation of supplying a third current to the first conductive member, and supplying a fourth current to the second conductive member when the third current has an orientation from the first portion to the second portion, the fourth current has the orientation from the fourth portion to the fifth portion, and when the third current has the orientation from the second portion to the first portion, the fourth current has an orientation from the fifth portion to the fourth portion.

Configuration 3

The arithmetic device according to Configuration 2, wherein when the first electrical resistance is in a first low resistance state, and the second electrical resistance is in a second low resistance state, the first input is "0", when the first electrical resistance is in a first high resistance state higher than the first low resistance state, and the second electrical resistance is in a second high resistance state higher than the second low resistance state, the first input is "1", when the second input is "0", in the first supply operation, the potential of the first magnetic layer is a first potential, and the potential of the second magnetic layer is a fourth potential, when the second input is "1", in the first supply operation, the potential of the first magnetic layer is a second potential, and the potential of the second magnetic layer is a third potential, polarity of the second potential is opposite to polarity of the first potential, polarity of the fourth potential is opposite to polarity of the third potential, and the polarity of the fourth potential is opposite to the polarity of the first potential.

Configuration 4

The arithmetic device according to Configuration 2, wherein when the first electrical resistance is in a first low resistance state, and the second electrical resistance is in a second low resistance state, the first input is "0", when the first electrical resistance is in a first high resistance state higher than the first low resistance state, and the second electrical resistance is in a second high resistance state higher than the second low resistance state, the first input is "1", when the second input is "0", in the first supply operation, the potential of the first magnetic layer is a first potential, and the potential of the second magnetic layer is a third potential, when the second input is "1", in the first supply operation, the potential of the first magnetic layer is a second potential, and the potential of the second magnetic layer is a fourth potential, when the potential of the first magnetic layer is the second potential, a state of the first electrical resistance can be changed depending on an orientation of a current flowing through the first conductive member, when the potential of the first magnetic layer is the first potential, the state of the first electrical resistance maintains a state before a current flows through the first conductive member, when the potential of the second magnetic layer is the fourth potential, a state of the second electrical resistance can be changed depending on an orientation of a current flowing through the second conductive member, and when the potential of the second magnetic layer is the third potential, the state of the second electrical resistance maintains a state before a current flows through the second conductive member.

Configuration 5

The arithmetic device according to Configuration 3 or 4, wherein when a result obtained by the measurement operation is that the first electrical resistance is in the first low resistance state, and the second electrical resistance is in the second high resistance state, the third current has the orientation from the first portion to the second portion, and the fourth current has the orientation from the fourth portion to the fifth portion, and in the second supply operation, the first magnetic layer is at the second potential, and the second magnetic layer is at the fourth potential.

Configuration 6

The arithmetic device according to Configuration 3 or 4, wherein when a result obtained by the measurement operation is that the first electrical resistance is in the first low resistance state, and the second electrical resistance is in the second low resistance state, alternatively the first electrical resistance is the first high resistance state, and the second electrical resistance is in the second high resistance state, the third current has the orientation from the second portion to the first portion, and the fourth current has the orientation from the fifth portion to the fourth portion, and in the second supply operation, the first magnetic layer is at the second potential, and the second magnetic layer is at the fourth potential.

Configuration 7

The arithmetic device according to Configuration 3 or 4, wherein in the measurement operation, when a first potential difference is applied to the first magnetic layer with reference to the second magnetic layer, and a potential at a connection point of the second portion and the fourth portion corresponds to substantially ½ of the first potential difference, the third current has the orientation from the second portion to the first portion, and the fourth current has the orientation from the fifth portion to the fourth portion, and in the second supply operation, the first magnetic layer is at the second potential, and the second magnetic layer is at the fourth potential, and in the measurement operation, when the first potential difference is applied to the first magnetic layer with reference to the second magnetic layer, the potential at the connection point of the second portion and the fourth portion is higher than substantially ½ of the first potential difference, the third current has the orientation from the first portion to the second portion, and the fourth current has the orientation from the fourth portion to the fifth portion, and in the second supply operation, the first magnetic layer is at the second potential, and the second magnetic layer is at the fourth potential.

Configuration 8

The arithmetic device according to any one of Configurations 3 to 7, wherein when the first magnetic layer is at the second potential and a current in the orientation from the second portion to the first portion flows through the first conductive member, the first electrical resistance becomes the first low resistance state, when the first magnetic layer is at the second potential and a current in the orientation from the first portion to the second portion flows through the first conductive member, the first electrical resistance becomes the first high resistance state, when the second magnetic layer is at the fourth potential and a current in the orientation from the fourth portion to the fifth portion flows through the second conductive member, the second electrical resistance becomes the second high resistance state, and when the second magnetic layer is at the fourth potential and a current in the orientation from the fifth portion to the fourth portion flows through the second conductive member, the second electrical resistance becomes the second low resistance state.

Configuration 9

The arithmetic device according to any one of Configurations 3 to 8, wherein magnetization of the first magnetic layer has a component of a current magnetic field in an orientation at a position of the first magnetic layer, the current magnetic field being based on a current having the orientation from the first portion to the second portion, and magnetization of the second magnetic layer has a component of a current magnetic field in an orientation at a position of the second magnetic layer, the current magnetic field being based on a current having the orientation from the fourth portion to the fifth portion.

Configuration 10

The arithmetic device according to Configuration 2, wherein when the first electrical resistance is in a first low resistance state, and the second electrical resistance is in a second high resistance state, the first input is "0", when the first electrical resistance is in a first high resistance state higher than the first low resistance state, the second electrical resistance is in a second low resistance state lower than the second high resistance state, the first input is "1", when the second input is "0", in the first supply operation, the potential of the first magnetic layer is a first potential, and the potential of the second magnetic layer is a fourth potential, when the second input is "1", in the first supply operation, the potential of the first magnetic layer is a second potential, and the potential of the second magnetic layer is a third potential, polarity of the second potential is opposite to polarity of the first potential, polarity of the fourth potential is opposite to polarity of the third potential, and the polarity of the fourth potential is opposite to the polarity of the first potential.

Configuration 11

The arithmetic device according to Configuration 2, wherein when the first electrical resistance is in a first low resistance state, and the second electrical resistance is in a second high resistance state, the first input is "0", when the first electrical resistance is in a first high resistance state higher than the first low resistance state, and the second electrical resistance is in a second low resistance state lower than the second high resistance state, the first input is "1", when the second input is "0", in the first supply operation, the potential of the first magnetic layer is a first potential, and the potential of the second magnetic layer is a third potential, when the second input is "1", in the first supply operation, the potential of the first magnetic layer is a second potential, and the potential of the second magnetic layer is a fourth potential, when the potential of the first magnetic layer is the second potential, a state of the first electrical resistance can be changed depending on an orientation of a current flowing through the first conductive member, when the potential of the first magnetic layer is the first potential, the state of the first electrical resistance maintains a state before a current flows through the first conductive member, when the potential of the second magnetic layer is the fourth potential, a state of the second electrical resistance can be changed depending on an orientation of a current flowing through the second conductive member, and when the potential of the second magnetic layer is the third potential, the state of the second electrical resistance maintains a state before a current flows through the second conductive member.

Configuration 12

The arithmetic device according to Configuration 10 or 11, wherein when a result obtained by the measurement operation is that the first electrical resistance is the first low resistance state, and the second electrical resistance is in the second high resistance state, alternatively the first electrical resistance is the first high resistance state, and the second electrical resistance is in the second low resistance state, the third current has the orientation from the second portion to the first portion, and the fourth current has the orientation from the fifth portion to the fourth portion, and in the second supply operation, the first magnetic layer is at the second potential, and the second magnetic layer is at the fourth potential.

Configuration 13

The arithmetic device according to Configuration 10 or 11, wherein when a result obtained by the measurement operation is that the first electrical resistance is in the first low resistance state, and the second electrical resistance is in the second low resistance state, the third current has the orientation from the first portion to the second portion, and the fourth current has the orientation from the fourth portion to the fifth portion, and in the second supply operation, the first magnetic layer is at the second potential, and the second magnetic layer is at the fourth potential.

Configuration 14

The arithmetic device according to Configuration 10 or 11, wherein in the measurement operation, when a first potential difference is applied to the first magnetic layer with reference to the second magnetic layer, a potential at a connection point of the second portion and the fourth portion correspond to substantially ½ of the first potential difference, the third current has the orientation from the first portion to the second portion, and the fourth current has the orientation from the fourth portion to the fifth portion, and in the second supply operation, the first magnetic layer is at the second potential, and the second magnetic layer is at the fourth potential, and in the measurement operation, when the first potential difference is applied to the first magnetic layer with reference to the second magnetic layer, the potential at the connection point of the second portion and the fourth portion is higher than substantially ½ of the first potential difference, alternatively is lower than substantially ½ of the first potential difference, the third current has the orientation from the second portion to the first portion, and the fourth current has the orientation from the fifth portion to the fourth portion, and in the second supply operation, the first magnetic layer is at the second potential, and the second magnetic layer is at the fourth potential.

Configuration 15

The arithmetic device according to any one of Configurations 10 to 14, wherein when the first magnetic layer is at the second potential, and a current in the orientation from the second portion to the first portion flows through the first conductive member, the first electrical resistance becomes the first low resistance state, when the first magnetic layer is at the second potential and a current in the orientation from the first portion to the second portion flows through the first conductive member, the first electrical resistance becomes the first high resistance state, when the second magnetic layer is at the fourth potential and a current in the orientation from the fourth portion to the fifth portion flows through the second conductive member, the second electrical resistance becomes the second low resistance state, and when the second magnetic layer is at the fourth potential and a current in the orientation from the fifth portion to the fourth portion flows through the second conductive member, the second electrical resistance becomes the second high resistance state.

Configuration 16

The arithmetic device according to any one of Configurations 10 to 15, wherein magnetization of the first magnetic layer has a component of a current magnetic field in an orientation at a position of the first magnetic layer, the current magnetic field being based on a current having the orientation from the first portion to the second portion, and magnetization of the second magnetic layer has a component of a current magnetic field in an orientation at a position of the second magnetic layer, the current magnetic field being based on a current having the orientation from the fifth portion to the fourth portion.

Configuration 17

The arithmetic device according to any one of Configurations 1 to 16, wherein the fourth portion is continuous with the second portion.

Configuration 18

The arithmetic device according to Configuration 17, wherein the orientation from the fourth portion to the fifth portion has a component in the orientation from the first portion to the second portion.

Configuration 19

The arithmetic device according to any one of Configurations 1 to 18, comprising:

a plurality of the operation element parts, the controller including a selector, and the selector selects at least one of the plurality of operation element parts, and is configured to perform the XNOR operation.

Configuration 20

The arithmetic device according to Configuration 19, wherein the selector is shared by the plurality of operation element parts.

FIGS. 30A to 30D are schematic views illustrating the operation of the arithmetic device according to the embodiment.

These figures illustrate the operation of the arithmetic device 110 according to the embodiment already described. FIG. 30D illustrates the orientation of the magnetization 11*m* of the first magnetic layer 11 and the orientation of the magnetization 12*m* of the second magnetic layer 12.

As shown in FIG. 30A, in the definition DF0 in the operation, when the first electrical resistance of the first stacked body S1 is in the first low resistance state (L and P), and the second electrical resistance of the second stacked body S2 is in the second low resistance state (L and P), it corresponds to "0". When the first electrical resistance of the first stacked body S1 is in the first high resistance state (H and AP), and the second electrical resistance of the second stacked body S2 is in the second high resistance state (H and AP), it corresponds to "1".

As shown in FIG. 30A, it is (P, P) when the first input In1 is "0", and (AP, AP) when the first input In1 is "1".

As shown in FIG. 30A, in the first supply operation (step S120), the second input In2 is input to the first stacked body S1 (first magnetic layer 11). Inverted iIn2 of the second input In2 (corresponding to the negative "_In2") is input to the second stacked body S2 (second magnetic layer 12). In the first supply operation (step S120), when the second input In2 is "0", the potential V1 of the first magnetic layer 11 is the first potential E1 (for example, "Deactive", for example, positive), and the potential V2 of the second magnetic layer 12 is the fourth potential E4 (for example, "Active", for example, negative). In the first supply operation (step S120), when the second input In2 is “1”, the potential V1 of the first magnetic layer 11 is the second potential E2 (for example, “Active”, for example, negative), and the potential V2 of the second magnetic layer 12 is the third potential E3 (for example, “Deactive”, for example, positive).

As shown in FIG. 30A, in the first supply operation (step S120), the first current ic1 supplied to the first conductive member 21 has the orientation I21 from the second portion 21*b* to the first portion 21*a*. In the first supply operation (step S120), the second current ic2 supplied to the second conductive member 22 has the orientation I45 from the fourth portion 22*d* to the fifth portion 22*e*.

As shown in FIG. 30B, the magnetization configuration MG1 of the first stacked body S1 and the second stacked body S2 is defined corresponding to data DAT1 of the first input In1. As a result of performing the first supply operation based on the first input In1 and the second input In2, the (P, AP) state, the (P, P) state, the (AP, AP) state, and (P, AP) state are obtained.

As shown in FIG. 30B, a value VD obtained by the measurement operation (step S130) is a value corresponding to ½ of the first potential difference Va or a value different from ½ of the first potential difference Va, depending on the operation result. This result corresponds to the XNOR of the first input In1 and the second input In2 in data DAT2 of the operation result.

As shown in FIG. 30C, in the second supply operation (step S140), the third current ic3 is supplied to the first conductive member 21, and the fourth current ic4 is supplied to the second conductive member 22. In this example, in the operations of (0,0) and (1,1), the third current ic3 has the orientation I12 from the first portion 21*a* to the second portion 21*b*. In the operation of (1,0), the third current ic3 has the orientation I21 from the second portion 21*b* to the first portion 21*a*, and the fourth current ic4 has the orientation I54 from the fifth portion 22*e* to the fourth portion 22*d*. As described above, in the second supply operation, the potential V1 of the first magnetic layer 11 and the potential V2 of the second magnetic layer 12 are regarded as “Active” potentials in the stacked body that programs the data. As a result, the (AP, AP) state, the (P, P) state, the (P, P) state, and the (AP, AP) state are obtained in the result Rs2 of the second supply operation (step S140). The result Rs2 corresponds to the result of the XNOR operation.

As described above, in the arithmetic device according to the embodiment (for example, arithmetic devices 110 to 112, 120 to 122, 130 to 132, etc.), the controller 70 is configured to perform the first supply operation, the measurement operation, and the second supply operation. In the first supply operation, the controller 70 supplies the first current ic1 to the first conductive member 21 and supplies the second current ic2 to the second conductive member 22. In the measurement operation, the controller 70 measures the first electrical resistance after the supply of the first current ic1 and the second electrical resistance after the supply of the second current ic2. In the second supply operation, the controller 70 supplies the third current ic3 to the first conductive member 21 and supplies the fourth current ic4 to the second conductive member 22 after the measurement operation. The third current ic3 and the fourth current ic4 are determined according to the measurement result.

For example, the first current ic1 has the orientation I21 from the second portion 21*b* to the first portion 21*a*, and the second current ic2 has the orientation I45 from the fourth portion 22*d* to the fifth portion 22*e*. Alternatively, as will be described later, the first current ic1 may have the orientation I12 from the first portion 21*a* to the second portion 21*b*, and the second current ic2 may have the orientation I54 from the fifth portion 22*e* to the fourth portion 22*d*.

In one example (e.g., arithmetic device 110, etc.), as shown in FIG. 30A, the first current ic1 has the orientation I21 and the second current ic2 has the orientation I45. As shown in FIG. 30A, when the first electrical resistance is in the first low resistance state and the second electrical resistance is in the second low resistance state, the first input In1 is “0”. When the first electrical resistance is in the first high resistance state and the second electrical resistance is in the second high resistance state, the first input In1 is “1”. As shown in FIG. 30A, when the second input In2 is “0”, the potential V1 is the first potential E1 and the potential V2 is the fourth potential E4 in the first supply operation. When the second input In2 is “1”, the potential V1 is the second potential E2 and the potential V2 is the third potential E3 in the first supply operation. In the measurement operation, when the first potential difference Va is applied to the first magnetic layer 11 with reference to the second magnetic layer 12, a potential of a connection point CN (see FIG. 30D) of the second portion 21*b* and the fourth portion 22*d* is measured.

As shown in FIGS. 30B and 30C, in the measurement operation, when the potential at the connection point CN corresponds to substantially ½ of the first potential difference Va, the third current ic3 has the orientation I21 from second portion 21*b* to the first portion 21*a* and the fourth current ic4 has the orientation I54 from the fifth portion 22*e* to the fourth portion 22*d*. For example, in the second supply operation, the first magnetic layer 11 is at the second potential E2. For example, in the second supply operation, the second magnetic layer 12 is at the fourth potential E4.

As shown in FIGS. 30B and 30C, in the measurement operation, when the potential at the connection point CN is higher or lower than substantially ½ of the first potential difference Va, the third current ic3 has the orientation I12 from the first portion 21*a* to the second portion 21*b*. Also in this case, in the second supply operation, the first magnetic layer 11 is at the second potential E2, and the second magnetic layer 12 is at the fourth potential E4. In the second supply operation, when the first input In1 is “0” and the second input In2 is “1”, the same operation as the second supply operation when the first input In1 is “1” and the second input In2 is “0” may be performed.

In the following, some examples of the arithmetic device according to the embodiment will be described. In the following description, the same portions as the arithmetic device 110 will be omitted as appropriate.

FIGS. 31A to 31D are schematic views illustrating the operation of an arithmetic device according to the embodiment.

These figures illustrate the operation of an arithmetic device 110*a* according to the embodiment. These figures correspond to the configurations illustrated in FIGS. 30A to 30D.

Figures 31A, 31B, 31C, 31D:
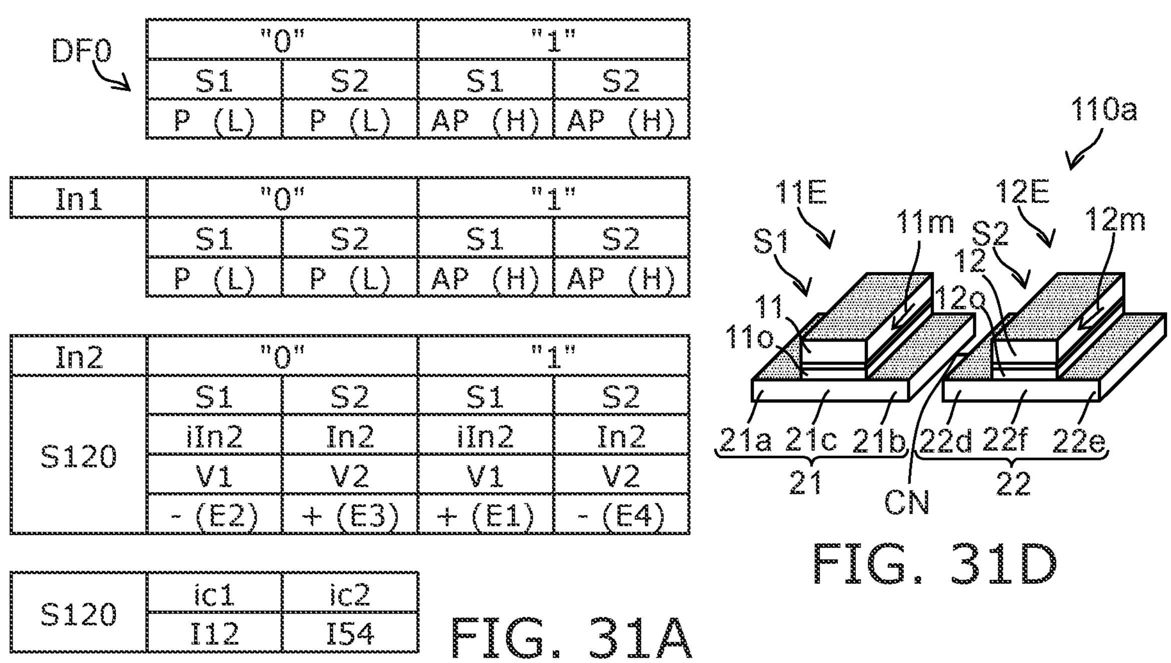
FIGS. 31A to 31D are schematic views illustrating the operation of an arithmetic device according to the embodiment.

As shown in FIG. 31A, in the arithmetic device 110*a*, in the first supply operation (step S120), the inverted iIn2 of the second input In2 is input to the first magnetic layer 11. The second input In2 is input to the second magnetic layer 12. In the first supply operation (step S120), when the second input In2 is “0”, the potential V1 is the second potential E2, and the potential V2 is the third potential E3. In the first supply operation (step S120), when the second input In2 is “1”, the potential V1 is the first potential E1 and the potential V2 is the fourth potential E4. The first current ic1 has the orientation I12 and the second current ic2 has the orientation I54.

As shown in FIGS. 31B and 31C, in the measurement operation (step S130), when the potential at the connection point CN corresponds to substantially ½ of the first potential difference Va, the third current ic3 has the orientation I21 and the fourth current ic4 has the orientation I54. In the measurement operation, when the potential at the connection point CN is higher or lower than substantially ½ of the first potential difference Va, the fourth current ic4 has the orientation I45. Also in such an arithmetic device 110*a*, the XNOR operation can be performed with a simple configuration.

FIGS. 32A to 32D are schematic views illustrating the operation of an arithmetic device according to the embodiment.

These figures illustrate the operation of an arithmetic device 114 according to the embodiment. These figures correspond to the configurations illustrated in FIGS. 30A to 30D.

Figures 32A, 32B, 32C, 32D:
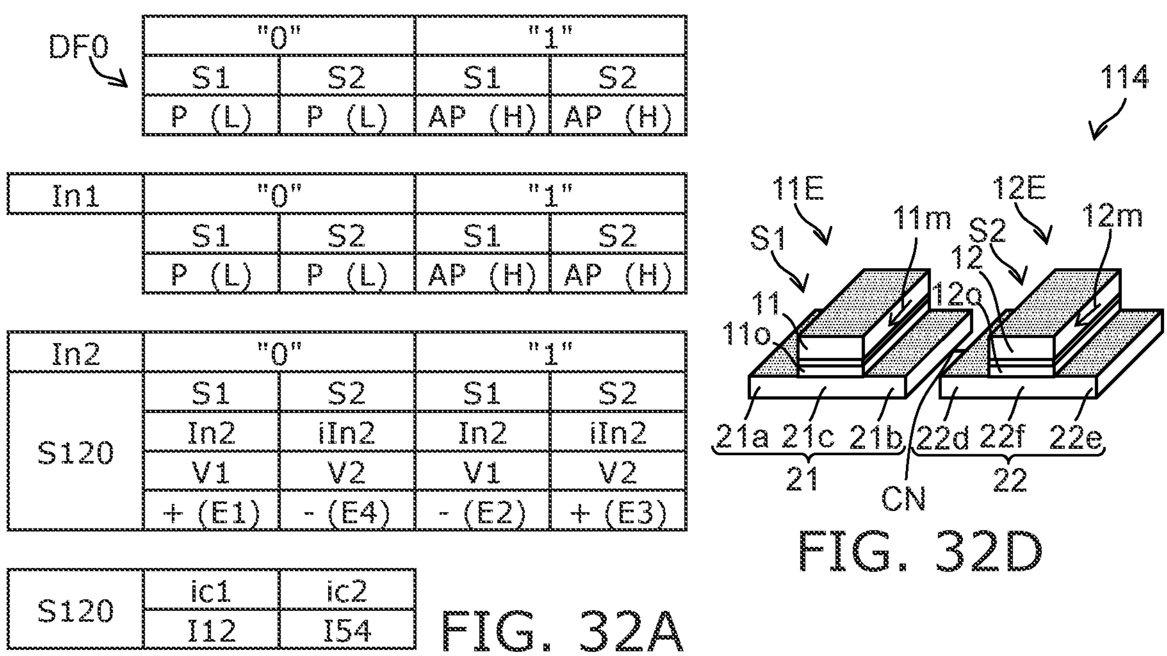
FIGS. 32A to 32D are schematic views illustrating the operation of an arithmetic device according to the embodiment.

As shown in FIG. 32A, in the arithmetic device 114, when the second input In2 is "0" in the first supply operation (step S120), the potential V1 is the first potential E1 and the potential V2 is the fourth potential E4. When the second input In2 is "1" in the first supply operation (step S120), the potential V1 is the second potential E2, and the potential V2 is the third potential E3. The first current ic1 has the orientation I12 and the second current ic2 has the orientation I54.

As shown in FIGS. 32B and 32C, in the measurement operation (step S130), when the potential at the connection point CN corresponds to substantially ½ of the first potential difference Va, the third current ic3 has the orientation I12 and the fourth current ic4 has the orientation I45. In the measurement operation, when the potential at the connection point CN is higher or lower than substantially ½ of the first potential difference Va, the third current ic3 has the orientation I21. Also in such an arithmetic device 114, the XNOR operation can be performed with a simple configuration.

FIGS. 33A to 33D are schematic views illustrating the operation of an arithmetic device according to the embodiment.

These figures illustrate the operation of an arithmetic device 114*a* according to the embodiment. These figures correspond to the configurations illustrated in FIGS. 30*a* to 30D.

Figures 33A, 33B, 33C, 33D:
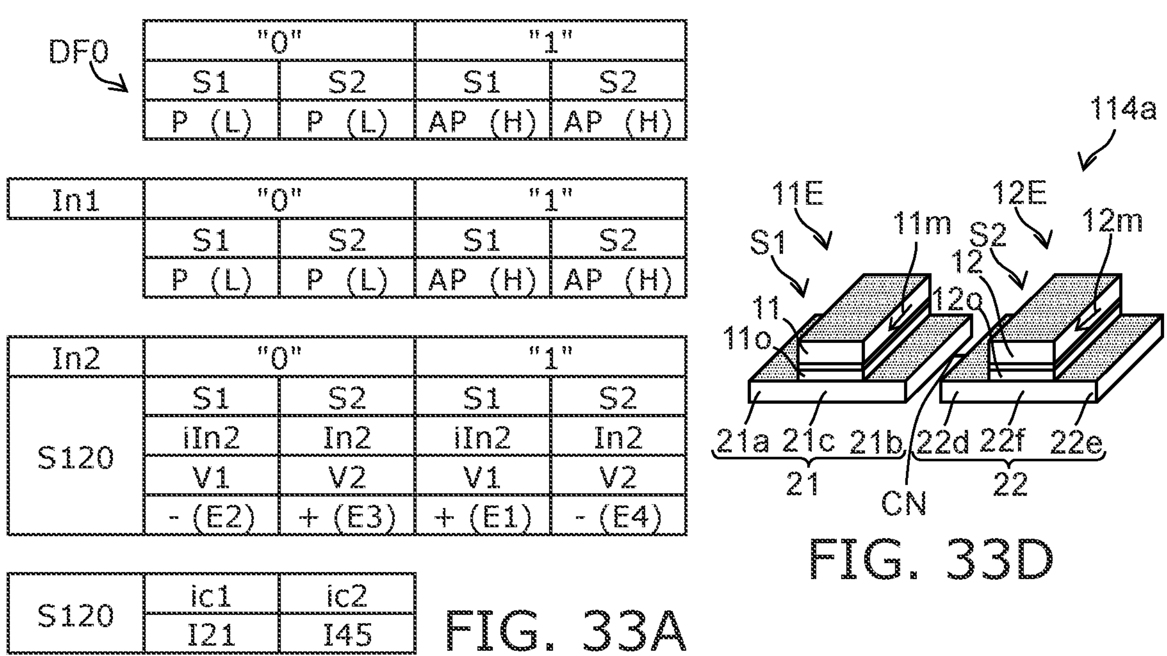
FIGS. 33A to 33D are schematic views illustrating the operation of an arithmetic device according to the embodiment.

As shown in FIG. 33A, in the arithmetic device 114*a*, in the first supply operation (step S120), when the second input In2 is "0", the potential V1 is the second potential E2 and the potential V2 is the third potential E3. In the first supply operation (step S120), when the second input In2 is "1", the potential V1 is the first potential E1 and the potential V2 is the fourth potential E4. The first current ic1 has the orientation I21 and the second current ic2 has the orientation I45.

As shown in FIGS. 33B and 33C, in the measurement operation (step S130), when the potential at the connection point CN corresponds to substantially ½ of the first potential difference Va, the third current ic3 has the orientation I12 and the fourth current ic4 has the orientation I45. In the measurement operation, when the potential at the connection point CN is higher or lower than substantially ½ of the first potential difference Va, the fourth current ic4 has the orientation I54. Also in such an arithmetic device 114*a*, the XNOR operation can be performed with a simple configuration.

FIGS. 34A to 34D are schematic views illustrating the operation of an arithmetic device according to the embodiment.

These figures illustrate the operation of an arithmetic device 115 according to the embodiment. These figures correspond to the configurations illustrated in FIGS. 30A to 30D.

As shown in FIG. 34A, in the definition DF0 in the operation, the state in which the first electrical resistance of the first stacked body S1 is in the first high resistance state (H and AP), and the second electrical resistance of the second stacked body S2 in the second high resistance state (H and AP), corresponds to "0". The state in which the first electrical resistance is in the first low resistance state (L and P) lower than the first high resistance state, and the second electrical resistance is in the second low resistance state (L and P) lower than the second high resistance state, corresponds to "1".

As shown in FIG. 34A, the first input In1 is "0" in the (AP, AP) state. In the (P, P) state, the first input In1 is "1".

As shown in FIG. 34A, in the arithmetic device 115, in the first supply operation (step S120), when the second input In2 is "0", the potential V1 is the second potential E2 and the potential V2 is the third potential E3. In the first supply operation (step S120), when the second input In2 is "1", the potential V1 is the first potential E1 and the potential V2 is the fourth potential E4. The first current ic1 has the orientation I12 and the second current ic2 has the orientation I54.

As shown in FIGS. 34B and 34C, in the measurement operation (step S130), when the potential at the connection point CN corresponds to substantially ½ of the first potential difference Va, the third current ic3 has the orientation I21 and the fourth current ic4 has the orientation I54. In the measurement operation, when the potential at the connection point CN is higher or lower than substantially ½ of the first potential difference Va, the fourth current ic4 has the orientation I45. Also in such an arithmetic device 115, the XNOR operation can be performed with a simple configuration.

FIGS. 35A to 35D are schematic views illustrating the operation of an arithmetic device according to the embodiment.

These figures illustrate the operation of an arithmetic device 115*a* according to the embodiment. These figures correspond to the configurations illustrated in FIGS. 30A to 30D.

Figures 35A, 35B, 35C, 35D:
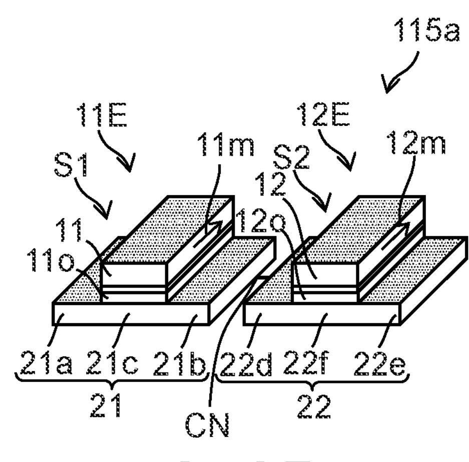
FIGS. 35A to 35D are schematic views illustrating the operation of an arithmetic device according to the embodiment.

As shown in FIG. 35A, in the arithmetic device 115*a*, in the first supply operation (step S120), when the second input In2 is "0", the potential V1 is the first potential E1 and the potential V2 is the fourth potential E4. In the first supply operation (step S120), when the second input In2 is "1", the potential V1 is the second potential E2, and the potential V2 is the third potential E3. The first current ic1 has the orientation I21 and the second current ic2 has the orientation I45.

As shown in FIGS. 35B and 35C, in the measurement operation (step S130), when the potential at the connection point CN corresponds to substantially ½ of the first potential difference Va, the third current ic3 has the orientation I21 and the fourth current ic4 has the orientation I54. In the measurement operation, when the potential at the connection point CN is higher or lower than substantially ½ of the first potential difference Va, the third current ic3 has the orientation I12. Also in such an arithmetic device 115*a*, the XNOR operation can be performed with a simple configuration.

FIGS. 36A to 36D are schematic views illustrating the operation of an arithmetic device according to the embodiment.

These figures illustrate the operation of an arithmetic device 116 according to the embodiment. These figures correspond to the configurations illustrated in FIGS. 30A to 30D.

As shown in FIG. 36A, in the arithmetic device 116, in the first supply operation (step S120), when the second input In2 is "0", the potential V1 is the first potential E1 and the potential V2 is the fourth potential E4. In the first supply operation (step S120), when the second input In2 is "1", the potential V1 is the second potential E2, and the potential V2 is the third potential E3. The first current ic1 has the orientation I12 and the second current ic2 has the orientation I54.

As shown in FIGS. 36B and 36C, in the measurement operation (step S130), when the potential at the connection point CN corresponds to substantially ½ of the first potential difference Va, the third current ic3 has the orientation I12 and the fourth current ic4 has the orientation I45. In the measurement operation, when the potential at the connection point CN is higher or lower than substantially ½ of the first potential difference Va, the third current ic3 has the orientation I21. Also in such an arithmetic device 116, the XNOR operation can be performed with a simple configuration.

FIGS. 37A to 37D are schematic views illustrating the operation of an arithmetic device according to the embodiment.

These figures illustrate the operation of an arithmetic device 116*a* according to the embodiment. These figures correspond to the configurations illustrated in FIGS. 30A to 30D.

As shown in FIG. 37A, in the arithmetic device 116*a*, in the first supply operation (step S120), when the second input In2 is "0", the potential V1 is the second potential E2 and the potential V2 is the third potential E3. In the first supply operation (step S120), when the second input In2 is "1", the potential V1 is the first potential E1 and the potential V2 is the fourth potential E4. The first current ic1 has the orientation I21 and the second current ic2 has the orientation I45.

As shown in FIGS. 37B and 37C, in the measurement operation (step S130), when the potential at the connection point CN corresponds to substantially ½ of the first potential difference Va, the third current ic3 has the orientation I12 and the fourth current ic4 has the orientation I45. In the measurement operation, when the potential at the connection point CN is higher or lower than substantially ½ of the first potential difference Va, the fourth current ic4 has the orientation I54. Also in such an arithmetic device 116*a*, the XNOR operation can be performed with a simple configuration.

FIGS. 38A to 38D are schematic views illustrating the operation of an arithmetic device according to the embodiment.

These figures illustrate the operation of an arithmetic device 120 according to the embodiment already described. These figures correspond to the configurations illustrated in FIGS. 30A to 30D.

Figures 38A, 38B, 38C, 38D:
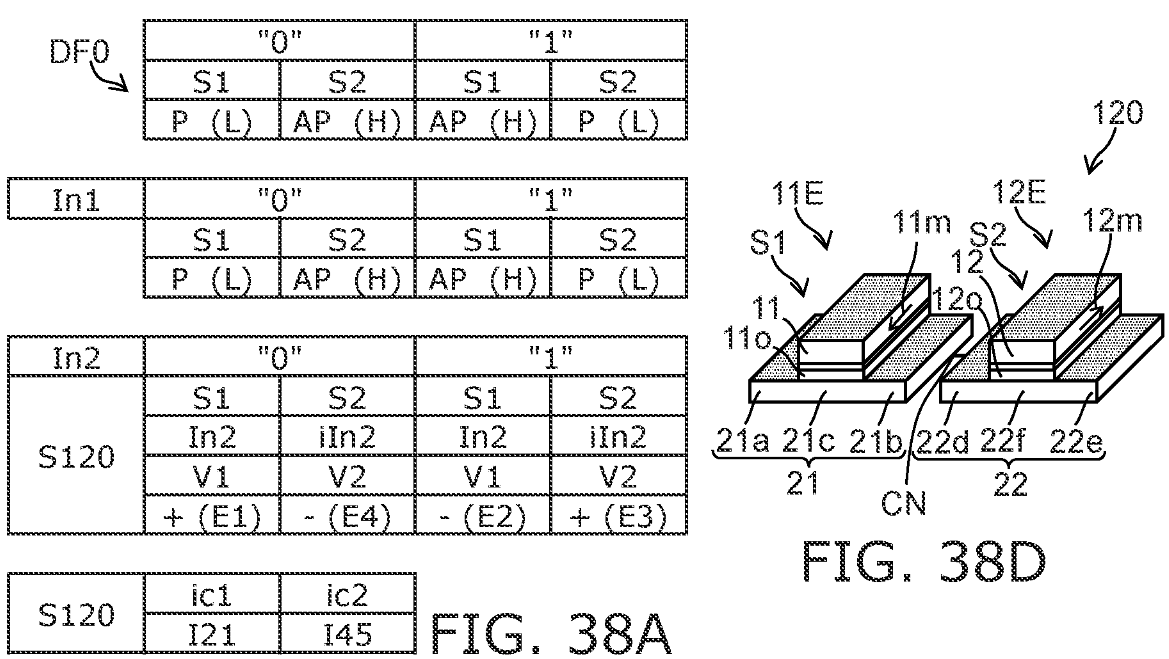
FIGS. 38A to 38D are schematic views illustrating the operation of the arithmetic device according to the embodiment.

As shown in FIG. 38A, when the first electrical resistance of the first stacked body S1 is in the first low resistance state (L and P), and the second electrical resistance of the second stacked body S2 is in the first high and low resistance state (H and AP), the first input In1 is "0". The first electrical resistance is in the first high resistance state (H and AP) higher than the first low resistance state, and the second electrical resistance is in the second low resistance state (L and P) lower than the second high resistance state, the first input In1 is "1".

As shown in FIG. 38A, the first current ic1 has the orientation I21 from the second portion 21*b* to the first portion 21*a*. The second current ic2 has the orientation I45 from the fourth portion 22*d* to the fifth portion 22*e*. When the second input In2 is "0", the potential V1 of the first magnetic layer 11 is the first potential E1 and the potential V2 of the second magnetic layer 12 is the fourth potential E4 in the first supply operation. When the second input In2 is "1", in the first supply operation, the potential V1 of the first magnetic layer 11 is the second potential E2, and the potential V2 of the second magnetic layer 12 is the third potential E3. As described above, the polarity of the second potential E2 is opposite to the polarity of the first potential E1. The polarity of the fourth potential E4 is opposite to the polarity of the third potential E3. The polarity of the fourth potential E4 is opposite to the polarity of the first potential E1.

As shown in FIGS. 38B and 38C, in the measurement operation, the potential at the connection point CN of the second portion 21*b* and the fourth portion 22*d* when the first potential difference Va is applied to the first magnetic layer 11 with reference to the second magnetic layer 12, is measured. When the potential at the connection point CN is higher or lower than substantially ½ of the first potential difference Va, the third current ic3 has the orientation I21 from the second portion 21*b* to the first portion 21*a* and the fourth current ic4 has the orientation I54 from the fifth portion 22*e* to the fourth portion 22*d*. In the measurement operation, when the potential at the connection point CN corresponds to substantially ½ of the first potential difference Va, the third current ic3 has the orientation I12 from the first portion 21*a* to the second portion 21*b*. In such an arithmetic device 120, the XNOR operation can be performed with a simple configuration.

FIGS. 39A to 39D are schematic views illustrating the operation of an arithmetic device according to the embodiment.

These figures illustrate the operation of an arithmetic device 120*a* according to the embodiment. These figures correspond to the configurations illustrated in FIGS. 30A to 30D.

As shown in FIG. 39A, the first electrical resistance of the first stacked body S1 is in the first high resistance state (H and AP), and the second electrical resistance of the second stacked body S2 is in the second low resistance state (L and P), the first input In1 is "0". The first electrical resistance is in the first low resistance state (L and P) lower than the first high resistance state, and in the second high resistance state (H and AP) higher than the second low resistance state, the first input In1 is "1".

As shown in FIG. 39A, the first current ic1 has the orientation I12 from the first portion 21*a* to the second portion 21*b*, and the second current ic2 has the orientation I54 from the fifth portion 22*e* to the fourth portion 22*d*. When the second input In2 is "0", in the first supply operation, the potential V1 is the second potential E2 and the potential V2 is the third potential E3. When the second input In2 is "1", in the first supply operation, the potential V1 is the first potential E1 and the potential V2 is the fourth potential E4.

As shown in FIGS. 39B and 39C, in the measurement operation, when the potential at the connection point CN is higher or lower than substantially ½ of the first potential difference Va, the third current ic3 has the orientation I12 and the fourth current ic4 has the orientation I45. In the measurement operation, when the potential at the connection point CN corresponds to substantially ½ of the first potential difference Va, the third current ic3 has the orientation I21. In such an arithmetic device 120*a*, the XNOR operation can be performed with a simple configuration.

FIGS. 40A to 40D are schematic views illustrating the operation of an arithmetic device according to the embodiment.

These figures illustrate the operation of an arithmetic device 124 according to the embodiment. These figures correspond to the configurations illustrated in FIGS. 30A to 30D.

As shown in FIG. 40A, the first current ic1 has the orientation I12 and the second current ic2 has the orientation I54. When the second input In2 is "0", in the first supply operation, the potential V1 is the second potential E2 and the potential V2 is the third potential E3. When the second input In2 is "1", in the first supply operation, the potential V1 is the first potential E1 and the potential V2 is the fourth potential E4.

As shown in FIGS. 40B and 40C, in the measurement operation, when the potential at the connection point CN is higher or lower than substantially ½ of the first potential difference Va, the third current ic3 has the orientation I21 and the fourth current ic4 has the orientation I54. In the measurement operation, when the potential at the connection point CN corresponds to substantially ½ of the first potential difference Va, the fourth current ic4 has the orientation I45. In such an arithmetic device 124, the XNOR operation can be performed with a simple configuration.

FIGS. 41A to 41D are schematic views illustrating the operation of an arithmetic device according to the embodiment.

These figures illustrate the operation of an arithmetic device 124*a* according to the embodiment. These figures correspond to the configurations illustrated in FIGS. 30A to 30D.

As shown in FIG. 41A, the first current ic1 has the orientation I21 and the second current ic2 has the orientation I45. When the second input In2 is "0", in the first supply operation, the potential V1 is the first potential E1 and the potential V2 is the fourth potential E4. When the second input In2 is "1", in the first supply operation, the potential V1 is the second potential E2 and the potential V2 is the third potential E3.

As shown in FIGS. 41B and 41C, in the measurement operation, when the potential at the connection point CN is higher or lower than substantially ½ of the first potential difference Va, the third current ic3 has the orientation I21 and the fourth current ic4 has the orientation I54. In the measurement operation, when the potential at the connection point CN corresponds to substantially ½ of the first potential difference Va, the third current ic3 has the orientation I12. In such an arithmetic device 124*a*, the XNOR operation can be performed with a simple configuration.

FIGS. 42A to 42D are schematic views illustrating the operation of an arithmetic device according to the embodiment.

These figures illustrate the operation of an arithmetic device 125 according to the embodiment. These figures correspond to the configurations illustrated in FIGS. 30A to 30D.

As shown in FIG. 42A, the first current ic1 has the orientation I21 and the second current ic2 has the orientation I45. When the second input In2 is "0", in the first supply operation, the potential V1 is the first potential E1 and the potential V2 is the fourth potential E4. When the second input In2 is "1", in the first supply operation, the potential V1 is the second potential E2 and the potential V2 is the third potential E3.

As shown in FIGS. 42B and 42C, in the measurement operation, when the potential at the connection point CN is higher or lower than substantially ½ of the first potential difference Va, the third current ic3 has the orientation I12 and the fourth current ic4 has the orientation I45. In the measurement operation, when the potential at the connection point CN corresponds to substantially ½ of the first potential difference Va, the third current ic3 has the orientation I21. In such an arithmetic device 125, the XNOR operation can be performed with a simple configuration.

FIGS. 43A to 43D are schematic views illustrating the operation of an arithmetic device according to the embodiment.

These figures illustrate the operation of an arithmetic device 125*a* according to the embodiment. These figures correspond to the configurations illustrated in FIGS. 30A to 30D.

Figures 43A, 43B, 43C, 43D:
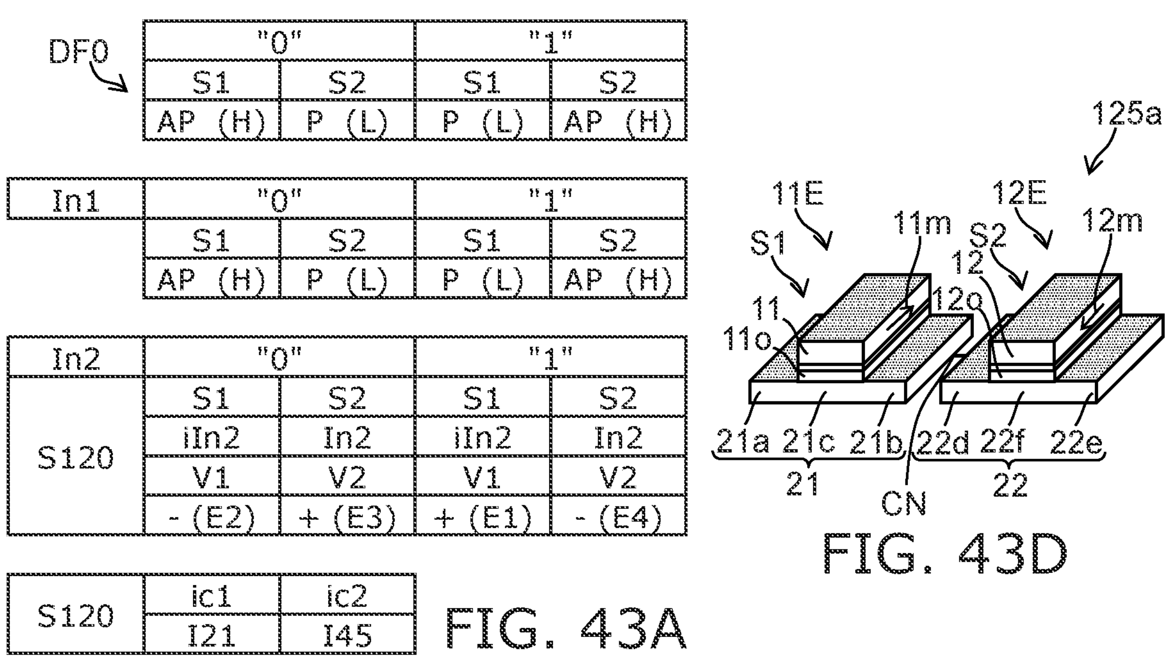
FIGS. 43A to 43D are schematic views illustrating the operation of an arithmetic device according to the embodiment.

As shown in FIG. 43A, the first current ic1 has the orientation I21 and the second current ic2 has the orientation I45. When the second input In2 is "0", in the first supply operation, the potential V1 is the second potential E2 and the potential V2 is the third potential E3. When the second input In2 is "1", in the first supply operation, the potential V1 is the first potential E1 and the potential V2 is the fourth potential E4.

As shown in FIGS. 43B and 43C, in the measurement operation, when the potential at the connection point CN is higher or lower than substantially ½ of the first potential difference Va, the third current ic3 has the orientation I12 and the fourth current ic4 has the orientation I45. In the measurement operation, when the potential at the connection point CN corresponds to substantially ½ of the first potential difference Va, the fourth current ic4 has the orientation I45. In such an arithmetic device 125*a*, the XNOR operation can be performed with a simple configuration.

FIGS. 44A to 44D are schematic views illustrating the operation of an arithmetic device according to the embodiment.

These figures illustrate the operation of an arithmetic device 126 according to the embodiment. These figures correspond to the configurations illustrated in FIGS. 30A to 30D.

As shown in FIG. 44A, the first current ic1 has the orientation I12 and the second current ic2 has the orientation I54. When the second input In2 is "0", in the first supply operation, the potential V1 is the first potential E1 and the potential V2 is the fourth potential E4. When the second input In2 is "1", in the first supply operation, the potential V1 is the second potential E2 and the potential V2 is the third potential E3.

As shown in FIGS. 44B and 44C, in the measurement operation, when the potential at the connection point CN is higher or lower than substantially ½ of the first potential difference Va, the third current ic3 has the orientation I12 and the fourth current ic4 has the orientation I45. In the measurement operation, when the potential at the connection point CN corresponds to substantially ½ of the first potential difference Va, the third current ic3 has the orientation I21. In such an arithmetic device 126, the XNOR operation can be performed with a simple configuration.

FIGS. 45A to 45D are schematic views illustrating the operation of an arithmetic device according to the embodiment.

These figures illustrate the operation of an arithmetic device 126*a* according to the embodiment. These figures correspond to the configurations illustrated in FIGS. 30A to 30D.

Figures 45A, 45B, 45C, 45D:
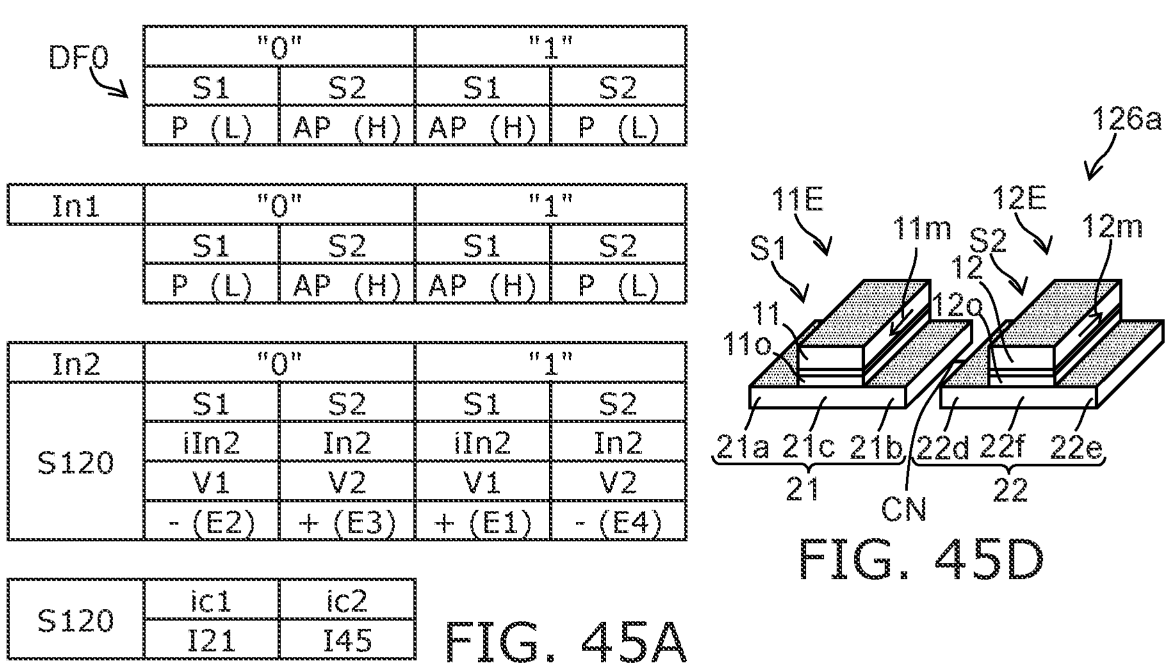
FIGS. 45A to 45D are schematic views illustrating the operation of an arithmetic device according to the embodiment.

As shown in FIG. 45A, the first current ic1 has the orientation I21 and the second current ic2 has the orientation I45. When the second input In2 is "0", in the first supply operation, the potential V1 is the second potential E2 and the potential V2 is the third potential E3. When the second input In2 is "1", in the first supply operation, the potential V1 is the first potential E1 and the potential V2 is the fourth potential E4.

As shown in FIGS. 45B and 45C, in the measurement operation, when the potential at the connection point CN is higher or lower than substantially ½ of the first potential difference Va, the third current ic3 has the orientation I12 and the fourth current ic4 has the orientation I45. In the measurement operation, when the potential at the connection point CN corresponds to substantially ½ of the first potential difference Va, the fourth current ic4 has the orientation I54. In such an arithmetic device 126*a*, the XNOR operation can be performed with a simple configuration.

In the above arithmetic device according to the embodiment, in the second supply operation, the potential V1 of the first magnetic layer 11 and the potential V2 of the second magnetic layer 12 correspond to, for example, the potential of "Active".

In the arithmetic device, the multiple arithmetic element parts 50 may be provided. At least one of the multiple arithmetic element parts 50 may have any of the above configurations. The controller 70 may include the selector SEL1 (see FIG. 27). The selector SEL1 may select at least one of the multiple arithmetic element parts 50 to perform the XNOR operation.

According to the embodiment, an arithmetic device having a simple configuration can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in arithmetic devices such as conductive members, elements, stacked bodies, magnetic layers, non-magnetic layers, conductive parts, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all arithmetic devices practicable by an appropriate design modification by one skilled in the art based on the arithmetic devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An arithmetic device, comprising:

an arithmetic element part; and a controller, the arithmetic element part including a first element including a first conductive member and a first stacked body, the first conductive member including a first portion, a second portion, and a third portion between the first portion and the second portion, the first stacked body including a first magnetic layer, and a first counter magnetic layer provided between the third portion and the first magnetic layer, and a second element including a second conductive member and a second stacked body, the second conductive member including a fourth portion, a fifth portion, and a sixth portion between the fourth portion and the fifth portion, the second stacked body including a second magnetic layer, and a second counter magnetic layer provided between the sixth portion and the second magnetic layer, the second portion and the fourth portion being electrically connected, the controller being configured to perform an XNOR operation of a first input and a second input, the first input corresponding to a first electrical resistance of the first stacked body and a second electrical resistance of the second stacked body, the second input corresponding to a potential of the first magnetic layer and a potential of the second magnetic layer, wherein the controller is configured to perform a first supply operation, a measurement operation, and a second supply operation, in the first supply operation, the controller supplies a first current to the first conductive member, and supplies a second current to the second conductive member, in the measurement operation, the controller measures the first electrical resistance after the supply of the first current and the second electrical resistance after the supply of the second current, and in the second supply operation, the controller supplies a third current to the first conductive member and supplies a fourth current to the second conductive member after the measurement operation.

2. The arithmetic device according to claim 1, wherein the first current has an orientation from the second portion to the first portion, and the second current has an orientation from the fourth portion to the fifth portion, alternatively the first current has an orientation from the first portion to the second portion, and the second current has an orientation from the fifth portion to the fourth portion.

3. The arithmetic device according to claim 2, wherein the first current has the orientation from the second portion to the first portion, and the second current has the orientation from the fourth portion to the fifth portion, when the first electrical resistance is in a first low resistance state, and the second electrical resistance is in a second low resistance state, the first input is "0", when the first electrical resistance is in a first high resistance state higher than the first low resistance state, and the second electrical resistance is in a second high resistance state higher than the second low resistance state, the first input is "1", when the second input is "0", in the first supply operation, the potential of the first magnetic layer is a first potential, and the potential of the second magnetic layer is a fourth potential, when the second input is "1", in the first supply operation, the potential of the first magnetic layer is a second potential, and the potential of the second magnetic layer is a third potential, polarity of the second potential is opposite to polarity of the first potential, polarity of the fourth potential is opposite to polarity of the third potential, and the polarity of the fourth potential is opposite to the polarity of the first potential.

4. The arithmetic device according to claim 3, wherein in the measurement operation, when a first potential difference is applied to the first magnetic layer with reference to the second magnetic layer, and a potential at a connection point of the second portion and the fourth portion corresponds to substantially 1/2 of the first potential difference, the third current has the orientation from the second portion to the first portion, and the fourth current has the orientation from the fifth portion to the fourth portion, and in the measurement operation, when the first potential difference is applied to the first magnetic layer with reference to the second magnetic layer, and the potential at the connection point is higher or lower than substantially 1/2 of the first potential difference, the fourth current has the orientation from the fourth portion to the fifth portion.

5. The arithmetic device according to claim 2, wherein the first current has the orientation from the first portion to the second portion, and the second current has the orientation from the fifth portion to the fourth portion, when the first electrical resistance is in a first low resistance state, and the second electrical resistance is in a second low resistance state, the first input is "0", when the first electrical resistance is in a first high resistance state higher than the first low resistance state, and the second electrical resistance is in a second high resistance state higher than the second low resistance state, the first input is "1", when the second input is "0", in the first supply operation, the potential of the first magnetic layer is a second potential, and the potential of the second magnetic layer is a third potential, when the second input is "1", in the first supply operation, the potential of the first magnetic layer is a first potential, and the potential of the second magnetic layer is a fourth potential, polarity of the second potential is opposite to polarity of the first potential, polarity of the fourth potential is opposite to polarity of the third potential, and the polarity of the fourth potential is opposite to the polarity of the first potential.

6. The arithmetic device according to claim 5, wherein in the measurement operation, when a first potential difference is applied to the first magnetic layer with reference to the second magnetic layer, and a potential at a connection point of the second portion and the fourth portion corresponds to substantially 1/2 of the first potential difference, the third current has the orientation from the second portion to the first portion, and the fourth current has the orientation from the fifth portion to the fourth portion, and in the second supply operation, the first magnetic layer is at the second potential, and the second magnetic layer is at the fourth potential, and in the measurement operation, when the first potential difference is applied to the first magnetic layer with reference to the second magnetic layer, and the potential at the connection point is higher or lower than substantially 1/2 of the first potential difference, the fourth current has the orientation from the fourth portion to the fifth portion.

7. The arithmetic device according to claim 2, wherein the first current has the orientation from the second portion to the first portion, and the second current has the orientation from the fourth portion to the fifth portion, when the first electrical resistance is in a first high resistance state, and the second electrical resistance is in a second high resistance state, the first input is "0", when the first electrical resistance is in a first low resistance state lower than the first high resistance state, and the second electrical resistance is in a second low resistance state lower than the second high resistance state, the first input is "1", when the second input is "0", in the first supply operation, the potential of the first magnetic layer is a first potential, and the potential of the second magnetic layer is a fourth potential, when the second input is "1", in the first supply operation, the potential of the first magnetic layer is a second potential, and the potential of the second magnetic layer is a third potential, polarity of the second potential is opposite to polarity of the first potential, polarity of the fourth potential is opposite to polarity of the third potential, and the polarity of the fourth potential is opposite to the polarity of the first potential.

8. The arithmetic device according to claim 7, wherein in the measurement operation, when a first potential difference is applied to the first magnetic layer with reference to the second magnetic layer, and a potential at a connection point of the second portion and the fourth portion corresponds to substantially 1/2 of the first potential difference, the third current has the orientation from the second portion to the first portion, and the fourth current has the orientation from the fifth portion to the fourth portion, and in the second supply operation, the first magnetic layer is at the second potential, and the second magnetic layer is at the fourth potential, and in the measurement operation, when the first potential difference is applied to the first magnetic layer with reference to the second magnetic layer, and the potential at the connection point is higher or lower than substantially 1/2 of the first potential difference, the third current has the orientation from the first portion to the second portion.

9. The arithmetic device according to claim 2, wherein the first current has the orientation from the first portion to the second portion, and the second current has the orientation from the fifth portion to the fourth portion, when the first electrical resistance is in a first high resistance state, and the second electrical resistance is in a second high resistance state, the first input is "0", when the first electrical resistance is in a first low resistance state lower than the first high resistance state, and the second electrical resistance is in a second low resistance state lower than the second high resistance state, the first input is "1", when the second input is "0", in the first supply operation, the potential of the first magnetic layer is a second potential, and the potential of the second magnetic layer is a third potential, when the second input is "1", in the first supply operation, the potential of the first magnetic layer is a first potential, and the potential of the second magnetic layer is a fourth potential, polarity of the second potential is opposite to polarity of the first potential, polarity of the fourth potential is opposite to polarity of the third potential, and the polarity of the fourth potential is opposite to the polarity of the first potential.

10. The arithmetic device according to claim 9, wherein in the measurement operation, when a first potential difference is applied to the first magnetic layer with reference to the second magnetic layer, and a potential at a connection point of the second portion and the fourth portion corresponds to substantially 1/2 of the first potential difference, the third current has the orientation from the second portion to the first portion, and the fourth current has the orientation from the fifth portion to the fourth portion, and in the second supply operation, the first magnetic layer is at the second potential, and the second magnetic layer is at the fourth potential, and in the measurement operation, when the first potential difference is applied to the first magnetic layer with reference to the second magnetic layer, and the potential at the connection point is higher or lower than substantially 1/2 of the first potential difference, the fourth current has the orientation from the fourth portion to the fifth portion.

11. The arithmetic device according to claim 2, wherein the first current has the orientation from the second portion to the first portion, and the second current has the orientation from the fourth portion to the fifth portion, when the first electrical resistance is in a first low resistance state, and the second electrical resistance is in a first high low resistance state, the first input is "0", when the first electrical resistance is in a first high resistance state higher than the first low resistance state, and the second electrical resistance is in a second low resistance state lower than the second high resistance state, the first input is "1", when the second input is "0", in the first supply operation, the potential of the first magnetic layer is a first potential, and the potential of the second magnetic layer is a fourth potential, when the second input is "1", in the first supply operation, the potential of the first magnetic layer is a second potential, and the potential of the second magnetic layer is a third potential, polarity of the second potential is opposite to polarity of the first potential, polarity of the fourth potential is opposite to polarity of the third potential, and the polarity of the fourth potential is opposite to the polarity of the first potential.

12. The arithmetic device according to claim 9, wherein in the measurement operation, when a first potential difference is applied to the first magnetic layer with reference to the second magnetic layer, and a potential at a connection point of the second portion and the fourth portion is higher or lower than substantially 1/2 of the first potential difference, the third current has the orientation from the second portion to the first portion, and the fourth current has the orientation from the fifth portion to the fourth portion, and in the measurement operation, when the first potential difference is applied to the first magnetic layer with reference to the second magnetic layer, and the potential at the connection point corresponds to the substantially 1/2 of the first potential difference, the third current has the orientation from the first portion to the second portion.

13. The arithmetic device according to claim 2, wherein the first current has the orientation from the first portion to the second portion, and the second current has the orientation from the fifth portion to the fourth portion, when the first electrical resistance is in a first high resistance state, and the second electrical resistance is in a second low resistance state, the first input is "0", when the first electrical resistance is in a first low resistance state lower than the first high resistance state, and the second electrical resistance is in a second high resistance state higher than the second low resistance state, the first input is "1", when the second input is "0", in the first supply operation, the potential of the first magnetic layer is a second potential, and the potential of the second magnetic layer is a third potential, when the second input is "1", in the first supply operation, the potential of the first magnetic layer is a first potential, and the potential of the second magnetic layer is a fourth potential, polarity of the second potential is opposite to polarity of the first potential, polarity of the fourth potential is opposite to polarity of the third potential, and the polarity of the fourth potential is opposite to the polarity of the first potential.

14. The arithmetic device according to claim 13, wherein in the measurement operation, when a first potential difference is applied to the first magnetic layer with reference to the second magnetic layer, and a potential at a connection point of the second portion and the fourth portion is higher or lower than substantially 1/2 of the first potential difference, the third current has the orientation from the first portion to the second portion, and the fourth current has the orientation from the fourth portion to the fifth portion, and in the measurement operation, when the first potential difference is applied to the first magnetic layer with reference to the second magnetic layer, and the potential at the connection point corresponds to the substantially 1/2 of the first potential difference, the third current has the orientation from the second portion to the first portion.

15. The arithmetic device according to claim 2, wherein the first current has the orientation from the first portion to the second portion, and the second current has the orientation from the fifth portion to the fourth portion, when the first electrical resistance is in a first low resistance state, and the second electrical resistance is in a first high resistance state, the first input is "0", when the first electrical resistance is in the first high resistance state higher than the first low resistance state, and the second electrical resistance is in a second low resistance state lower than the second high resistance state, the first input is "1", when the second input is "0", in the first supply operation, the potential of the first magnetic layer is a second potential, and the potential of the second magnetic layer is a third potential, when the second input is "1", in the first supply operation, the potential of the first magnetic layer is a first potential, and the potential of the second magnetic layer is a fourth potential, polarity of the second potential is opposite to polarity of the first potential, polarity of the fourth potential is opposite to polarity of the third potential, and the polarity of the fourth potential is opposite to the polarity of the first potential.

16. The arithmetic device according to claim 15, wherein in the measurement operation, when a first potential difference is applied to the first magnetic layer with reference to the second magnetic layer, and a potential at a connection point of the second portion and the fourth portion is higher or lower than substantially 1/2 of the first potential difference, the third current has the orientation from the second portion to the first portion, and the fourth current has the orientation from the fifth portion to the fourth portion, and in the measurement operation, when the first potential difference is applied to the first magnetic layer with reference to the second magnetic layer, and the potential at the connection point corresponds to the substantially 1/2 of the first potential difference, the fourth current has the orientation from the fourth portion to the fifth portion.

17. The arithmetic device according to claim 2, wherein the first current has the orientation from the second portion to the first portion, and the second current has the orientation from the fourth portion to the fifth portion, when the first electrical resistance is in a first high resistance state, and the second electrical resistance is in a second low resistance state, the first input is "0", when the first electrical resistance is in a first low resistance state lower than the first high resistance state, and the second electrical resistance is in a second high resistance state lower than the second low resistance state, the first input is "1", when the second input is "0", in the first supply operation, the potential of the first magnetic layer is a first potential, and the potential of the second magnetic layer is a fourth potential, when the second input is "1", in the first supply operation, the potential of the first magnetic layer is a second potential, and the potential of the second magnetic layer is a third potential, polarity of the second potential is opposite to polarity of the first potential, polarity of the fourth potential is opposite to polarity of the third potential, and the polarity of the fourth potential is opposite to the polarity of the first potential.

18. The arithmetic device according to claim 17, wherein in the measurement operation, when a first potential difference is applied to the first magnetic layer with reference to the second magnetic layer, and a potential at a connection point of the second portion and the fourth portion is higher or lower than substantially 1/2 of the first potential difference, the third current has the orientation from the second portion to the first portion, and the fourth current has the orientation from the fifth portion to the fourth portion, and in the measurement operation, when the first potential difference is applied to the first magnetic layer with reference to the second magnetic layer, and the potential at the connection point corresponds to the substantially 1/2 of the first potential difference, the third current has the orientation from the first portion to the second portion.

19. The arithmetic device according to claim 1, comprising:

a plurality of the arithmetic element parts, the controller including a selector, and the selector selecting at least one of the plurality of arithmetic element parts, and being configured to perform the XNOR operation.

* * * * *